US012733535B2

(12) United States Patent
Park et al.

(10) Patent No.: US 12,733,535 B2
(45) Date of Patent: Sep. 8, 2026

(54) ELECTRONIC DEVICES HAVING EMBEDDED MODULE AND METHODS OF MANUFACTURING ELECTRONIC DEVICES HAVING THE SAME

(71) Applicant: Amkor Technology Singapore Holding Pte. Ltd., Valley Point (SG)

(72) Inventors: Dae Young Park, Jeollanam-do (KR); Byong Jin Kim, Seoul (KR); Gi Jeong Kim, Gyeonggi-do (KR); Hyeong Il Jeon, Gyeonggi-do (KR); Kwang Soo Sang, Incheon (KR); Jin Young Khim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 460 days.

(21) Appl. No.: 18/235,731

(22) Filed: Aug. 18, 2023

(65) Prior Publication Data

US 2024/0096725 A1 Mar. 21, 2024

Related U.S. Application Data

(60) Provisional application No. 63/444,024, filed on Feb. 8, 2023, provisional application No. 63/407,650, filed on Sep. 17, 2022.

(51) Int. Cl.

| | |
|---|---|
| ***H10W 74/10*** | (2026.01) |
| ***H10W 70/65*** | (2026.01) |
| ***H10W 74/01*** | (2026.01) |
| ***H10W 90/00*** | (2026.01) |
| *H10W 70/60* | (2026.01) |
| *H10W 74/00* | (2026.01) |

(52) U.S. Cl.

CPC ......... *H10W 74/124* (2026.01); *H10W 70/65* (2026.01); *H10W 74/016* (2026.01); *H10W 90/00* (2026.01); *H10W 70/60* (2026.01); *H10W 74/00* (2026.01); *H10W 90/722* (2026.01); *H10W 90/724* (2026.01); *H10W 90/732* (2026.01); *H10W 90/734* (2026.01)

(58) Field of Classification Search

CPC . H01L 23/315; H01L 23/49838; H01L 24/16; H01L 24/32; H01L 25/0657; H01L 21/565; H10W 74/124; H10W 90/00; H10W 70/65; H10W 74/016

See application file for complete search history.

(56) References Cited

U.S. PATENT DOCUMENTS 9,953,913 B1 * 4/2018 Gowda .................. H01L 24/82
2013/0241040 A1 * 9/2013 Tojo .................... H01L 23/4952
438/123

(Continued)

*Primary Examiner* — Michael Jung
(74) *Attorney, Agent, or Firm* — Kevin B. Jackson

(57) ABSTRACT

In one example, an electronic device includes an embedded module, which includes a module substrate and module components coupled to the module substrate. A device substrate is coupled to the first module substrate. Device terminals are coupled to the module components and a device encapsulant structure encapsulates the embedded module, the device substrate, and the device terminals. A portion of the device substrate is exposed from the device encapsulant structure and portions of the device terminals are exposed from the device encapsulant structure. Other examples and related methods are also disclosed herein.

21 Claims, 47 Drawing Sheets

(56) References Cited

U.S. PATENT DOCUMENTS

| | | | | |
|---|---|---|---|---|
| 2022/0028774 | A1* | 1/2022 | Murayama | H01L 23/49833 |
| 2022/0392828 | A1* | 12/2022 | Kato | H01L 23/4334 |
| 2023/0231487 | A1* | 7/2023 | Kusukawa | H01L 23/049 363/144 |

* cited by examiner 14
12
121
123
122
121i
121t 113
112
1122
1121
114
1152
1153
1151
115
1121p
1121t
1121o
1121i
11
1112
1111
111
1111p
1111t
1111i
1111o 15
113
123
122
121
12
112
1122
1121
1112
1111
111
114
1152
1153
1151
115
1121p
1111p
121i
1121t
115
1111t
1121o
1111o
1121i
1111i
121t
11
132
133
23
14-1
40

25
113
123
122
121
12
1112
1111
111
1152
1153
1151
115
1111p
121i
115
131i
131t
1111t
1111o
1111i
121t
132
133
131
13
14
21
50

24
12
112
113
111
121
123
122
1122
1121
25
1152
1111
1153
1112
1151
121i
115
1121p
121t
1121o
131i
1121t
1111p
131t
1111t
1121i
1111o
1111i
60
132
133
131
31
13

500
200
13
132
133
131
1122
2121
215
1121
2122
215
1153
2151
215
2153
2152
214
212
15
112
14
1152
115
1151
115
1112
115
1111
114
121
123
122
12
111
113
213

600
11'
11
14
15
112
121
123
122
115
1112
1111
111
1121
1122
112
1152
1153
1151
114
113
113'
114'
1122'
1121'
112'
1112'
1111'
111'
601
1151'
115'
1153'
1152'

700
710
11
11'
12
13
14
15
111
111'
112
112'
113
113'
114
114'
115
115'
121
122
123
131
132
133
1111
1111'
1112
1112'
1121
1121'
1122
1122'
1151
1151'
1152
1152'
1153
1153'

ELECTRONIC DEVICES HAVING EMBEDDED MODULE AND METHODS OF MANUFACTURING ELECTRONIC DEVICES HAVING THE SAME

CROSS-REFERENCE TO RELATED APPLICATIONS

This application claims priority from U.S. Provisional Application No. 63/407,650 filed on Sep. 17, 2022, and from U.S. Provisional Application No. 63/444,024 filed on Feb. 8, 2023, which are hereby incorporated by reference.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
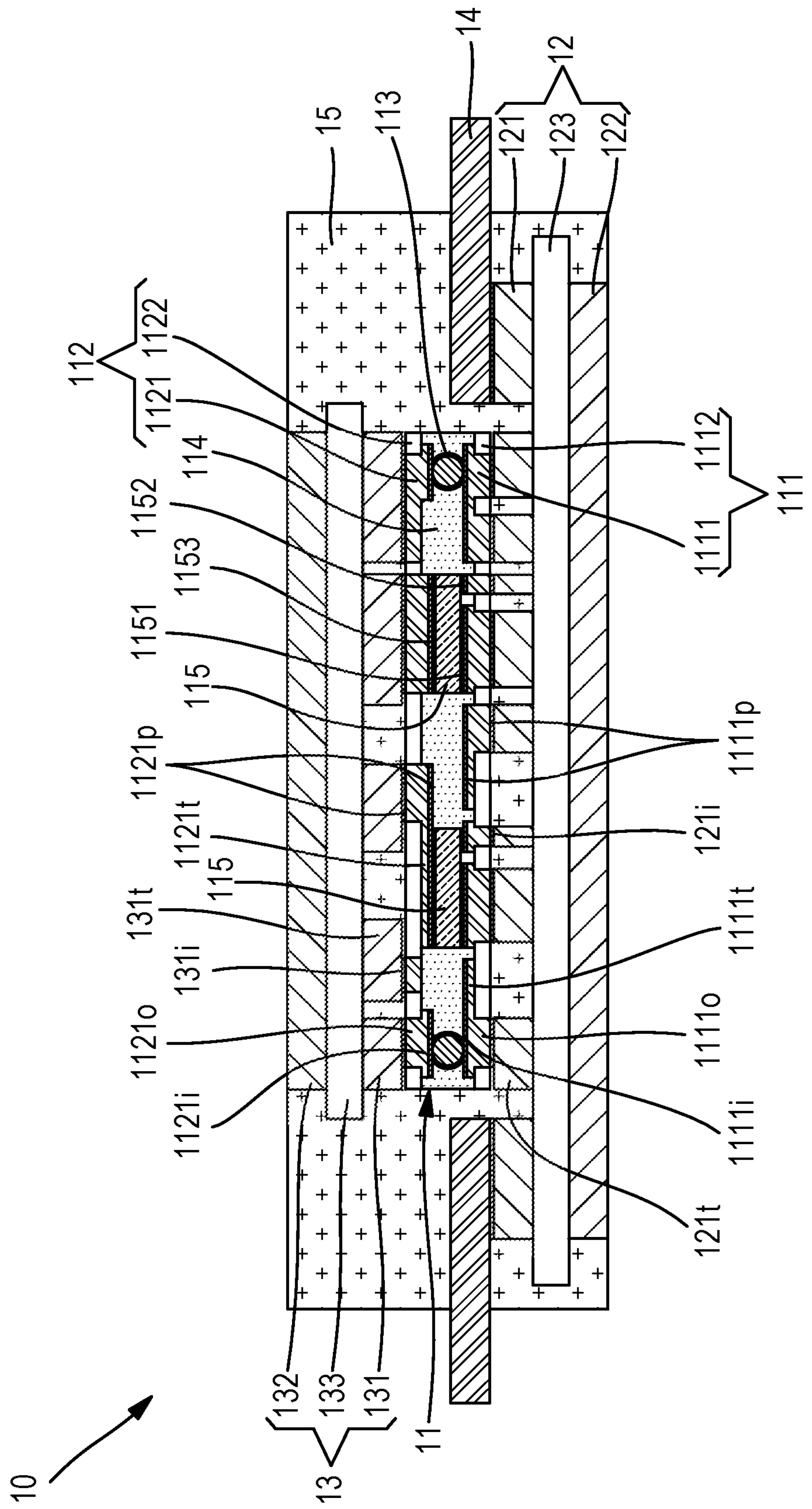
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly connected by one or more other elements. For example, if element A is coupled to element B, then element A can be directly contacting element B or indirectly connected to element B by an intervening element C. As used herein, the term coupled can refer to an electrical coupling or a mechanical coupling. Similarly, the terms "over" or "on" may be used to describe two elements directly contacting each other or to describe two elements indirectly connected by one or more other elements.

DESCRIPTION

The present description includes, among other features, structures and associated methods that relate to electronic devices with embedded modules and heat transfer or cooling structures. In some examples, the electronic device includes an embedded module with module components attached to a module substrate. In some examples, the module substrate is coupled to device terminals and conductive substrates are coupled to opposing sides of the embedded module. In some examples, the device terminals can comprise a leadframe. In some examples, the conductive substrates can be thermally conductive. In some examples, the conductive substrates can be thermally and electrically conducting.

In some examples, the embedded module can include a pair of module substrates on opposing sides of module components, such as power semiconductor components. In some examples, the pair of module substrates can be electrically coupled together. In some examples, the signal transmitting structure can be attached to the embedded module. In other examples, the signal transmitting structure can be attached to one or both conductive substrates. In some examples, the electronic device is encapsulated within a package body with one or more features exposed from portions of the package body. Among other things, the structures and methods of the present description avoid the use of spacer structures, which in the past have caused stack-up tolerance issues. Such stack-up tolerance issues have resulted in package non-planarity and component cracking problems.

In an example, an electronic device includes a first embedded module, which includes a first module substrate and a first module component coupled to the first module substrate. A first device substrate is coupled to the first module substrate. Device terminals are coupled to the first module component and a device encapsulant structure encapsulates the first embedded module, the first device substrate, and the device terminals. A portion of the first device substrate is exposed from the device encapsulant structure and portions of the device terminals are exposed from the device encapsulant structure.

In an example, an electronic device includes a first embedded module including a first module substrate comprising a first conductive structure, a second module substrate comprising a second conductive structure, and a first module component interposed between the first module substrate and the second module substrate. The first module component includes a first component terminal coupled to the first conductive structure and a second component terminal coupled to the second conductive structure. A first device substrate is coupled to the first module substrate and includes a first outward conductive layer. A second device substrate is coupled to the second module substrate and includes a second outward conductive layer. Device terminals are coupled to the first module component and a device encapsulant structure encapsulates the first embedded module, the first device substrate, the second device substrate, and the device terminals. The device terminals, the first outward conductive layer, and the second outward conductive layer are exposed from the device encapsulant structure.

In an example, a method of manufacturing an electronic device includes providing a first embedded module including a first module substrate comprising a first conductive structure, a second module substrate comprising a second conductive structure, and a first module component interposed between the first module substrate and the second module substrate. The first module component includes a first component terminal coupled to the first conductive structure and a second component terminal coupled to the second conductive structure. The method includes providing a first device substrate coupled to the first module substrate, the first device substrate comprising a first outward conductive layer. The method includes providing a second device substrate coupled to the second module substrate, the second device substrate comprising a second outward conductive layer. The method includes coupling device terminals to the module components. The method includes providing a device encapsulant structure encapsulating the first embedded module, the first device substrate, the second device substrate, and the device terminals. The device terminals, the first outward conductive layer, and the second outward conductive layer are exposed from the device encapsulant structure.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise embedded module 11, device substrate 12, device substrate 13, device terminals 14, and device encapsulant 15.

Embedded module 11 can comprise first module substrate 111, second module substrate 112, module interconnects 113, module encapsulant 114, and one or more module component(s) 115. First module substrate 111 can comprise conductive structure 1111 and dielectric structure 1112. Conductive structure 1111 can comprise inward terminals 1111*i*, outward terminals 1111*o*, traces 1111*t*, and plating 1111*p*. Second module substrate 112 can comprise conductive structure 1121 and dielectric structure 1122. Conductive structure 1121 can comprise inward terminals 1121*i*, outward terminals 1121*o*, traces 1121*t*, and plating 1121*p*. Module components 115 can each comprise component terminals 1151, 1152, and 1153.

Device substrate 12 can comprise inward metallic layer 121, outward metallic layer 122, and core layer 123. Inward metallic layer 121 can comprise inward terminals 121*i* and traces 121*t*. Device substrate 13 can comprise inward metallic layer 131, outward metallic layer 132, and core layer 133. Inward metallic layer 131 can comprise inward terminals 131*i* and traces 131*t*.

First module substrate 111, second module substrate 112, module encapsulant 114, device substrates 12 and 13, and device encapsulant 15 can comprise or be referred to as an electronic package or a package and can protect the module components 115 from exposure to external elements or the environment. The electronic package can also provide coupling between module components 115 and external components or other electronic packages.

Figure 2A:
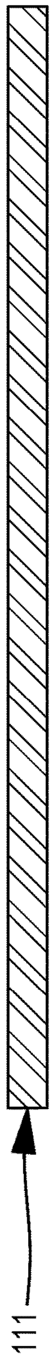
FIGS. 2A, 2B, 2C, 2D, 2E, 2F, 2G, 2H, 2I, 2J, 2K, 2L, 2M, 2N, 2O, 2P, 2Q, 2R, and 2S show cross-sectional views of an example method for manufacturing an example electronic device.
Figure 2B:
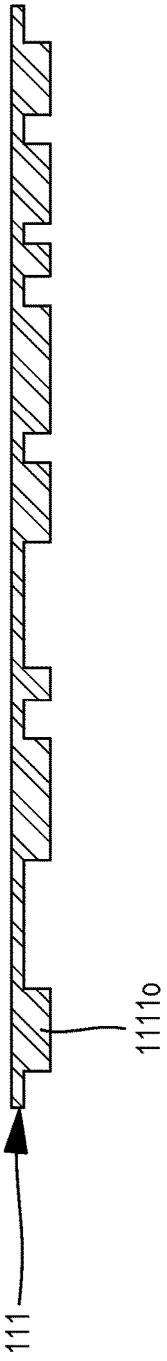
Figure 2C:
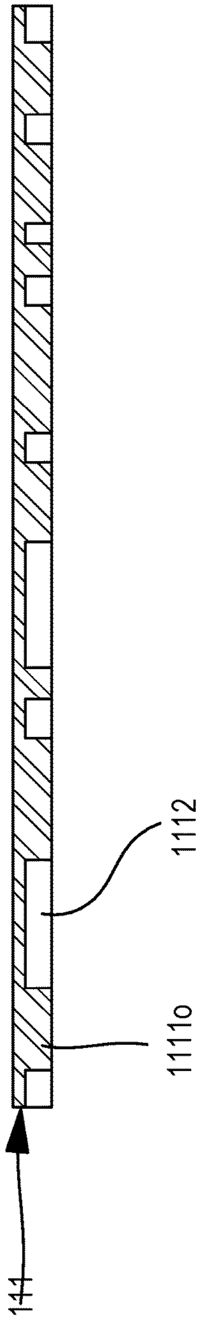
Figure 2D:
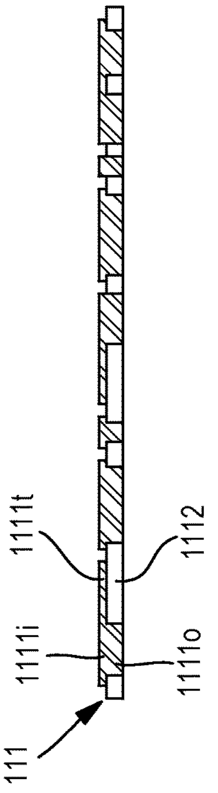
Figure 2E:
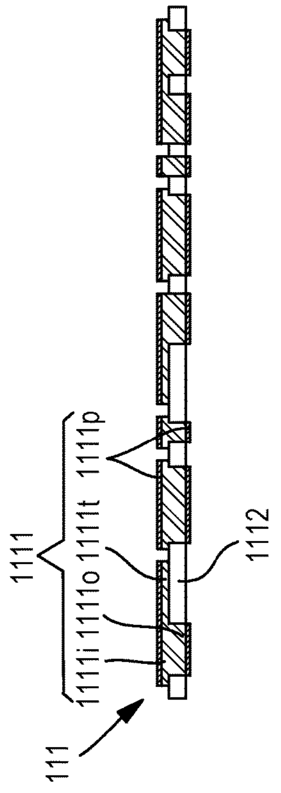
Figure 2F:
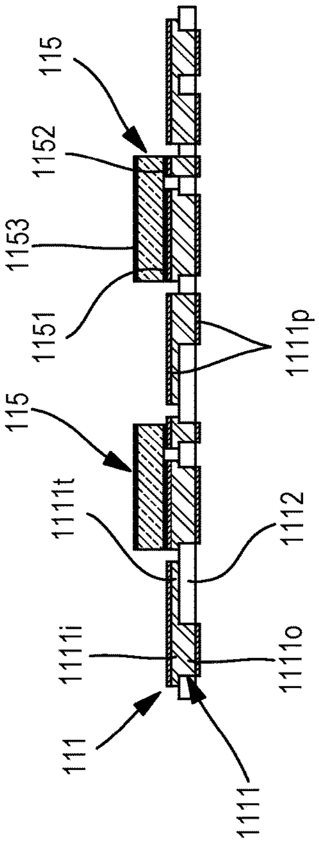
Figure 2G:
Figure 2H:
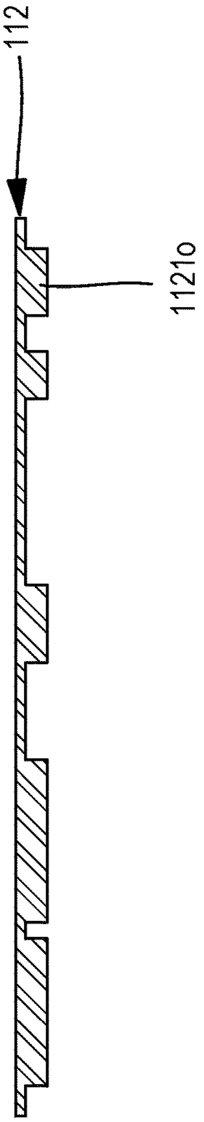
Figure 2I:
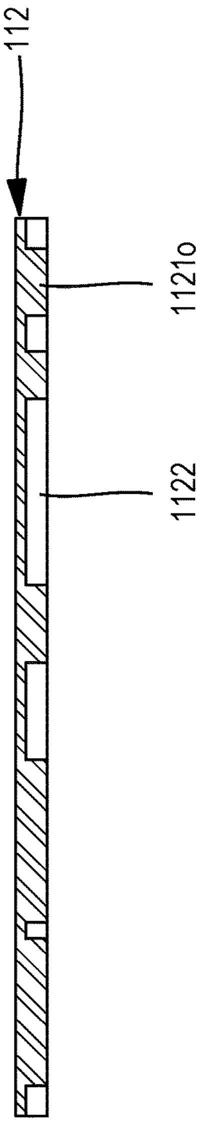
Figure 2J:
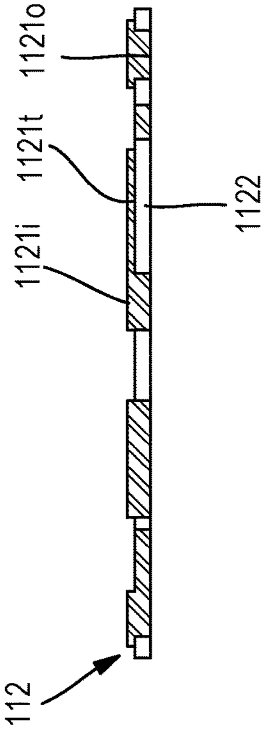
Figure 2K:
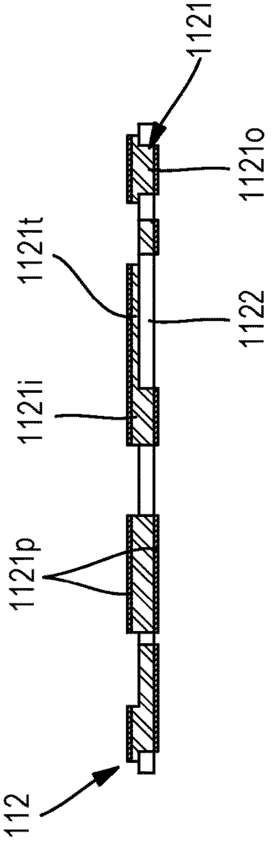
Figure 2L:
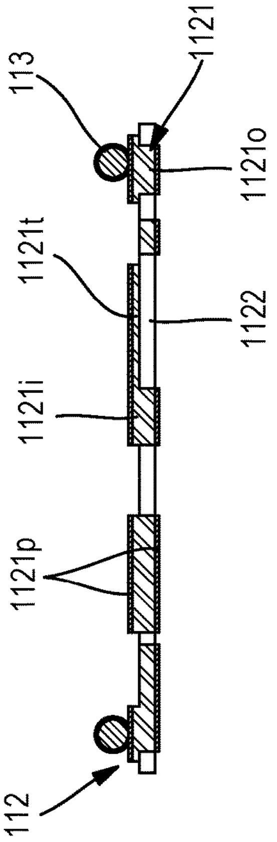
Figure 2M:
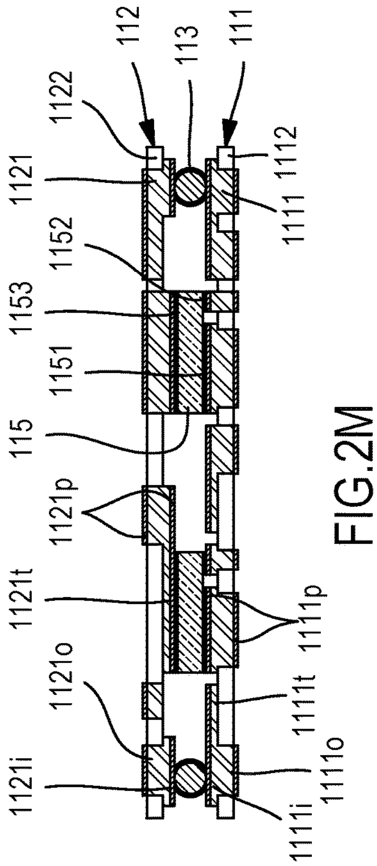
Figure 2N:
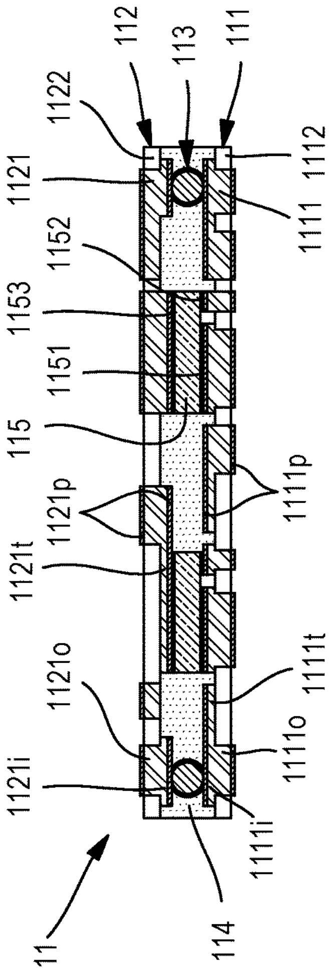
Figure 2O:
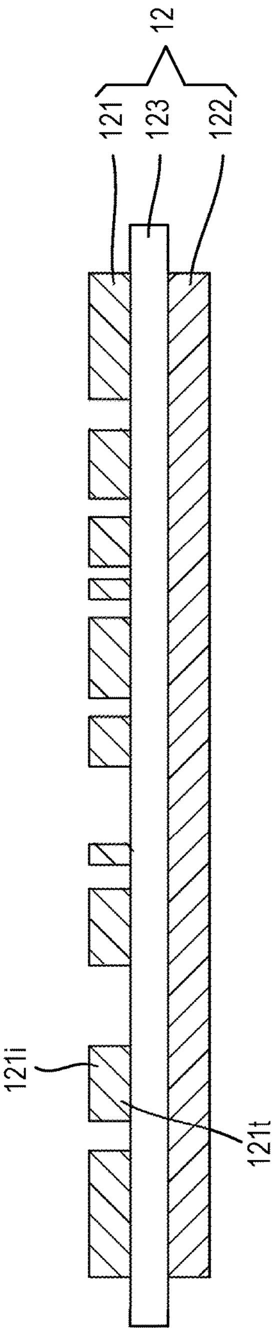
Figure 2P:
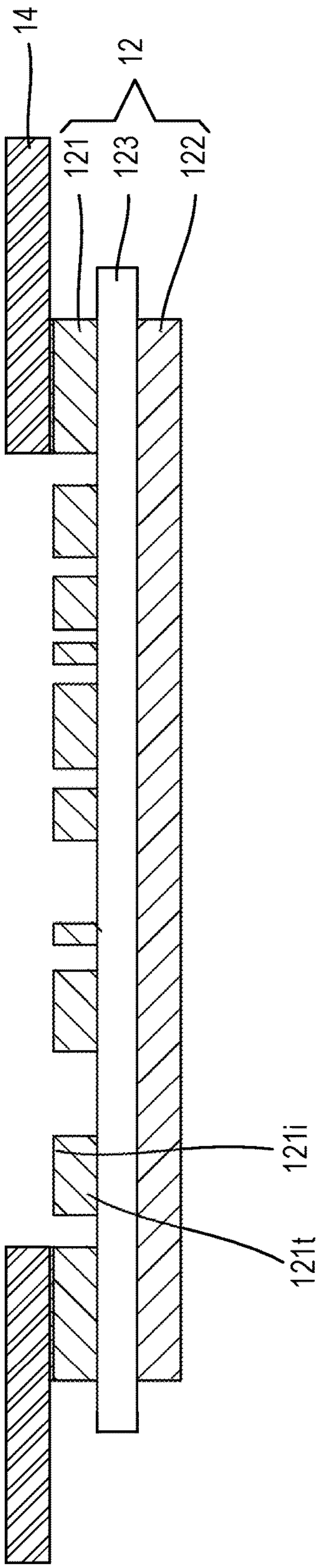
Figure 2Q:
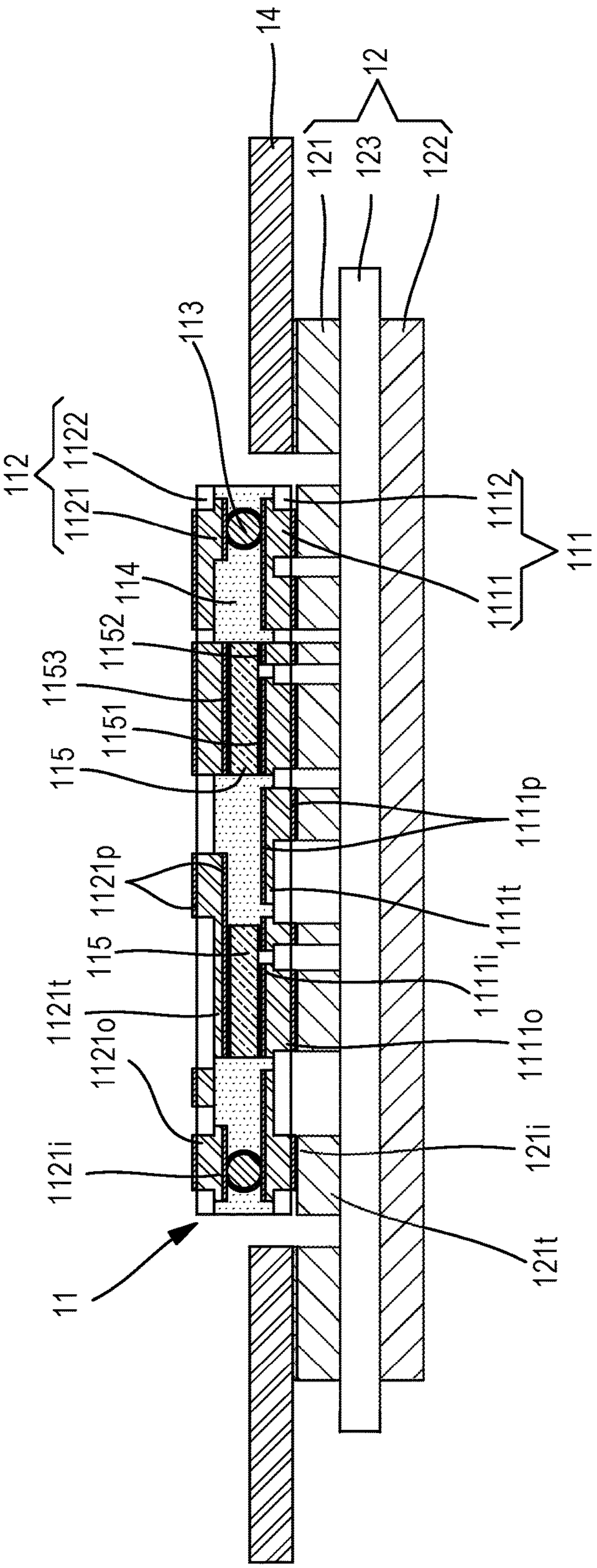
Figure 2R:
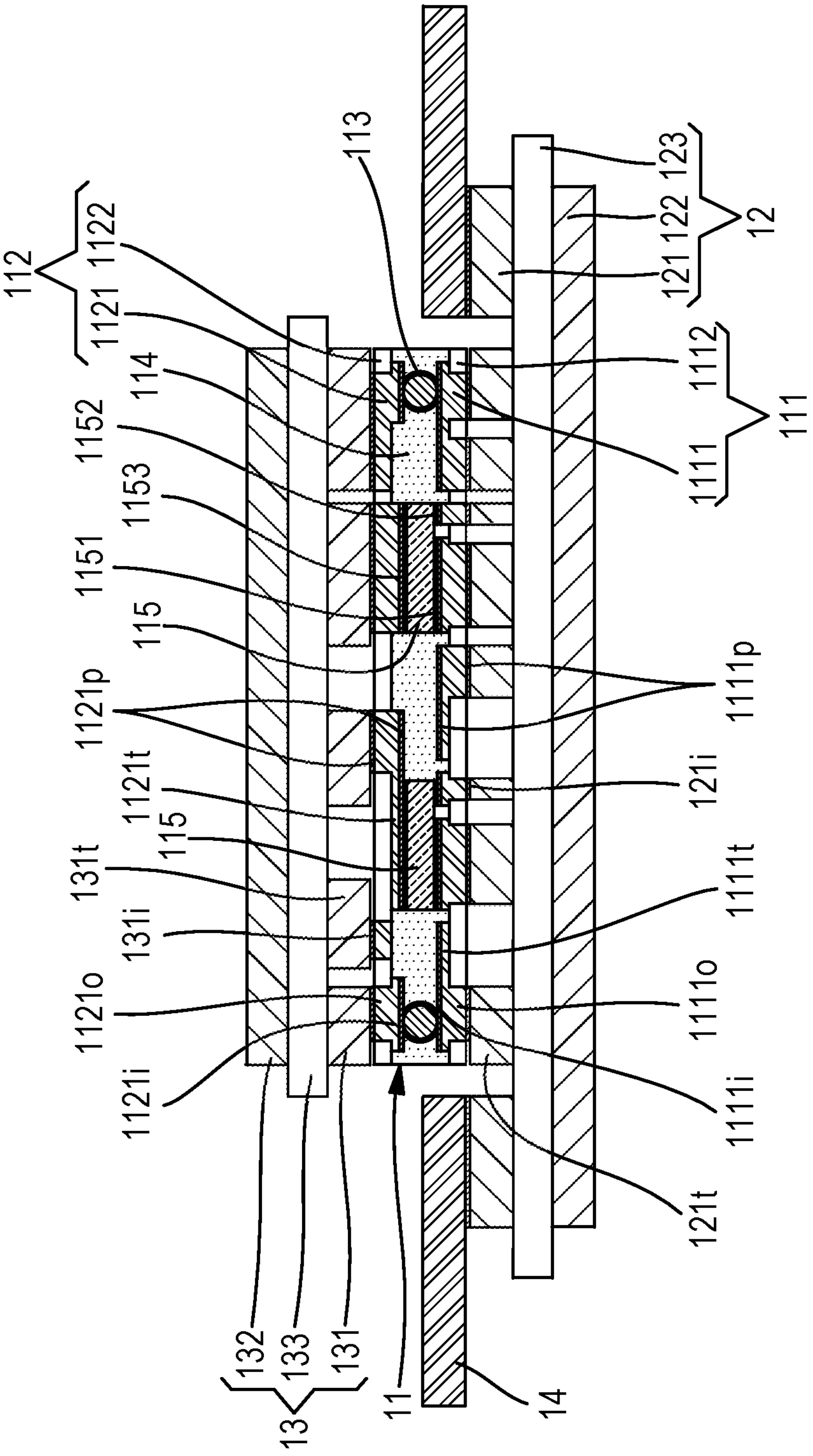
Figure 2S:
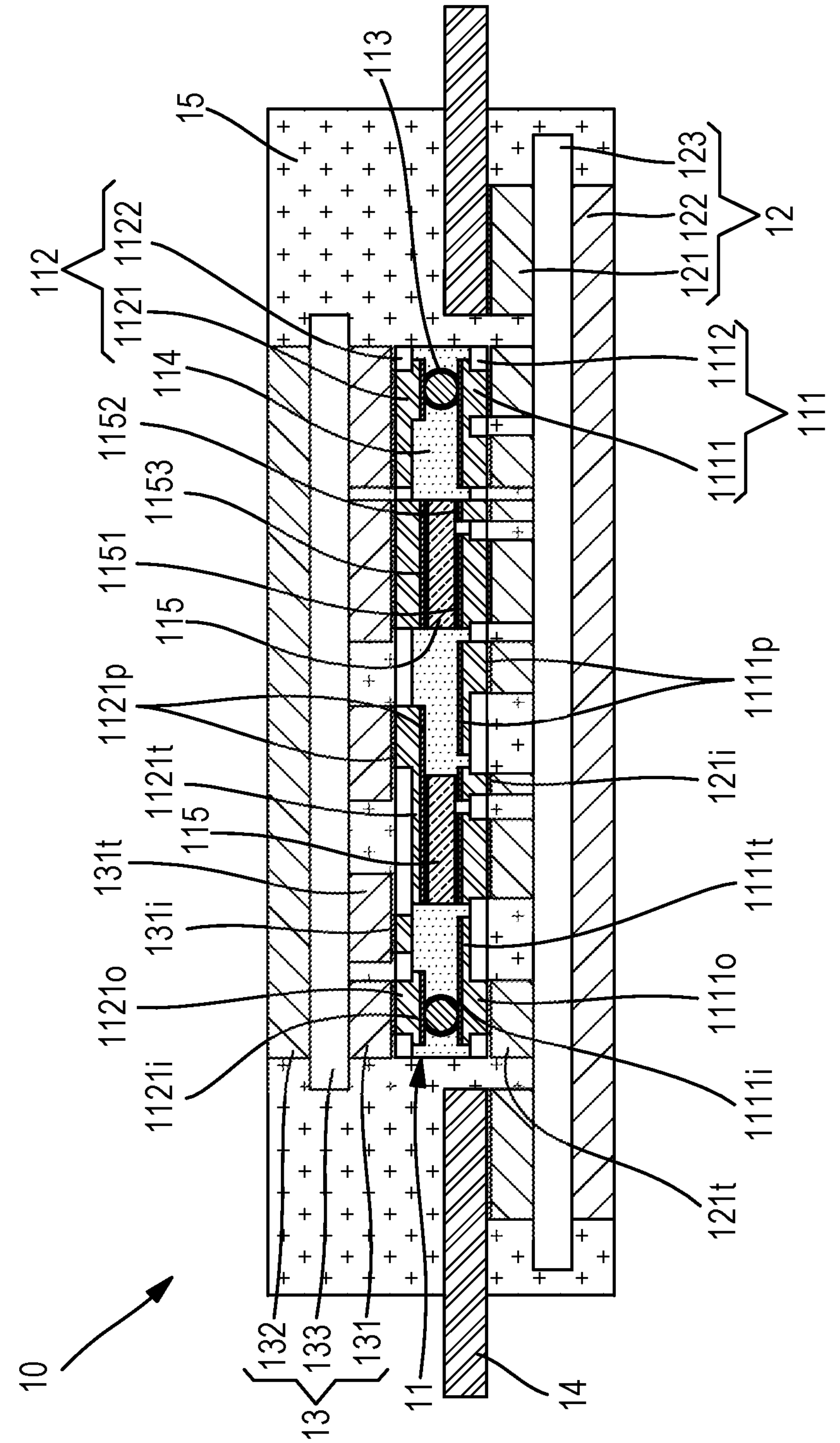

FIGS. 2A to 2S show cross-sectional views of an example method for manufacturing an example electronic device 10. FIG. 2A shows a cross-sectional view of electronic device 10 at an early stage of manufacture.

In the example shown in FIG. 2A, first module substrate 111 can be provided. In some examples, first module substrate 111 can comprise copper, a copper alloy, nickel, a nickel alloy, iron, or an iron-nickel alloy. In some examples, the thickness of first module substrate 111 can range from about 125 micrometers (μm) to about 250 μm.

FIG. 2B shows a cross-sectional view of electronic device 10 at a later stage of manufacture. In the example shown in FIG. 2B, outward terminals 1111*o* can be provided on the bottom side of first module substrate 111. Outward terminals 1111*o* can be provided by removing a portion of first module substrate 111 from the bottom side of first module substrate 111. In some examples, outward terminals 1111*o* can be formed using an etching process. For example, the etching process can comprise dry etching (e.g., plasma etching, reactive ion etching (RIE), or sputter etching) or wet etching (e.g., immersion and spraying). Outward terminals 1111*o* can be unetched portions of the bottom side of first module substrate 111.

FIG. 2C shows a cross-sectional view of electronic device 10 at a later stage of manufacture. In the example shown in FIG. 2C, first dielectric structure 1112 can be provided. In some examples, first dielectric structure 1112 can comprise or be referred to as a resin, a polymer with fillers, a mold compound, a protective material, or a mold material. In some examples, dielectric structure 1112 can be provided by a film assisted molding process, a compression molding process, a transfer molding process, or liquid resin screen printing process. Dielectric structure 1112 can fill removed or etched portions of first module substrate 111 (e.g., first dielectric structure 1112 can be deposited or interposed between outward terminals 1111*o*). Dielectric structure 1112 can electrically isolate outward terminals 1111*o* from each other. Outward terminals 1111*o* can be exposed from dielectric structure 1112 at the bottom side of first module substrate 111. In some examples, a portion of dielectric structure 1112 can be removed by grinding process after over-molding the bottom side of first module substrate 111, thereby exposing outward terminals 1111*o*. The bottom side of dielectric structure 1112 can be coplanar with the bottom side of outward terminals 1111*o*. In some examples, the thickness of dielectric structure 1112 can range from about 87 μm to about 175 μm.

FIG. 2D shows a cross-sectional view of electronic device 10 at a later stage of manufacture. In the example shown in FIG. 2D, inward terminals 1111*i* and traces 1111*t* can be provided on the top side of first module substrate 111. Inward terminals 1111*i* can be provided by removing a portion of first module substrate 111 from the top side of first module substrate 111. In some examples, inward terminals 1111*i* can be formed using an etching process. The etching process can comprise dry etching (e.g., plasma etching, RIE, or sputter etching) or wet etching (e.g., immersion and spraying). Inward terminals 1111*i* can be unetched portions of the top side of first module substrate 111. Inward terminals 1111*i* can be exposed from dielectric structure 1112 at the top side of first module substrate 111. Inward terminals 1111*i* can be coupled to outward terminals 1111*o*.

Traces 1111*t* can be provided by removing a portion of first module substrate 111 from the top side of first module substrate 111. For example, traces 1111*t* can be formed by etching, as previously described with reference to inward terminals 1111*i*. In some examples, traces 1111*t* can be provided simultaneously with inward terminals 1111*i*. Traces 1111*t* can extend and be coupled to the lateral sides of inward terminals 1111*i*. Traces 1111*t* can extend in a generally horizontal direction over the top side of dielectric structure 1112. Traces 1111*t* can be exposed at the top side of first module substrate 111. Traces 1111*t* can be coupled to inward terminals 1111*i* and outward terminals 1111*o*. For example, at least some of inward terminals 1111*i* may be coupled to outward terminals 1111*o* via traces 1111*t*.

FIG. 2E shows a cross-sectional view of electronic device 10 at a later stage of manufacture. In the example shown in FIG. 2E, plating 1111*p* can be provided. Plating 1111*p* can be provided on the top and bottom sides of first module substrate 111. In some examples, plating 1111*p* can be provided on the surfaces of outward terminals 1111*o*, inward terminals 1111*i*, and traces 1111*t*. In some examples, plating 1111*p* can be a part of inward terminals 1111*i* or outward terminals 1111*o*. In some examples, plating 1111*p* can comprise or be referred to as a coating or a conductive coating. In some examples, plating 1111*p* can comprise gold, silver, copper, platinum, tin, nickel, palladium, titanium, or tungsten. In some examples, plating 1111*p* can be provided by electroless plating or electroplating. In some examples, the thickness of plating 1111*p* can range from about 0.3 μm to about 15.2 μm. In some examples, outward terminals 1111*o*, inward terminals 1111*i*, and traces 1111*t* may be devoid of plating 1111*p*, such that first module substrate 111 may be incorporated into electronic device 10 without plating 1111*p*.

In some examples, inward terminals 1111*i*, outward terminals 1111*o*, traces 1111*t*, and plating 1111*p* can be referred to as conductive structure 1111. Stated differently, conductive structure 1111 can comprise inward terminals 1111*i*, outward terminals 1111*o*, traces 1111*t*, and plating 1111*p*. Conductive structure 1111 can comprise or be referred to as conductive paths, leads, terminals, pads, traces, or vias. Conductive structure 1111 can transfer signals, currents, or voltages within first module substrate 111. In some examples, first module substrate 111 can comprise or be referred to as a leadframe substrate, a molded substrate, a molded leadframe (MLF), or a routable molded leadframe (rtMLF).

FIG. 2F shows a cross-sectional view of electronic device 10 at a later stage of manufacture. In the example shown in FIG. 2F, module component(s) 115 can be provided on first module substrate 111. In some examples, module component 115 can comprise or be referred to as a power component, a power device, a power semiconductor device, a metal-oxide-semiconductor field-effect transistor (MOSFET) device, a semiconductor die, a semiconductor chip, or a semiconductor package. In some examples, module component 115 can comprise or be referred to a compound semiconductor power device, such as a SiC power MOSFET, or a GaN power device. Module component 115 can be coupled to inward terminals 1111*i*. Inward terminals 1111*i* provide connection paths between module component 115 and first module substrate 111. In some examples, module component 115 can be coupled to plating 1111*p* on inward terminals 1111*i* through an interface material. For example, an interface material can be provided on plating 1111*p*, and module component 115 can be seated on the interface material to allow module component 115 to be coupled to plating 1111*p* by a reflow process. In some examples, the interface material can comprise a conductive adhesive, conductive epoxy, solder paste, or Ag sintered paste.

In some examples, module component 115 can include component terminals 1151, 1152, and 1153. In some examples, component terminals 1151 and 1152 can be located over a first surface of module component 115 and component terminal 1153 can be located over a second surface module component 115 opposite the first surface of module component 115. Component terminals 1151 and 1152 can be coupled to first module substrate 111 and can contact plating 1111*p* or inward terminals 1111*i*. In some examples, component terminals 1151 and 1152 can be coupled to outward terminals 1111*o* through inward terminals 1111*i* or through inward terminals 1111*i* and traces 1111*t*. In some examples, the thickness of module component 115 can range from about 55 μm to about 250 μm.

Component terminals 1151, 1152, and 1153 can comprise or be referred to as pads, bond pads, lands, or metal layers. In some examples, component terminal 1151 can be referred to as a source, component terminal 1152 can be referred to as a gate, and component terminal 1153 can be referred to as a drain. Component terminals 1151, 1152, and 1153 can comprise copper, aluminum, palladium, titanium, tungsten, titanium/tungsten, nickel, gold, or silver. In some examples, component terminals 1151, 1152, and 1153 can be provided as connection paths between module component 115 and first module substrate 111 or between module component 115 and second module substrate 112 (FIG. 2M). In some examples, the thicknesses of component terminals 1151, 1152, and 1153 can range from about 0.68 μm to about 6.55 μm.

FIG. 2G shows a cross-sectional view of electronic device 10 at a later stage of manufacture. In the example shown in FIG. 2G, second module substrate 112 can be provided. In some examples, second module substrate 112 can comprise copper, a copper alloy, nickel, a nickel alloy, iron, or an iron-nickel alloy. In some examples, the thickness of second module substrate 112 can range from about 125 μm to about 250 μm. In some examples, the area (or "footprint") of second module substrate 112 can be equal to the area (or footprint) of first module substrate 111.

FIG. 2H shows a cross-sectional view of electronic device 10 at a later stage of manufacture. In the example shown in FIG. 2H, outward terminals 1121*o* can be provided on the bottom side of second module substrate 112. Outward terminals 1121*o* can be provided by removing a portion of second module substrate 112 from the bottom side of second module substrate 112. In some examples, outward terminals 1121*o* can be formed using an etching process, as previously described with reference to outward terminals 1111*o*. For example, outward terminals 1121*o* can be unetched portions of the bottom side of second module substrate 112.

FIG. 2I shows a cross-sectional view of electronic device 10 at a later stage of manufacture. In the example shown in FIG. 2I, dielectric structure 1122 can be provided. In some examples, dielectric structure 1122 can comprise or be referred to as a resin, a polymer with fillers, a mold compound, a protective material, or a mold material. In some examples, dielectric structure 1122 can be provided by a film assisted molding process, a compression molding process, transfer molding process, or liquid resin screen printing process. Dielectric structure 1122 can fill removed or etched portions of second module substrate 112 (e.g., dielectric structure 1122 can be deposited or interposed between outward terminals 1121*o*). Dielectric structure 1122 can electrically isolate outward terminals 1121*o* from each other. Outward terminals 1121*o* can be exposed from dielectric structure 1122 at the bottom side of second module substrate 112. In some examples, a portion of dielectric structure 1122 can be removed by grinding process after over-molding the bottom side of second module substrate 112, thereby exposing outward terminals 1121*o*. The bottom side of dielectric structure 1122 can be coplanar with the bottom side of outward terminals 1121*o*. In some examples, the thickness of dielectric structure 1122 can range from about 87 μm to about 175 μm.

FIG. 2J shows a cross-sectional view of electronic device 10 at a later stage of manufacture. In the example shown in FIG. 2J, inward terminals 1121*i* and traces 1121*t* can be provided on the top side of second module substrate 112. Inward terminals 1121*i* can be provided by removing a portion of second module substrate 112 from the top side of second module substrate 112. In some examples, inward terminals 1121*i* can be formed using an etching process, as previously described with reference to inward terminals 1111*i*. Inward terminals 1121*i* can be unetched portions of the top side of second module substrate 112. Inward terminals 1121*i* can be exposed from dielectric structure 1122 at the top side of second module substrate 112. Inward terminals 1121*i* can be coupled to outward terminals 1121*o*.

Traces 1121*t* can be provided by removing a portion of second module substrate 112 from the top side of second module substrate 112. For example, traces 1121*t* can be formed by etching, as previously described. In some examples, traces 1121*t* can be provided simultaneously with inward terminals 1121*i*. Traces 1121*t* can extend to and be coupled to the lateral sides of inward terminals 1121*i*. Traces 1121*t* can extend in a generally horizontal direction over the top side of dielectric structure 1122. Traces 1121*t* can be exposed from the top side of second module substrate 112. Traces 1121*t* can be coupled to inward terminals 1121*i* and outward terminals 1121*o*. For example, at least some of inward terminals 1121*i* can be coupled to outward terminals 1121*o* via traces 1121*t*.

FIG. 2K shows a cross-sectional view of electronic device 10 at a later stage of manufacture. In the example shown in FIG. 2K, plating 1121*p* can be provided. Plating 1121*p* can be provided on the top and bottom sides of second module substrate 112. In some examples, plating 1121*p* can be provided on the surfaces of outward terminals 1121*o*, inward terminals 1121*i*, and traces 1121*t*. In some examples, plating 1121*p* can be part of inward terminals 1121*i* or outward terminals 1121*o*. In some examples, plating 1121*p* can comprise or be referred to as a coating or a conductive coating. In some examples, plating 1121*p* can comprise gold, silver, copper, platinum, tin, nickel, palladium, titanium, or tungsten. In some examples, plating 1121*p* can be provided by electroless plating or electroplating. In some examples, the thickness of plating 1121*p* can range from about 0.3 μm to about 15.2 μm. In some examples, outward terminals 1121*o*, inward terminals 1121*i*, and traces 1121*t* can be devoid of plating 1121*p*, such that second module substrate 112 can be incorporated into electronic device 10 without plating 1121*p*.

In some examples, inward terminals 1121*i*, outward terminals 1121*o*, traces 1121*t*, and plating 1121*p* can be referred to as conductive structure 1121. Stated differently, conductive structure 1121 can comprise inward terminals 1121*i*, outward terminals 1121*o*, traces 1121*t*, and plating 1121*p*. In some examples, conductive structure 1121 can comprise or be referred to as conductive paths, leads, terminals, pads, traces, or vias. Conductive structure 1121 can transfer signals, currents, or voltages within second module substrate 112.

In some examples, second module substrate 112 can comprise or be referred to as a leadframe substrate, a molded substrate, or a rtMLF. While first module substrate 111 and second module substrate 112 are described as lead frames, it is contemplated and understood that, in some examples, first module substrate 111 or second module substrate 112 can comprise a laminate or a pre-formed substrate. Pre-formed substrates can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrates can be formed through a semi-additive or modified-semi-additive process.

FIG. 2L shows a cross-sectional view of electronic device 10 at a later stage of manufacture. In the example shown in FIG. 2L, module interconnect 113 can be provided on second module substrate 112. Module interconnect 113 can be coupled to inward terminals 1121*i*. In some examples, module interconnect 113 can comprise or be referred to as a solder ball, a solder-coated metal core (e.g., Cu core) ball, a pillar, a pillar with a solder cap, or a bump. In some examples, module interconnect 113 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, after a conductive material containing a solder is formed on plating 1121*p* of inward terminals 1121*i*, module interconnect 113 can be provided by a reflow process. In some examples, the thickness of module interconnect 113 can range from about 150 μm to about 365 μm.

FIG. 2M shows a cross-sectional view of electronic device 10 at a later stage of manufacture. In the example shown in FIG. 2M, second module substrate 112 can be provided over first module substrate 111. In some examples, second module substrate 112 can be flipped such that inward terminals 1121*i* of second module substrate 112 are oriented toward module components 115 and first module substrate 111, and outward terminals 1121*o* are on the top side of second module substrate 112. In some examples, after locating second module substrate 112 on first module substrate 111, second module substrate 112 can be coupled to first module substrate 111 by, for example, thermal compression bonding. Module interconnect 113 can couple second module substrate 112 to first module substrate 111. For example, module interconnect 113 can be coupled to inward terminals 1111*i* or traces 1111*t* of first module substrate 111. Module components 115 can be coupled to inward terminals 1121*i* or traces 1121*t* of second module substrate 112. In some examples, component terminal 1153 of module component 115 can be coupled to inward terminals 1121*i* or traces 1121*t* of second module substrate 112. The side of first module substrate 111 where module components 115 are attached is an example of a first inward side. The side of first module substrate 111 opposite the first inward side is an example of a first outward side. The side of second module substrate 112 where module components are attached is an example of a second inward side. The side of second module substrate 112 opposite to the second inward side is an example of a second outward side. In addition, FIG. 2M illustrates an example where module components 115 reside on the same plane or are coplanar. FIG. 2M further illustrates an example where embedded module 11 is devoid of any spacers.

FIG. 2N shows a cross-sectional view of electronic device 10 at a later stage of manufacture. In the example shown in FIG. 2N, module encapsulant 114 can be provided. Module encapsulant 114 can be provided between first module substrate 111 and second module substrate 112. Module encapsulant 114 can encapsulate or surround module interconnect 113 and module components 115. Module encapsulant 114 can contact the lateral sides of module components 115. In some examples, module encapsulant 114 can contact conductive structure 1111 and dielectric structure 1112 of first module substrate 111, and conductive structure 1121 and dielectric structure 1122 of second module substrate 112. In some examples, module encapsulant 114 can comprise or be referred to as a resin, a polymer with fillers, a mold compound, a protective material, or a mold material. In some examples, module encapsulant 114 can be provided by a film assisted molding process, a compression molding process, or a transfer molding process. In some examples, the thickness of module encapsulant 114 can range from about 150 μm to about 300 μm. In some examples, module encapsulant 114 can protect module interconnect 113 and module component 115 from exposure to external factors or environments. In some examples, module encapsulant 114 can be a part of device encapsulant 15 (FIG. 1).

In some examples, first module substrate 111, second module substrate 112, module interconnect 113, module encapsulant 114, and module components 115 can be referred to as embedded module 11. In some examples, embedded module 11 can comprise or be referred to as a power module or an embedded power module. In some examples, the height of embedded module 11 can range from about 350 μm to about 800 μm. The combined height of first module substrate 111, second module substrate 112, and module component 115 (or module encapsulant 114) can define the height of embedded module 11. As illustrated in FIG. 2N, module encapsulant 114 is over module components 115, over the first inward side of first module substrate 111, and over the second inward side of second module substrate 112. Also, the first outward side of first module substrate 111 and the second outward side of second module substrate 112 can be exposed from module encapsulant 114. In some examples, the outward sides of first module substrate 111 and second module substrate 112 are devoid of module encapsulant 114.

FIG. 2O shows a cross-sectional view of electronic device 10 at a later stage of manufacture. In the example shown in FIG. 2O, device substrate 12 can be provided. In some examples, device substrate 12 can comprise or be referred to as a direct bonded copper substrate, a direct plated copper substrate, a thermal dissipation substrate, a ceramic substrate, or active metal brazing (AMB). Device substrate 12 can support embedded module 11 and device substrate 13 (FIG. 1). In some examples, device substrate 12 can transfer or dissipate heat generated by embedded module 11 away from embedded module 11 and to a lower portion of electronic device 10. In some examples, the height of device substrate 12 can range from about 650 μm to about 2000 μm. The area (or footprint) of device substrate 12 can be larger than the area (or footprint) of embedded module 11. Device substrate 12 can comprise inward metallic layer 121, outward metallic layer 122, and core layer 123.

Inward metallic layer 121 can comprise or be referred to as metallic planes, metallic paths, leads, terminals, pads, or traces. Inward metallic layer 121 can comprise a metal such as, for example, aluminum, palladium, titanium, tungsten, titanium/tungsten, nickel, gold, or silver. In some examples, inward metallic layer 121 comprises copper. Inward metallic layer 121 can be provided on the top side of core layer 123. In some examples, the thickness of inward metallic layer 121 can range from about 200 μm to about 800 μm.

Inward metallic layer 121 can be coupled to core layer 123. In some examples, inward metallic layer 121 can be formed covering the entire top side of core layer 123 and then etched to remove a portion of inward metallic layer 121 and form inward terminals 121*i* and traces 121*t* over the top side of core layer 123. In some examples, inward terminals 121*i* can have a plating similar to plating 1111*p*. Traces 121*t* can extend to and contact the lateral sides of inward terminals 121*i*.

Outward metallic layer 122 can comprise or be referred to as metallic planes, metallic paths, leads, terminals, pads, or traces. Outward metallic layer 122 can comprise a metal, such as for example, aluminum, palladium, titanium, tungsten, titanium/tungsten, nickel, gold, or silver. In some examples, outward metallic layer 122 comprises copper. Outward metallic layer 122 can be provided on the bottom side of core layer 123. In some examples, outward metallic layer 122 can be formed covering the entire bottom side of core layer 123. In some examples, outward metallic layer 122 can transfer or dissipate heat generated by embedded module 11 to a lower portion of electronic device 10. In some examples, the thickness of outward metallic layer 122 can range from about 200 μm to about 800 μm.

Core layer 123 can comprise or be referred to as a ceramic, a thermal conductive material, or a dielectric. Core layer 123 can support inward metallic layer 121 and outward metallic layer 122. In some examples, core layer 123 can transfer heat generated from embedded module 11 to outward metallic layer 122. In some examples, the area (or footprint) of core layer 123 can be larger than the area (or footprint) of inward metallic layer 121 or than the area (or footprint) of outward metallic layer 122. In some examples, the thickness of core layer 123 can range from about 200 μm to about 1000 μm. In some examples, a portion of inward metallic layer 121 and a portion of outward metallic layer 122 can be coupled to each other by one or more conductive via(s) extending through core layer 123.

FIG. 2P shows a cross-sectional view of electronic device 10 at a later stage of manufacture. In the example shown in FIG. 2P, device terminals 14 can be provided on device substrate 12. In some examples, device terminals 14 can be spaced apart from each other and can be provided on an outer edge or perimeter of device substrate 12. Device terminals 14 can be coupled to inward metallic layer 121 (e.g., inward terminals 121*i* or traces 121*t*) of device substrate 12. Device terminals 14 can protrude outward of device substrate 12. In some examples, device terminals 14 can be spaced apart from embedded module 11 and can be provided outside embedded module 11 (FIG. 2Q). In some examples, device terminals 14 can comprise copper, a copper alloy, nickel, a nickel alloy, iron, or an iron-nickel alloy. In some examples, device terminals 14 can be coupled to the inward metallic layer 121 by ultrasonic welding, soldering, or Ag sintering. In some examples, device terminals 14 can be provided as an electrical contact between electronic device 10 and an external component. In some examples, the thicknesses of device terminals 14 can range from about 125 μm to about 800 μm.

FIG. 2Q shows a cross-sectional view of electronic device 10 at a later stage of manufacture. In the example shown in FIG. 2Q, embedded module 11 can be provided on device substrate 12. Embedded module 11 can be provided inside device terminals 14. Embedded module 11 can be coupled to device substrate 12. Conductive structure 1111 (e.g., outward terminals 1111*o*) of first module substrate 111 can be coupled to inward metallic layer 121 (e.g., inward terminals 121*i*) of device substrate 12. Device substrate 12 can couple embedded module 11 to device terminals 14. For example, inward metallic layer 121 can couple embedded module 11 to device terminals 14. In some examples, inward metallic layer 121 can transfer signals from embedded module 11 to device terminals 14 or can transfer signals received by device terminals 14 to embedded module 11. In some examples, device terminals 14 can comprise or be referred to as leads, lead frames, or legs. In some examples, after being located on device substrate 12, embedded module 11 can be attached or bonded to device substrate 12 by soldering or Ag sintering. In some examples, traces 121*t* can be located under (i.e., vertically overlapped by) dielectric structure 1112 of first module substrate 111 (e.g., traces 121*t* can be portions of inward metallic layer 121 that are not contacting conductive structure 1111 of first module substrate 111 or device terminals 14).

FIG. 2R shows a cross-sectional view of electronic device 10 at a later stage of manufacture. In the example shown in FIG. 2R, device substrate 13 can be provided over embedded module 11. For example, device substrate 13 can be disposed on second module substrate 112 of embedded module 11. Device substrate 13 can be coupled to embedded module 11. Device substrate 13 can be coupled to conductive structure 1121 of second module substrate 112. In some examples, device substrate 13 can be located inside device terminals 14. In some examples, after being seated on embedded module 11, device substrate 13 can be coupled to embedded module 11 by soldering or Ag sintering.

In some examples, device substrate 13 can comprise or be referred to as a direct bonded copper substrate, a direct plated copper substrate, a thermal dissipation substrate, a ceramic substrate, or AMB. In some examples, device substrate 13 can transfer or dissipate heat generated by embedded module 11 to a top portion of electronic device 10. In some examples, the height of device substrate 13 can range from about 650 μm to about 2000 μm. In some examples, the area (or footprint) of device substrate 13 can be smaller than the area (or footprint) of device substrate 12. Device substrate 13 can comprise inward metallic layer 131, outward metallic layer 132, and core layer 133.

Inward metallic layer 131 can comprise or be referred to as metallic planes, metallic paths, leads, terminals, pads, or traces. Inward metallic layer 131 can comprise a metal, such as, for example, aluminum, palladium, titanium, tungsten, titanium/tungsten, nickel, gold, or silver. In some examples, inward metallic layer comprises copper. Inward metallic layer 131 can be provided on the bottom side of core layer 133. In some examples, inward metallic layer 131 can be coupled to conductive structure 1121 (e.g., outward terminals 1121*o*) of second module substrate 112. In some examples, the thickness of inward metallic layer 131 can range from about 200 μm to about 800 μm.

In some examples, inward metallic layer 131 can be formed by covering the entire bottom side of core layer 133 and then etching or removing a portion of inward metallic layer 131 to form inward terminals 131*i* and traces 131*t* over the bottom side of core layer 133. Inward terminals 131*i* can be coupled to outward terminals 1121*o* of second module substrate 112. In some examples, inward terminals 131*i* can have a plating similar to plating 1121*p*. Traces 131*t* can extend to and contact the lateral sides of inward terminals 131*i*. In some examples, traces 131*t* can be located on dielectric structure 1122 of second module substrate 112 (e.g., traces 131*t* can be portions of inward metallic layer 131 that are not contacting conductive structure 1121 of second module substrate 112).

In some examples, outward metallic layer 132 can comprise or be referred to as metallic planes, metallic paths, leads, terminals, pads, or traces. Outward metallic layer 132 can comprise a metal such as, for example, aluminum, palladium, titanium, tungsten, titanium/tungsten, nickel, gold, or silver. In some examples, outward metallic layer 132 comprises copper. Outward metallic layer 132 can be provided on the top side of core layer 133. In some examples, outward metallic layer 132 can cover the entire top side of core layer 133. In some examples, outward metallic layer 132 can transfer or dissipate heat generated from embedded module 11 to a top portion of electronic device 10. In some examples, the thickness of outward metallic layer 132 can range from about 200 μm to about 800 μm.

In some examples, core layer 133 can comprise or be referred to as a ceramic, a thermal conductive material, or a dielectric. Core layer 133 can support inward metallic layer 131 and outward metallic layer 132. In some examples, core layer 133 can transfer heat generated from embedded module 11 to outward metallic layer 132. In some examples, the area (or footprint) of core layer 133 can be larger than the area (or footprint) of inward metallic layer 131 or outward metallic layer 132. In some examples, the thickness of core layer 133 can range from about 250 μm to about 1000 μm. In various examples, a portion of inward metallic layer 131 and a portion of outward metallic layer 132 can be coupled to each other by one or more conductive vias extending through core layer 133.

FIG. 2S shows a cross-sectional view of electronic device 10 at a later stage of manufacture. In the example shown in FIG. 2S, device encapsulant 15 can be provided. Device encapsulant 15 can encapsulate embedded module 11, device substrates 12 and 13, and device terminals 14. Portions of device terminals 14 can extend from or be exposed from device encapsulant 15. For example, device terminals 14 can protrude outward of device encapsulant 15. Outward metallic layer 122 of device substrate 12 and outward metallic layer 132 of device substrate 13 can be exposed from device encapsulant 15. In some examples, the top side of device encapsulant 15 can be coplanar with outward metallic layer 132, and the bottom side of device encapsulant 15 can be coplanar with outward metallic layer 122.

In some examples, device encapsulant 15 can comprise or be referred to as a resin, a polymer with fillers, a mold compound, a protective material, or a mold material. In some examples, device encapsulant 15 can be provided by a film assisted molding process, a compression molding process, or a transfer molding process. In some examples, the height (or thickness) of device encapsulant 15 can range from about 1650 μm to about 4800 μm. The height of device encapsulant 15 can be defined as the height of electronic device 10. In some examples, device encapsulant 15 can protect embedded module 11 from exposure to external factors or environments.

Figure 3:
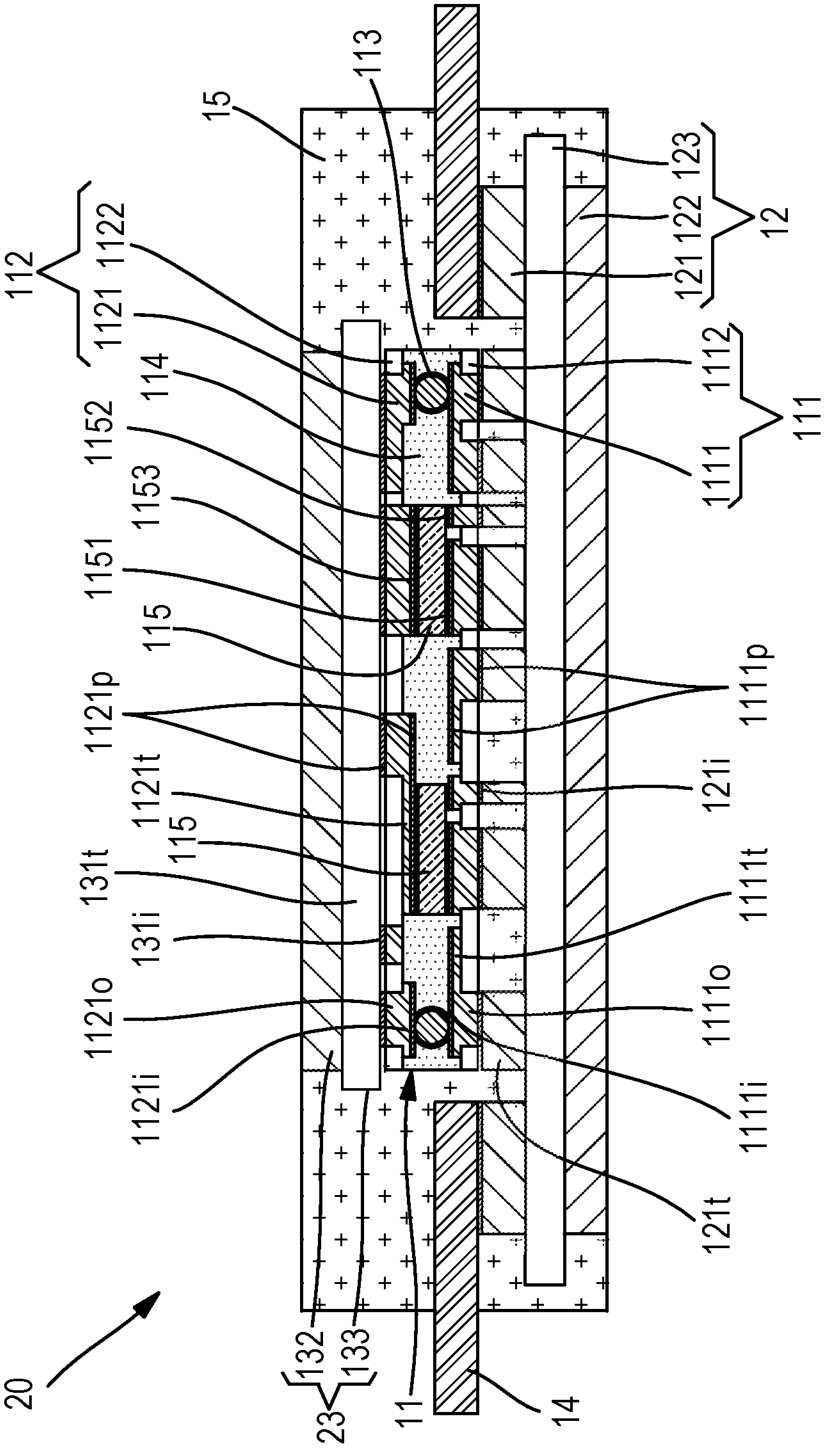
FIG. 3 shows a cross-sectional view of an example electronic device.

FIG. 3 shows a cross-sectional view of an example electronic device 20. In the example shown in FIG. 3, electronic device 20 can comprise embedded module 11, device substrate 12, device substrate 23, device terminals 14, and device encapsulant 15. In accordance with various examples, electronic device 20 can comprise similar elements, features, materials, or formation processes to those of electronic device 10, as previously described.

Device substrate 23 can comprise outward metallic layer 132 and core layer 133. Core layer 133 can be coupled to or can contact second module substrate 112 of embedded module 11. In some examples, core layer 133 can be coupled to conductive structure 1121 (e.g., outward terminals 1121*o*) of second module substrate 112. In some examples, core layer 133 can contact plating 1121*p*. Core layer 133 can transfer heat generated from embedded module 11 to outward metallic layer 132. In some examples, the thickness of device substrate 23 can range from about 450 μm to about 1500 μm. In some examples, device substrate 23 can comprise elements, features, materials, or formation processes similar to, or the same as, those of device substrate 13, as previously described.

Figure 4:
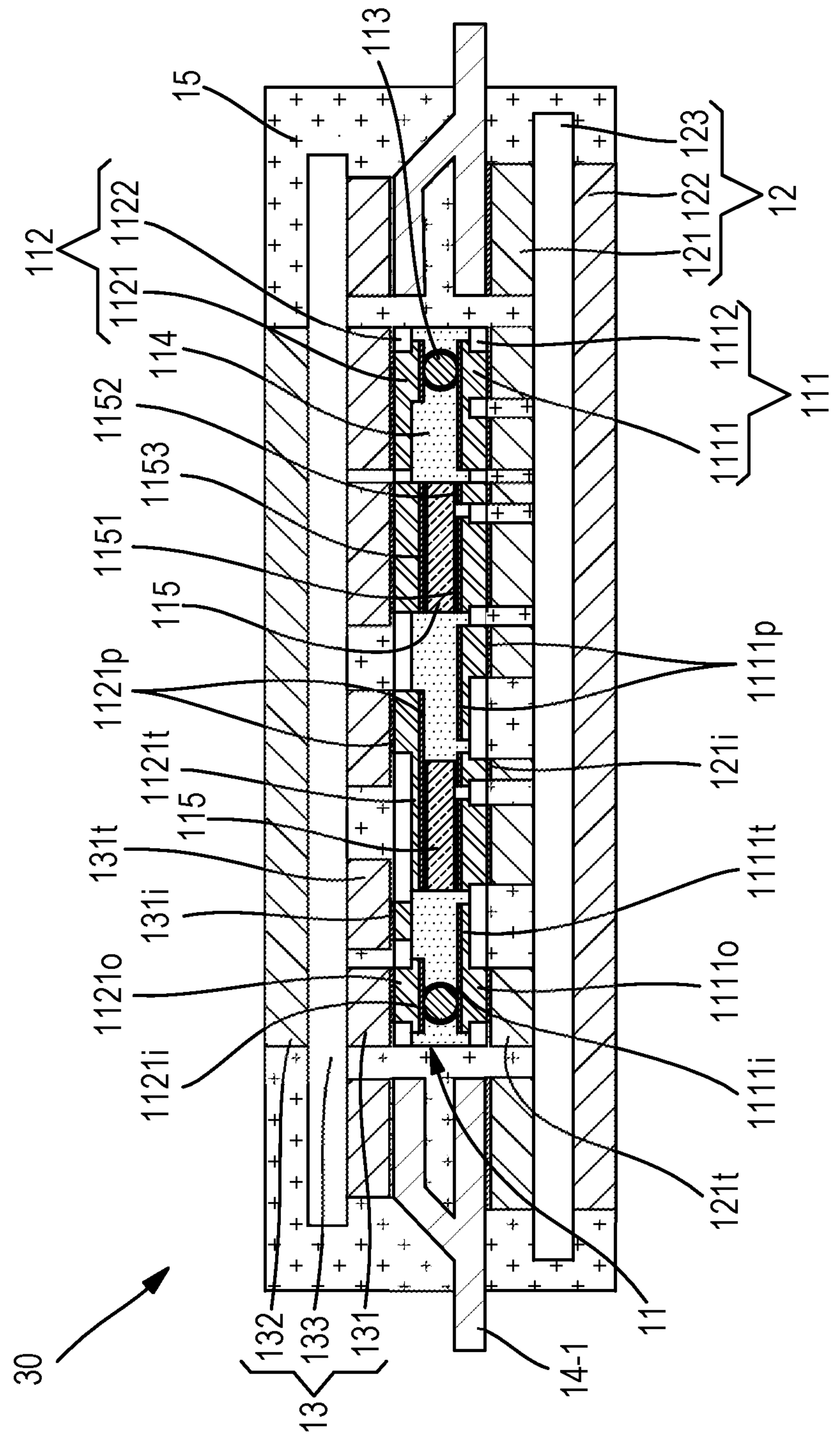
FIG. 4 shows a cross-sectional view of an example electronic device.

FIG. 4 shows a cross-sectional view of an example electronic device 30. In the example shown in FIG. 4, electronic device 30 can comprise embedded module 11, device substrates 12 and 13, device terminals 14-1, and device encapsulant 15. In accordance with various examples, elements, features, materials, or formation processes of electronic device 30 can be similar to, or the same as, those of electronic device 10, as previously described.

Device substrate 13 can extend (or be enlarged) outward of embedded module 11 to contact or cover portions of device terminals 14-1. In some examples, the area (or footprint) of device substrate 13 can be equal, or approximately equal, to the area (or footprint) of device substrate 12. Device substrate 13 can be coupled to embedded module 11 and device terminals 14-1. In some examples, device substrate 13 can couple embedded module 11 to device terminals 14-1.

Inward metallic layer 131 can couple embedded module 11 to device terminals 14-1. In some examples, a portion of inward metallic layer 131, which can be located proximate an edge or perimeter of device substrate 13, can be coupled to device terminals 14-1. Inward metallic layer 131 can transfer signals from embedded module 11 to device terminals 14-1 or transfer signals received by device terminals 14-1 to embedded module 11.

Device terminals 14-1 can be coupled to device substrate 12 and device substrate 13. In some examples, device terminals 14-1 can be spaced apart from each other and can be coupled to the edges of device substrates 12 and 13. In some examples, device terminals 14-1 may comprise a terminal coupled to device substrate 12 and a terminal coupled to device substrate 13. In some examples, the terminal coupled to device substrate 12 may be planar, and the terminal coupled to device substrate 13 may be bent, or raised, with respect to the terminal coupled to device substrate 12. In some examples, the upper side of the terminal coupled to device substrate 13 can be coplanar with the top side of embedded module 11. Device terminals 14-1, may include a terminal protruding outward of device encapsulant 15. In some examples, the terminal protruding outward of device encapsulant 15 can be planar. In some examples, device terminals 14-1 can receive signals from embedded module 11 through device substrate 12 or device substrate 13. In some examples, elements, features, materials, or formation processes of device terminals 14-1 can be similar to, or the same as, those of device terminals 14, as previously described.

Figure 5:
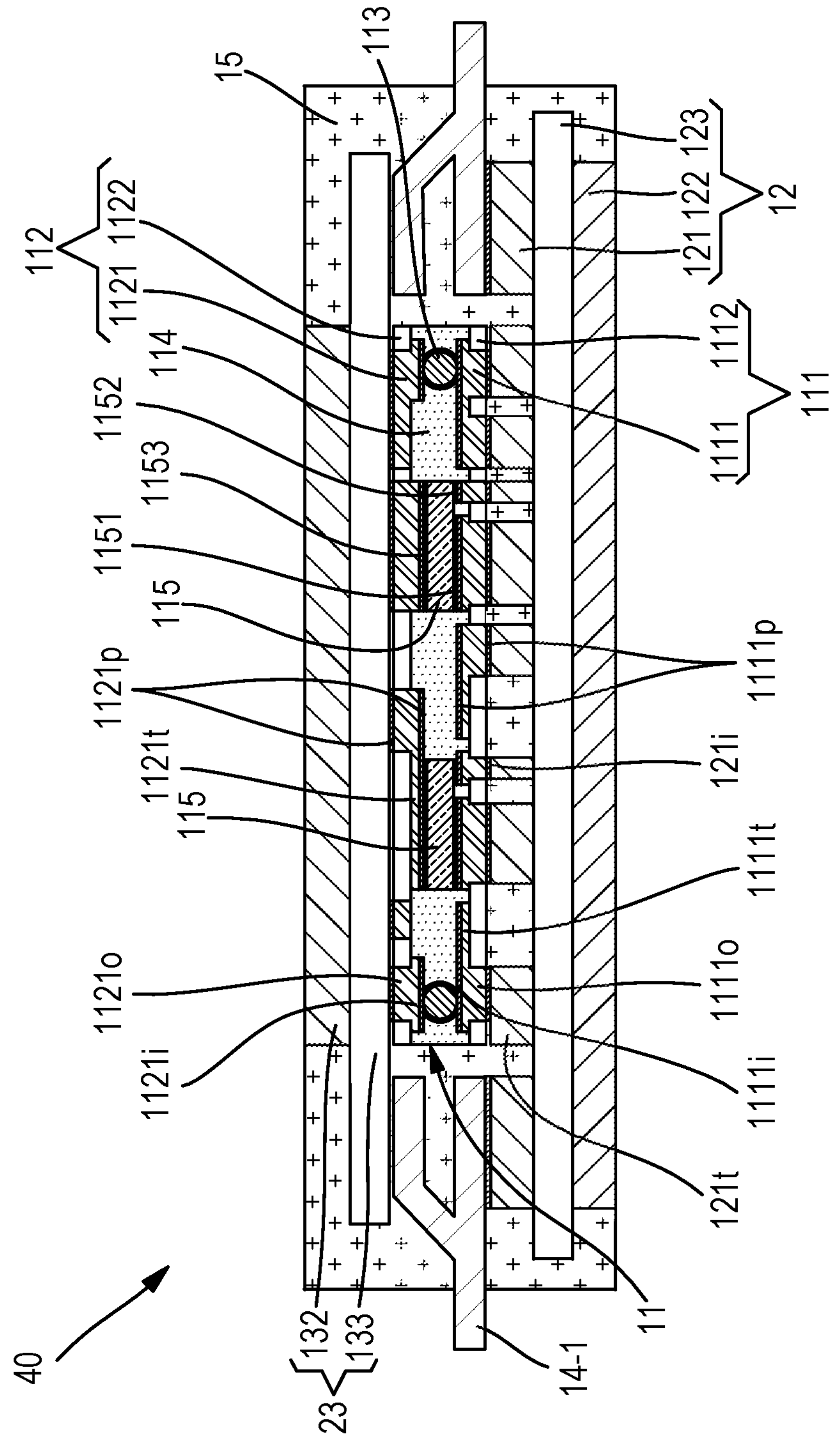
FIG. 5 shows a cross-sectional view of an example electronic device.

FIG. 5 shows a cross-sectional view of an example electronic device 40. In the example shown in FIG. 5, electronic device 40 can comprise embedded module 11, device substrates 12 and 23, device terminals 14-1, and device encapsulant 15. In some examples, elements, features, materials, or formation processes of electronic device 40 can be similar to, or the same as, those of electronic device 10, electronic device 20, or electronic device 30, as previously described.

Device substrate 23 can extend (or be enlarged) outward of embedded module 11 to contact or cover portions of device terminals 14-1. Device substrate 23 can comprise outward metallic layer 132 and core layer 133. Core layer 133 can contact second module substrate 112 of embedded module 11 and device terminals 14-1. In some examples, core layer 133 can be coupled to conductive structure 1121 (e.g., to outward terminals 1121*o*) of second module substrate 112 and to device terminals 14-1.

Figure 6:
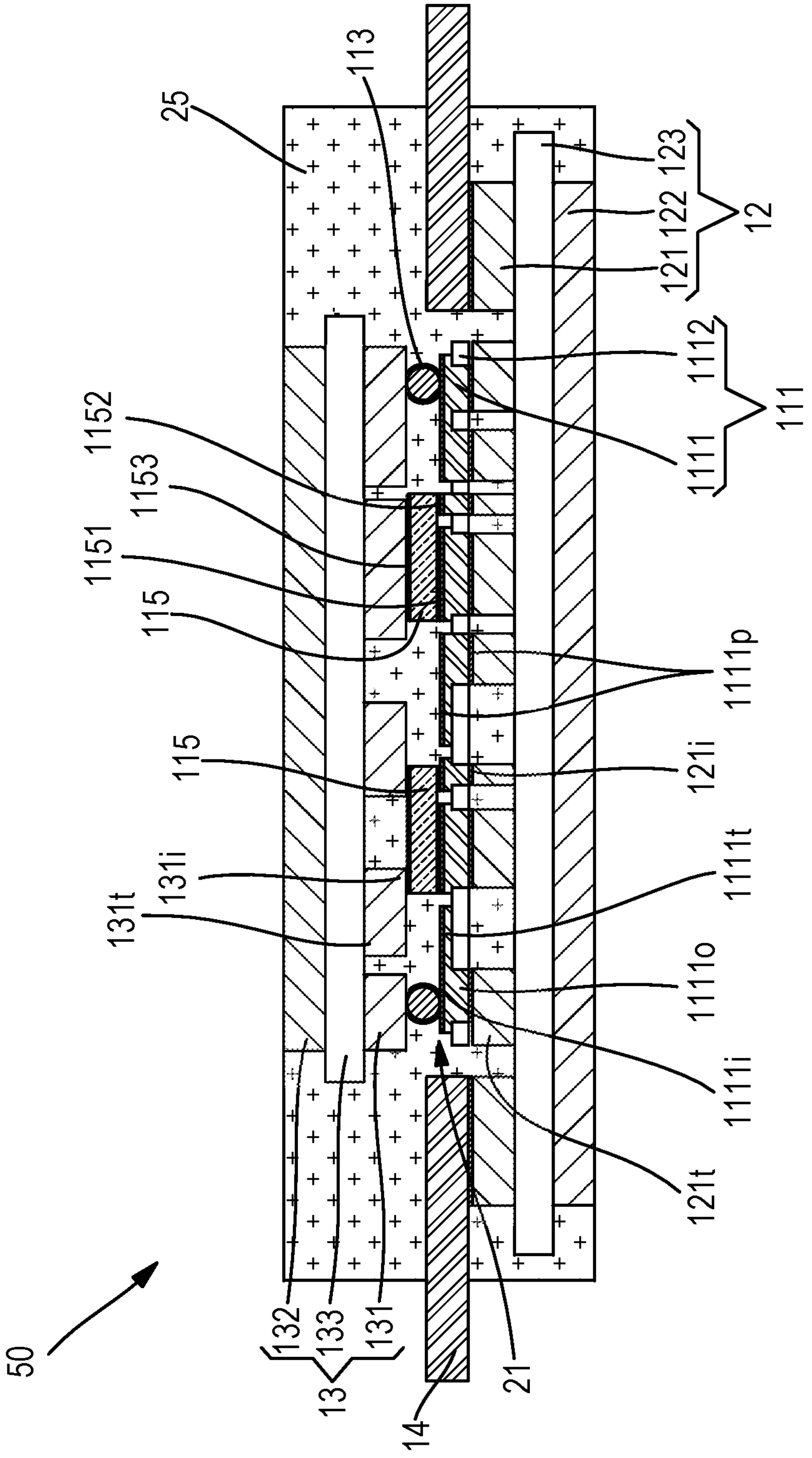
FIG. 6 shows a cross-sectional view of an example electronic device.

FIG. 6 shows a cross-sectional view of an example electronic device 50. In the example shown in FIG. 6, electronic device 50 can comprise embedded module 21, device substrates 12 and 13, device terminals 14, and device encapsulant 25. In some examples, elements, features, materials, or formation processes of electronic device 50 can be similar to, or the same as, those of electronic device 10, as previously described.

Embedded module 21 can comprise first module substrate 111, module interconnects 113, and module component(s) 115.

FIGS. 7A to 7D show cross-sectional views of an example method for manufacturing an example electronic device 50.

Figure 7A:
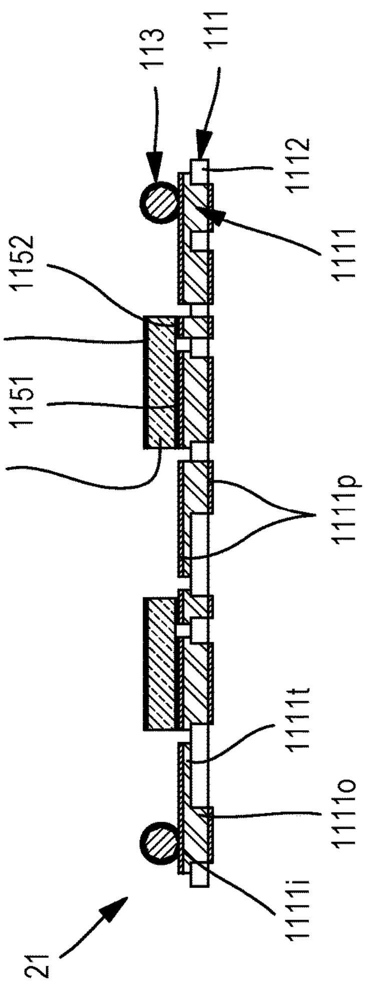
FIGS. 7A, 7B, 7C, and 7D show cross-sectional views of an example method for manufacturing an example electronic device.

FIG. 7A shows a cross-sectional view of electronic device 50 at an early stage of manufacture. In the example shown in FIG. 7A, the steps described with respect to FIGS. 2A to 2E can be followed, and then module components 115 and module interconnects 113 can be provided on first module substrate 111.

In the example shown in FIG. 7A, module interconnects 113 can be provided on first module substrate 111. Module interconnects 113 can be provided outside or laterally around module components 115. Module interconnects 113 can be coupled to inward terminals 1111*i*. In some examples, module components 115 and module interconnects 113 can be attached to plating 1111*p* of inward terminals 1111*i* through an interface material. For example, an interface material can be provided to plating 1111*p*, and module component 115 and module interconnect 113 can be seated on the interface material to allow module component 115 and module interconnect 113 to be coupled to plating 1111*p* by a reflow process. In some examples, first module substrate 111, module interconnects 113, and module components 115 can be referred to as embedded module 21. In some examples, embedded module 21 can be devoid of encapsulant. For example, module components 115 and module interconnects 113 disposed on first module substrate 111 can be exposed (or nonencapsulated). In accordance with various examples, elements, features, materials, or formation processes of embedded module 21 can be similar to, or the same as, those of embedded module 11, as previously described.

Figure 7B:
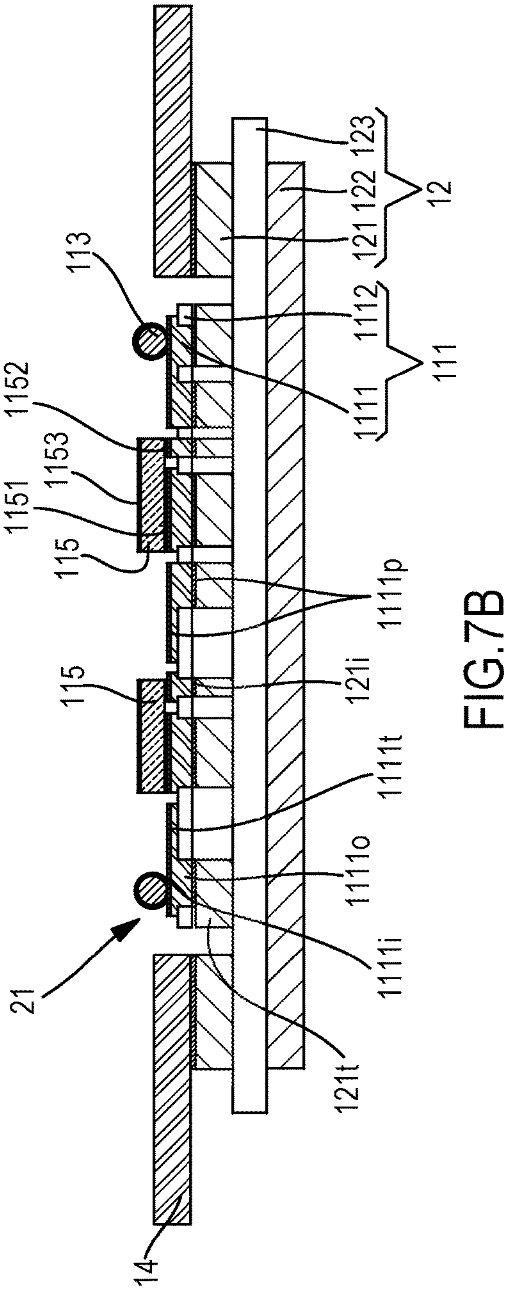

FIG. 7B shows a cross-sectional view of electronic device 50 at a later stage of manufacture. In the example shown in FIG. 7B, device terminals 14 and embedded module 21 can be provided on device substrate 12. In some examples, after device terminals 14 are coupled to device substrate 12, embedded module 21 can be disposed on device substrate 12.

Figure 7C:
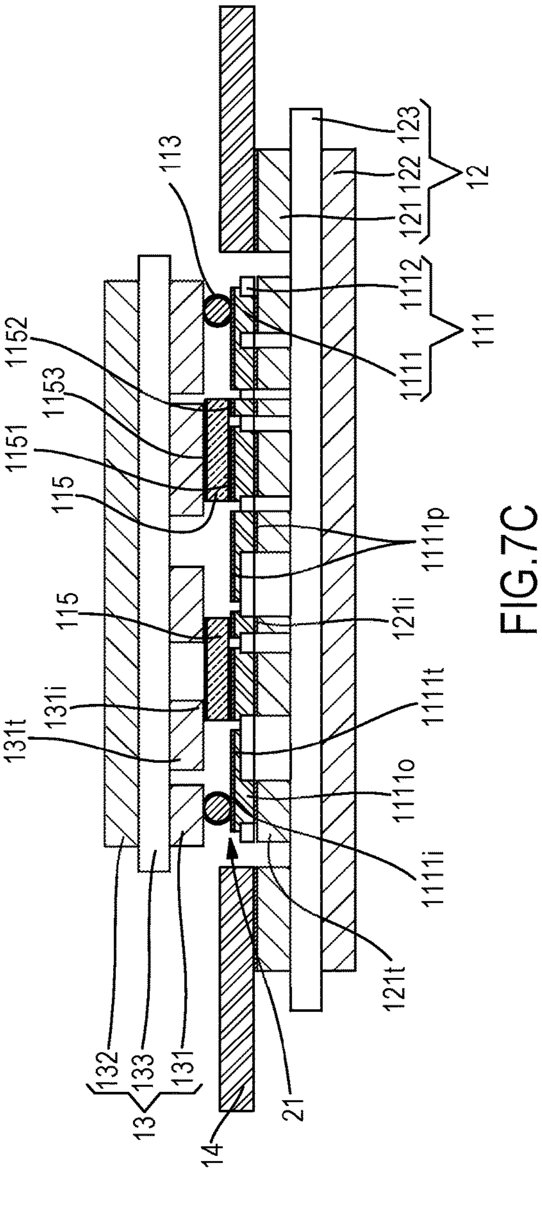

FIG. 7C shows a cross-sectional view of electronic device 50 at a later stage of manufacture. In the example shown in FIG. 7C, device substrate 13 can be provided over embedded module 21. Device substrate 13 can be coupled to module components 115 and module interconnects 113. For example, inward metallic layer 131 of device substrate 13 can be coupled to module interconnects 113 or component terminal 1153 of module component 115. In some examples, after being disposed on embedded module 21, device substrate 13 can be coupled to embedded module 21 by soldering (e.g., a solder reflow process) or Ag sintering.

Figure 7D:
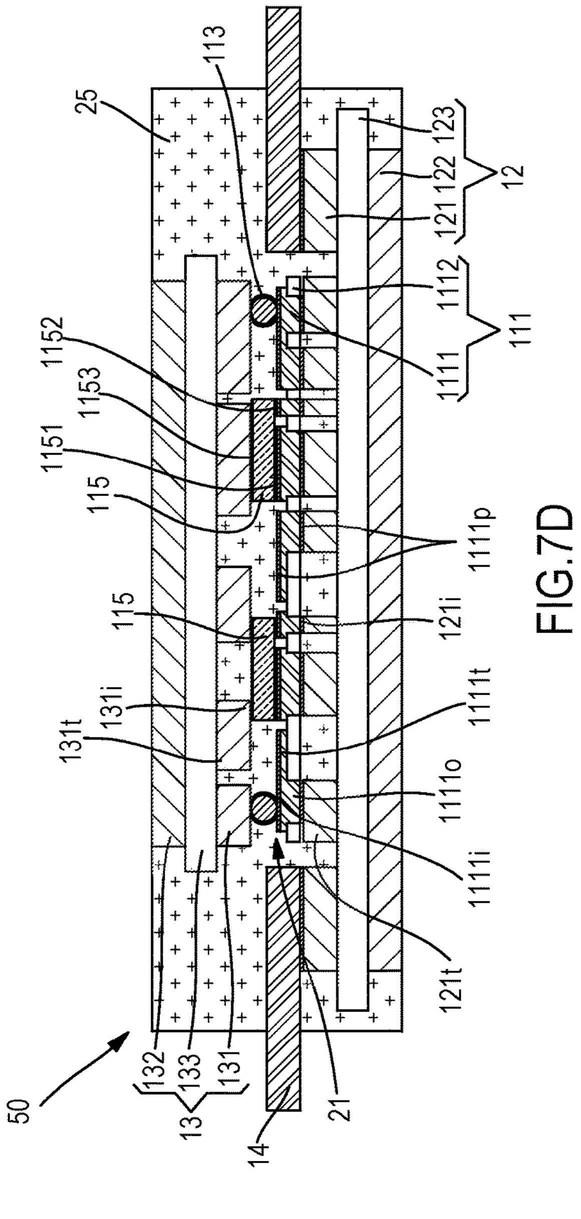

FIG. 7D shows a cross-sectional view of electronic device 50 at a later stage of manufacture. In the example shown in FIG. 7D, device encapsulant 25 can be provided. Device encapsulant 25 can encapsulate embedded module 21, device substrates 12 and 13, and device terminals 14. In some examples, device encapsulant 25 can encapsulate first module substrate 111, module interconnects 113, and module components 115. Device encapsulant 25 can contact inward terminals 1111*i* and traces 1111*t* of first module substrate 111, module interconnects 113, and module components 115. A portion of device terminals 14 can be exposed from and extend past device encapsulant 25. In some examples, elements, features, materials, or formation processes of device encapsulant 25 can be similar to, or the same as, those of device encapsulant 15, as previously described.

Figure 8:
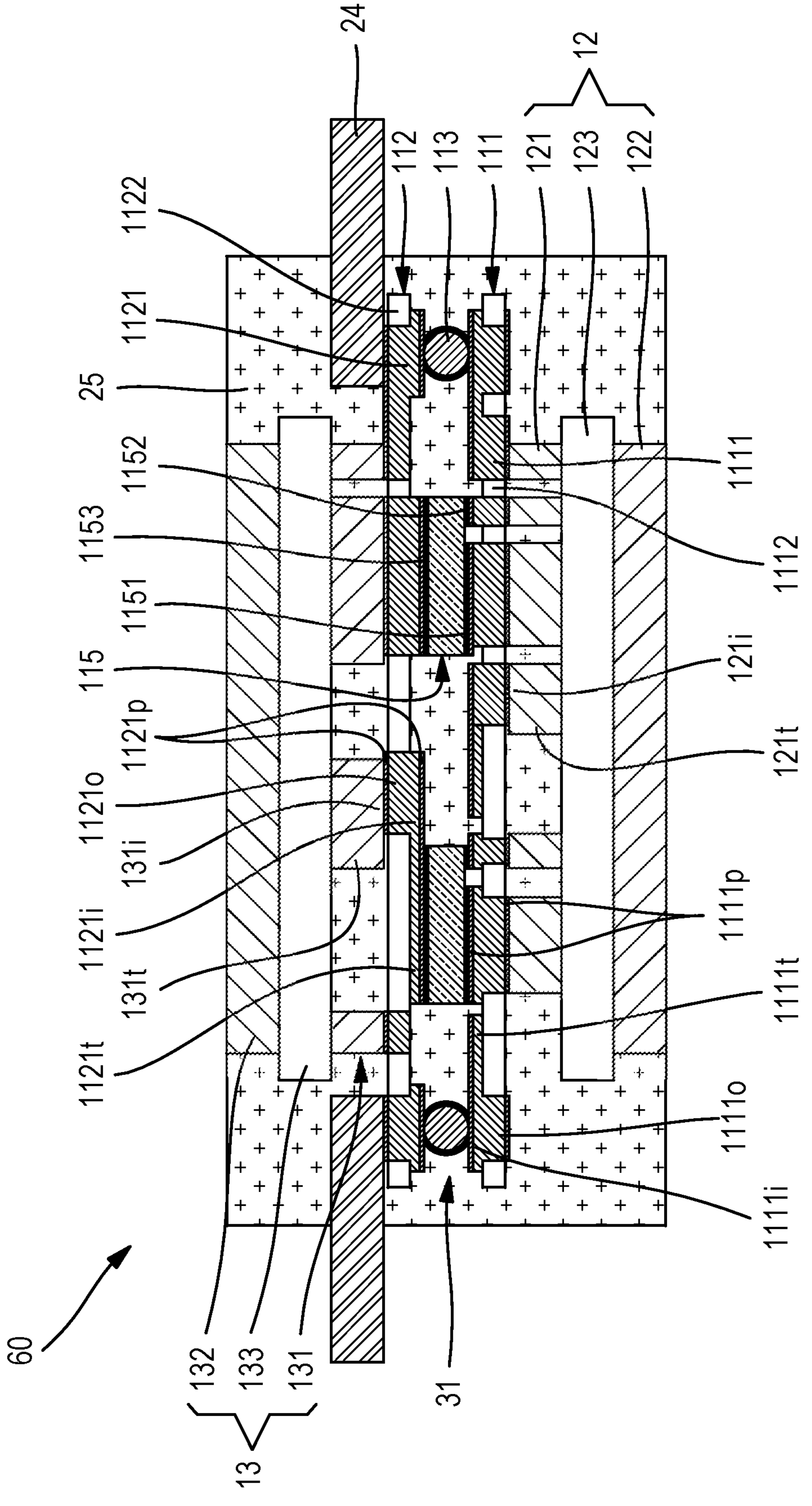
FIG. 8 shows a cross-sectional view of an example electronic device.

FIG. 8 shows a cross-sectional view of an example electronic device 60. In the example shown in FIG. 8, electronic device 60 can comprise embedded module 31, device substrates 12 and 13, device terminals 24, and device encapsulant 25. In some examples, electronic device 60 can comprise elements, features, materials, or formation processes similar to those of electronic device 10 or electronic device 50, as previously described.

Embedded module 31 can comprise first module substrate 111, second module substrate 112, module interconnects 113, and module components 115.

FIGS. 9A to 9E show cross-sectional views of an example method for manufacturing an example electronic device 60.

Figure 9A:
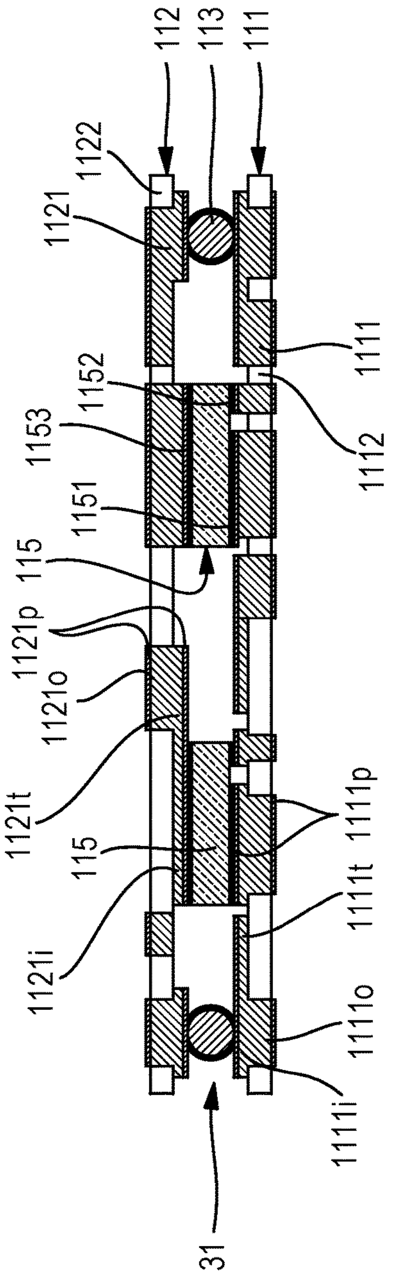
FIGS. 9A, 9B, 9C, 9D, and 9E show cross-sectional views of an example method for manufacturing an example electronic device.

FIG. 9A shows a cross-sectional view of electronic device 60 at an early stage of manufacture. In the example shown in FIG. 9A, the steps described with respect to FIGS. 2A to 2L can be followed, and then second module substrate 112 having module interconnects 113 coupled thereto can be provided over first module substrate 111 and module components 115. In some examples, first module substrate 111, second module substrate 112, module interconnects 113, and module components 115 can be referred to as embedded module 31. In some examples, elements, features, materials, or formation processes of embedded module 31 can be similar to, or the same as, those of embedded module 11, as previously described.

Figure 9B:
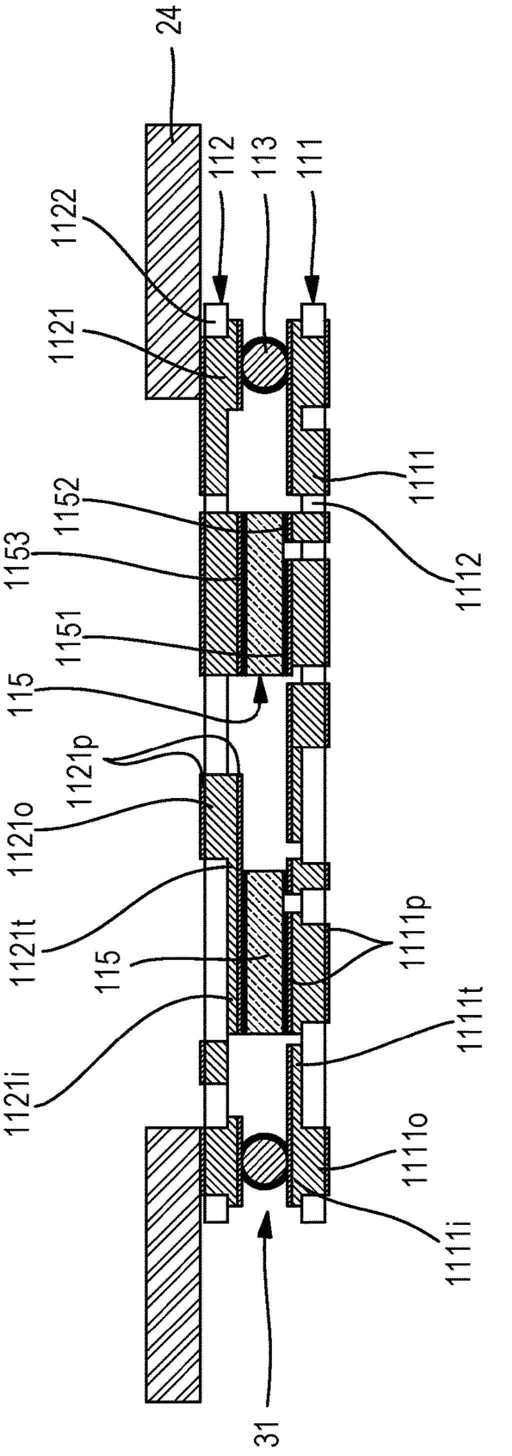

FIG. 9B shows a cross-sectional view of electronic device 60 at a later stage of manufacture. In the example shown in FIG. 9B, device terminals 24 can be provided on embedded module 31. In some examples, device terminals 24 can be spaced apart from each other and can be provided on the edge of embedded module 31. Device terminals 24 can be coupled to second module substrate 112 of embedded module 31. In some examples, device terminals 24 can be coupled to conductive structure 1121 (e.g., to outward terminals 1121*o* of conductive structure 1121). Device terminals 24 can protrude outward of embedded module 31. In some examples, elements, features, materials, or formation processes of device terminals 24 can be similar to, or the same as, those of device terminals 14, as previously described.

Figure 9C:
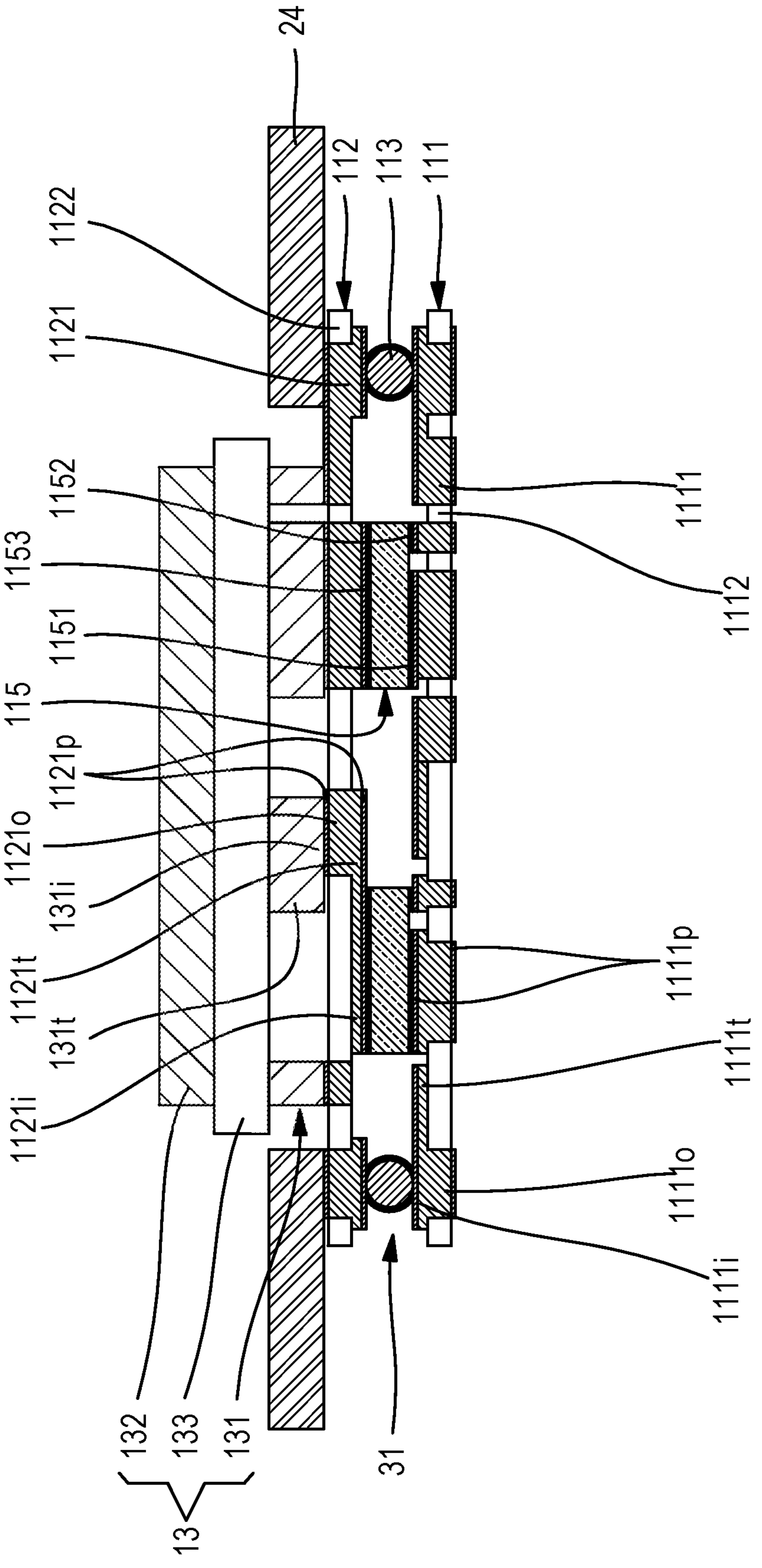

FIG. 9C shows a cross-sectional view of electronic device 60 at a later stage of manufacture. In the example shown in FIG. 9C, device substrate 13 can be provided over embedded module 31. The area (or footprint) of device substrate 13 can be smaller than the area (or footprint) of embedded module 31. Device substrate 13 can be located inside device terminals 24. Device substrate 13 can be spaced apart from device terminals 24. Device substrate 13 can be coupled to conductive structure 1121 of second module substrate 112 (e.g., to outward terminals 1121*o* of conductive structure 1121).

Figure 9D:
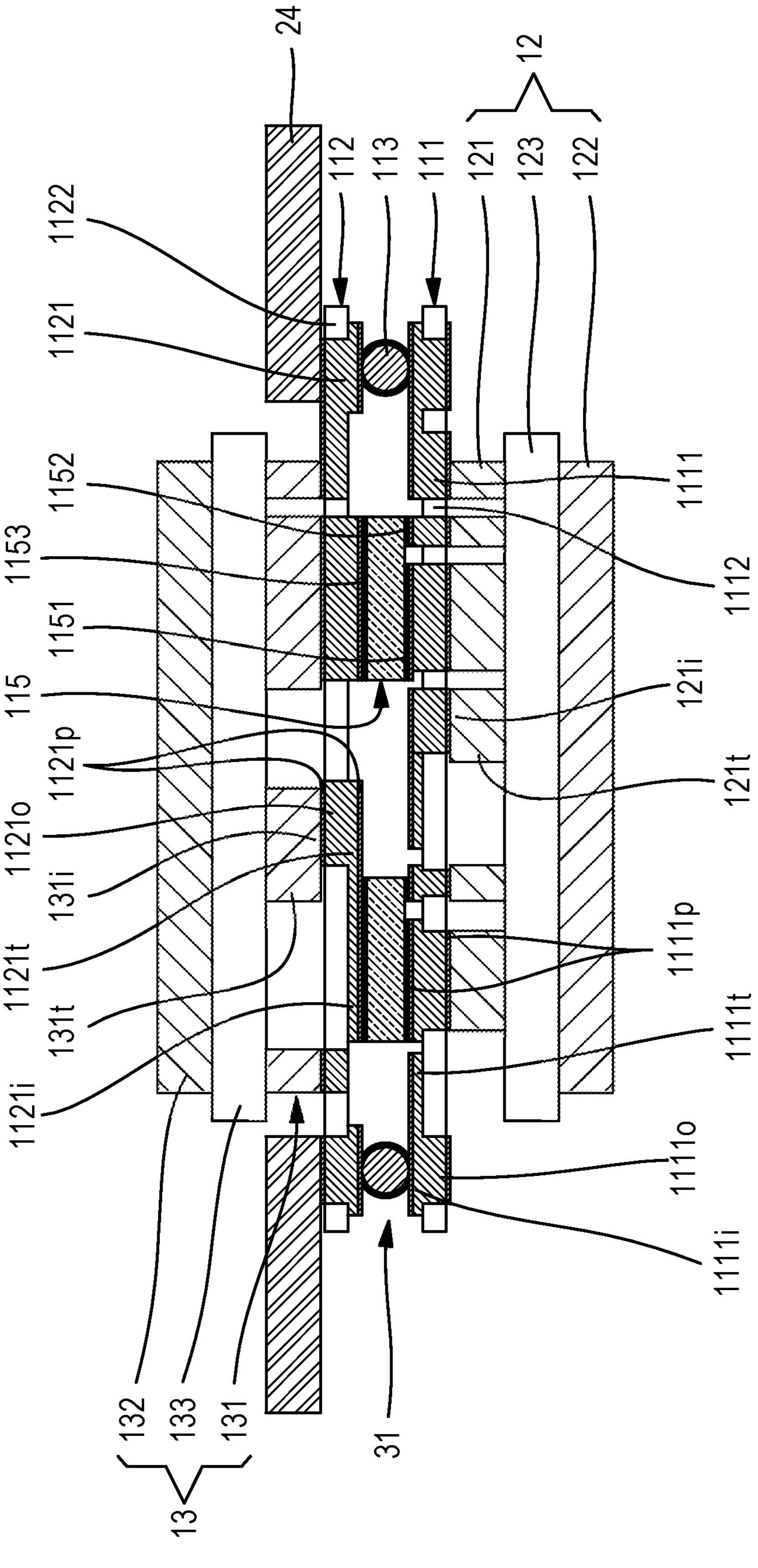

FIG. 9D shows a cross-sectional view of electronic device 60 at a later stage of manufacture. In the example shown in FIG. 9D, device substrate 12 can be provided under embedded module 31. Stated differently, embedded module 31, device substrate 13, and device terminals 24 can be disposed over device substrate 12. The area (or footprint) of device substrate 12 can be smaller than the area (or footprint) of embedded module 31. The area (or footprint) of device substrate 12 can be equal, or approximately equal, to the area (or footprint) of device substrate 13. Device substrate 12 can be coupled to conductive structure 1111 of first module substrate 111 (e.g., to outward terminals 1111*o* of conductive structure 1111).

Figure 9E:
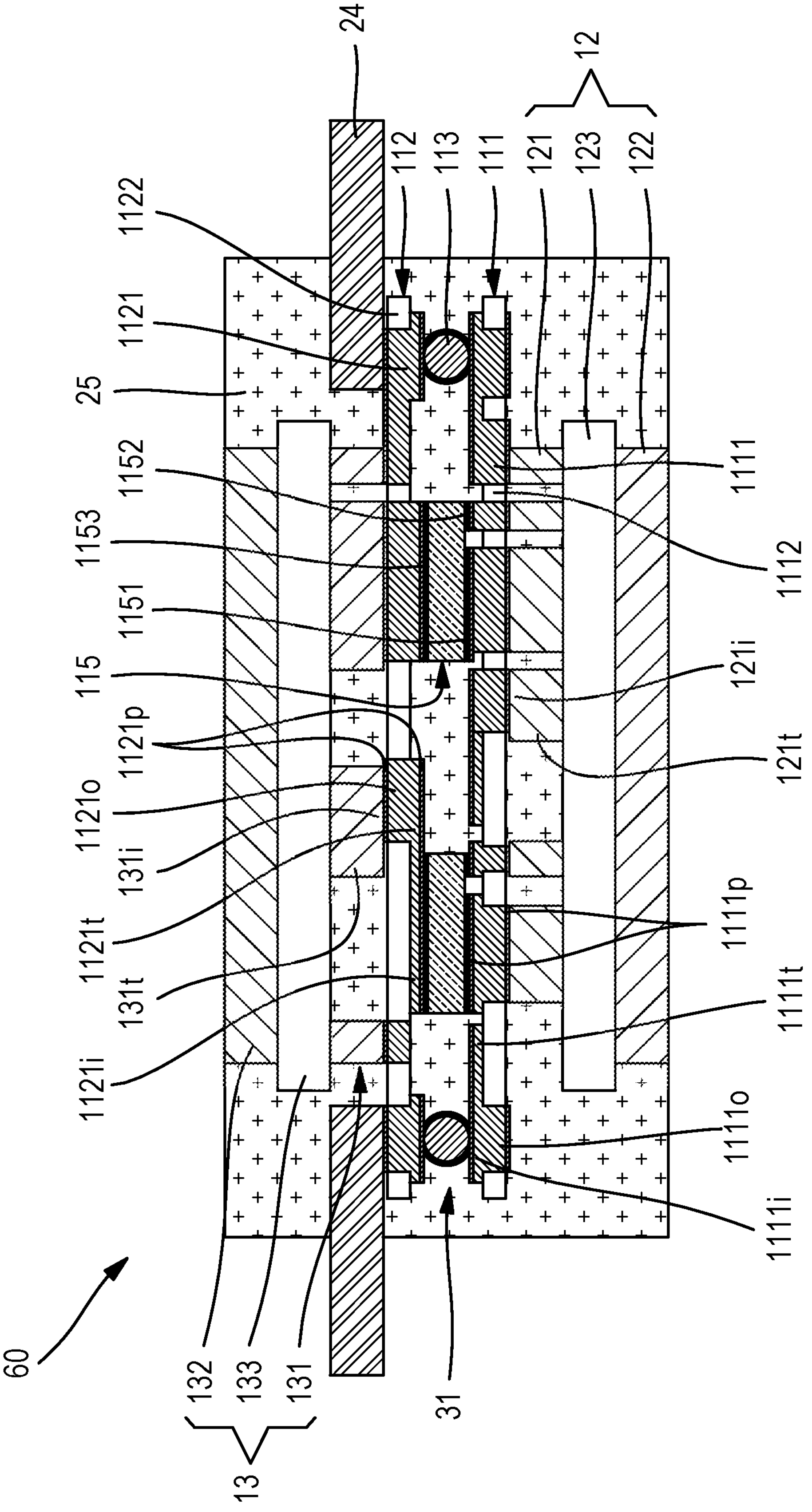

FIG. 9E shows a cross-sectional view of electronic device 60 at a later stage of manufacture. In the example shown in FIG. 9E, device encapsulant 25 can be provided. Device encapsulant 25 can encapsulate embedded module 31, device substrates 12 and 13, and device terminals 24. In some examples, device encapsulant 25 can encapsulate first module substrate 111, second module substrate 112, module interconnects 113, and module components 115. Device encapsulant 25 can contact inward terminals 1111*i* and traces 1111*t* of first module substrate 111, inward terminals 1121*i* and traces 1121*t* of second module substrate 112, module interconnects 113, and module components 115. A portion of device terminals 24 can be exposed from and extend past device encapsulant 25. In some examples, outward metallic layer 122 or outward metallic layer 132 can be exposed from device encapsulant 25.

Figure 10:
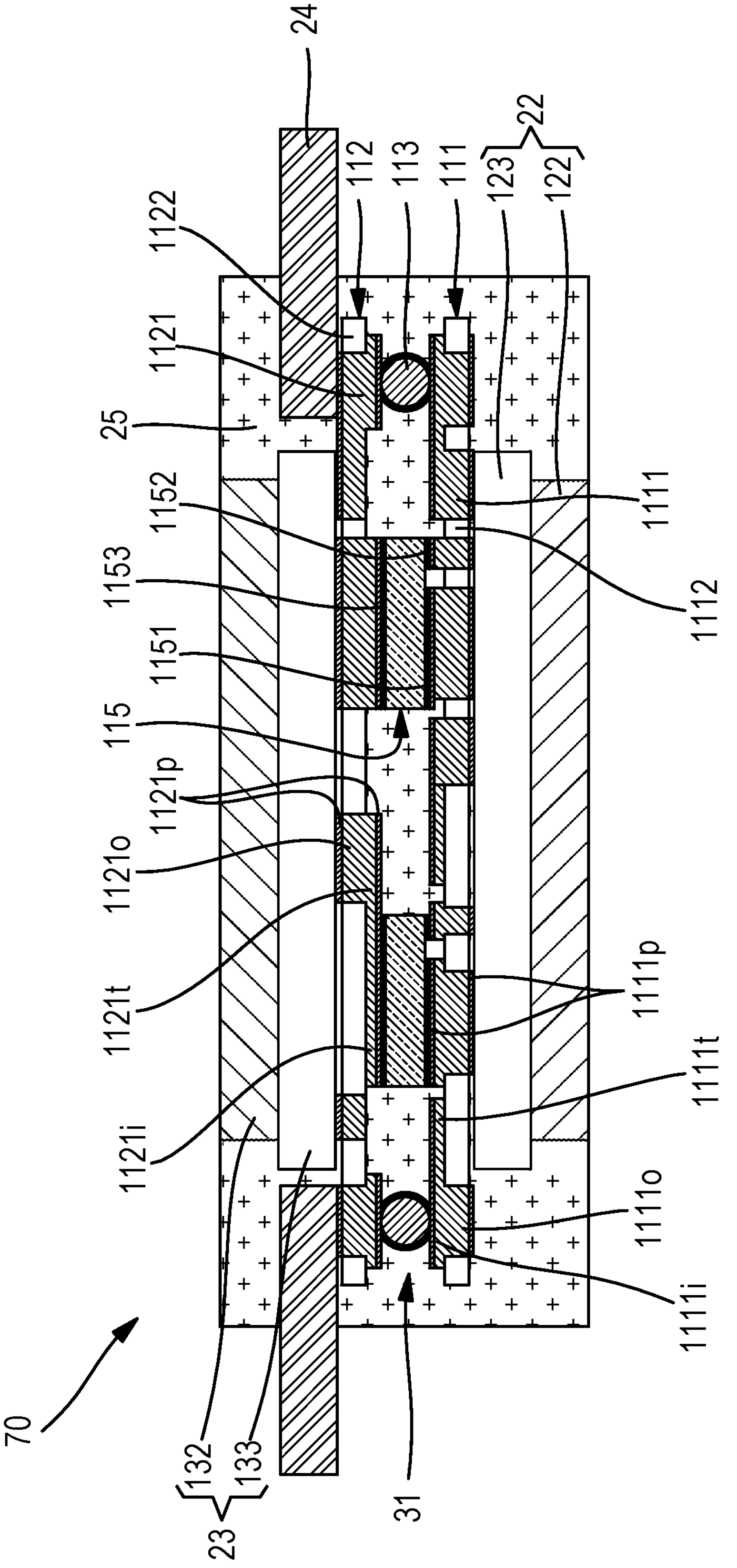
FIG. 10 shows a cross-sectional view of an example electronic device.

FIG. 10 shows a cross-sectional view of an example electronic device 70. In the example shown in FIG. 10, electronic device 70 can comprise embedded module 31, device substrates 22 and 23, device terminals 24, and device encapsulant 25. In some examples, elements, features, materials, or formation processes of electronic device 70 can be similar to, or the same as, those of electronic device 20 or electronic device 60, as previously described.

Device substrate 22 can comprise outward metallic layer 122 and core layer 123. Core layer 123 can contact first module substrate 111 of embedded module 31. In some examples, core layer 123 can be coupled to conductive structure 1111 (e.g., to outward terminals 1111*o*) of first module substrate 111. In some examples, core layer 123 can contact plating 1111*p*. Core layer 123 can transfer heat generated from embedded module 31 to outward metallic layer 132. In some examples, the thickness of device substrate 22 can range from about 450 μm to about 1500 μm. In some examples, elements, features, materials, or formation processes of device substrate 22 can be similar to, or the same as, those of device substrate 12, as previously described.

Device substrate 23 can comprise outward metallic layer 132 and core layer 133. Core layer 133 of device substrate 23 can contact second module substrate 112 of embedded module 31. In some examples, core layer 133 can be coupled to conductive structure 1121 (e.g., to outward terminals 1121*o*) of second module substrate 112. In some examples, core layer 133 can contact plating 1121*p*. Core layer 133 can transfer heat generated from embedded module 31 to outward metallic layer 132. In some examples, elements, features, materials, or formation processes of device substrate 23 can be similar to, or the same as, those of device substrate 13, as previously described.

Figure 11:
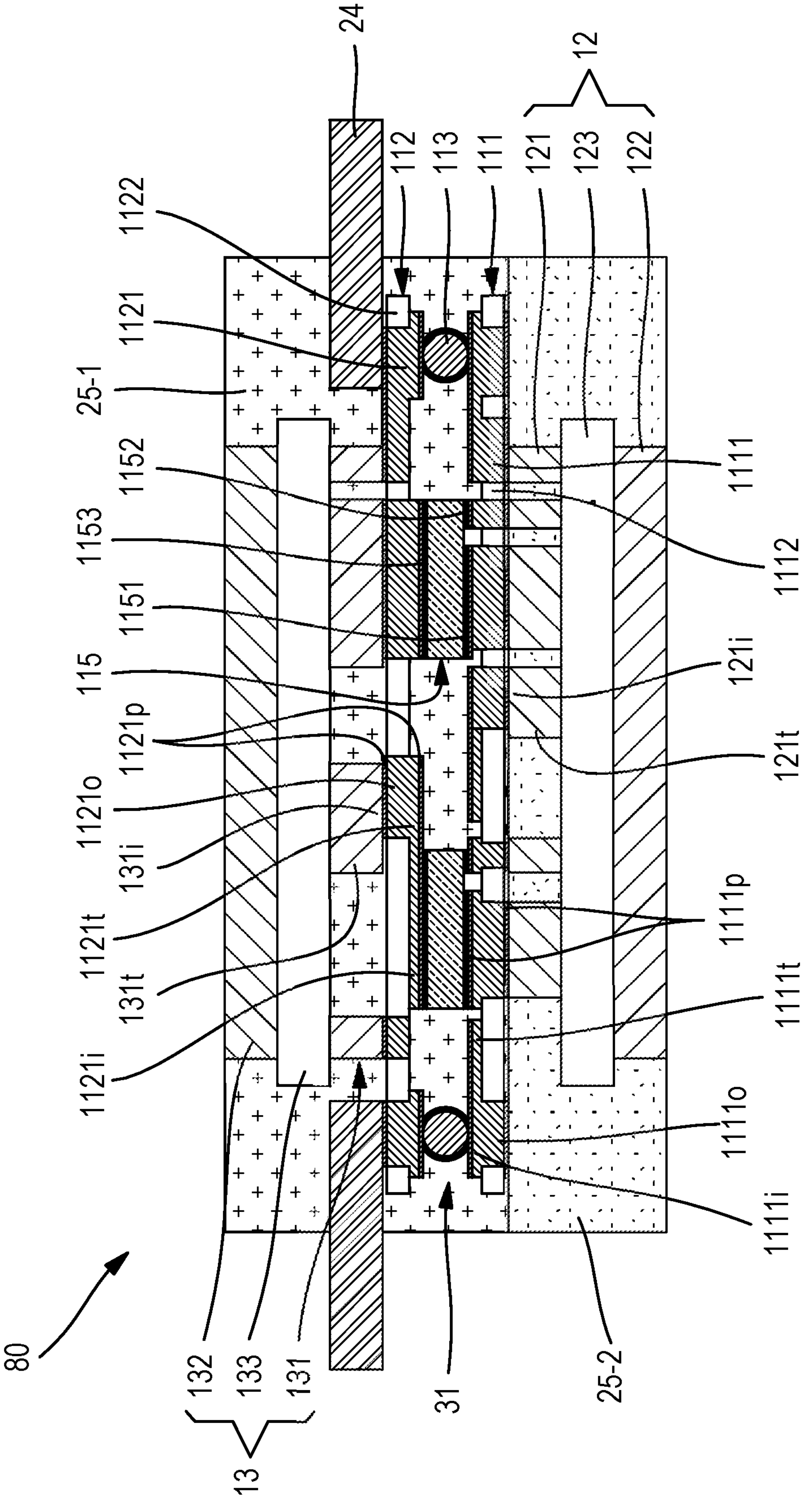
FIG. 11 shows a cross-sectional view of an example electronic device.

FIG. 11 shows a cross-sectional view of an example electronic device 80. In the example shown in FIG. 11, electronic device 80 can comprise embedded module 31, device substrates 12 and 13, device terminals 24, device encapsulant 25-1, and device encapsulant 25-2. In some examples, elements, features, materials, or formation processes of electronic device 80 can be similar to, or the same as, those of electronic device 60, as previously described.

Device encapsulant 25-1 can encapsulate embedded module 31, device substrate 13, and device terminals 24. Device terminals 24 can protrude outward of device encapsulant 25-1. Device encapsulant 25-2 can encapsulate device substrate 12. The top side of device encapsulant 25-1 can be coplanar with the top side of device substrate 13. The bottom side of device encapsulant 25-2 can be coplanar with bottom side of device substrate 12. The bottom side of device encapsulant 25-1 can contact the top side of device encapsulant 25-2. In some examples, elements, features, materials, or formation processes of device encapsulants 25-1 and 25-2 can be similar to, or the same as, those of device encapsulant 25, as previously described. FIG. 11 illustrates an example where device encapsulant 25-1 encapsulates embedded module 31 and device substrate 13 with first module substrate 111 exposed from device encapsulant 25-1. Also, second device encapsulant 25-2 can cover the portion of first module substrate 111 exposed from device encapsulant 25-1, as illustrated in FIG. 11.

Figure 12:
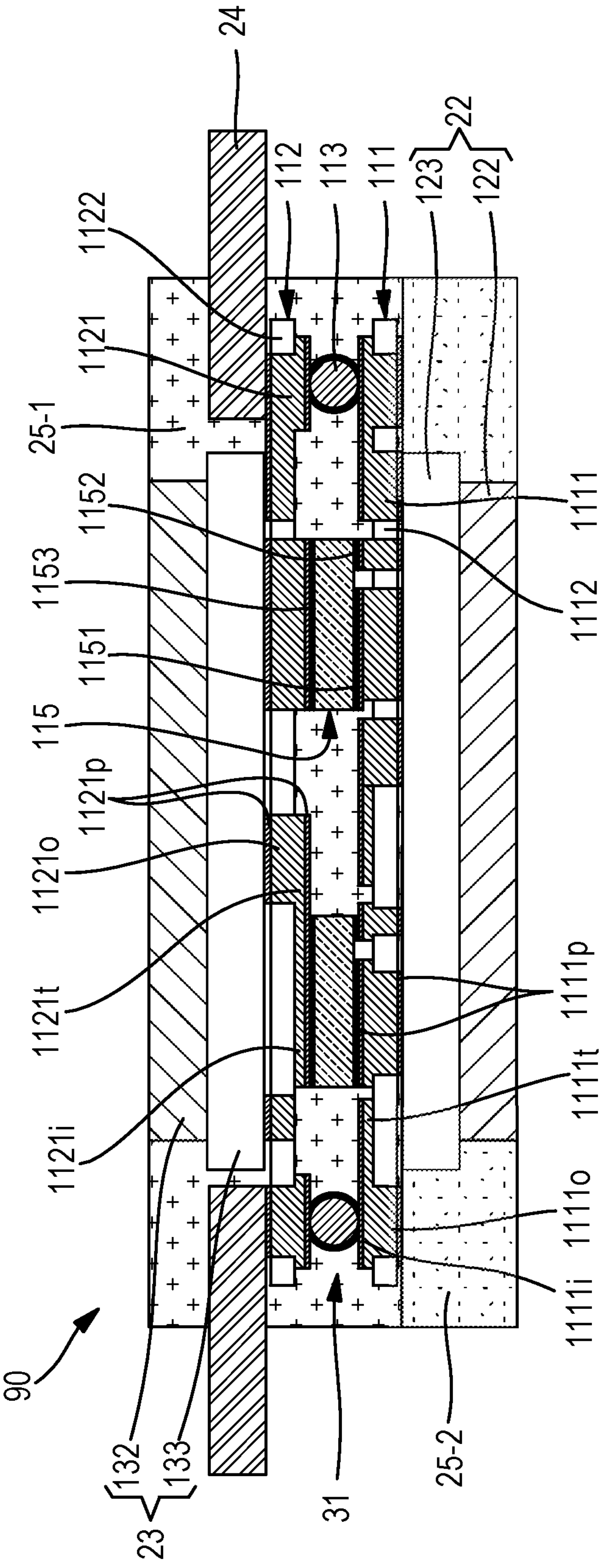
FIG. 12 shows a cross-sectional view of an example electronic device.

FIG. 12 shows a cross-sectional view of an example electronic device 90. In the example shown in FIG. 12, electronic device 90 can comprise embedded module 31, device substrates 22 and 23, device terminals 24, and device encapsulants 25-1 and 25-2. In some examples, elements, features, materials, or formation processes of electronic device 90 can be similar to, or the same as, those of electronic device 20, electronic device 60, electronic device 70, or electronic device 80, as previously described.

Device encapsulant 25-1 can encapsulate embedded module 31, device substrate 23, and device terminals 24. Device encapsulant 25-2 can encapsulate device substrate 22. The top side of device encapsulant 25-1 can be coplanar with the top side of device substrate 23. The bottom side of device encapsulant 25-2 can be coplanar with the bottom side of device substrate 22.

Figure 13:
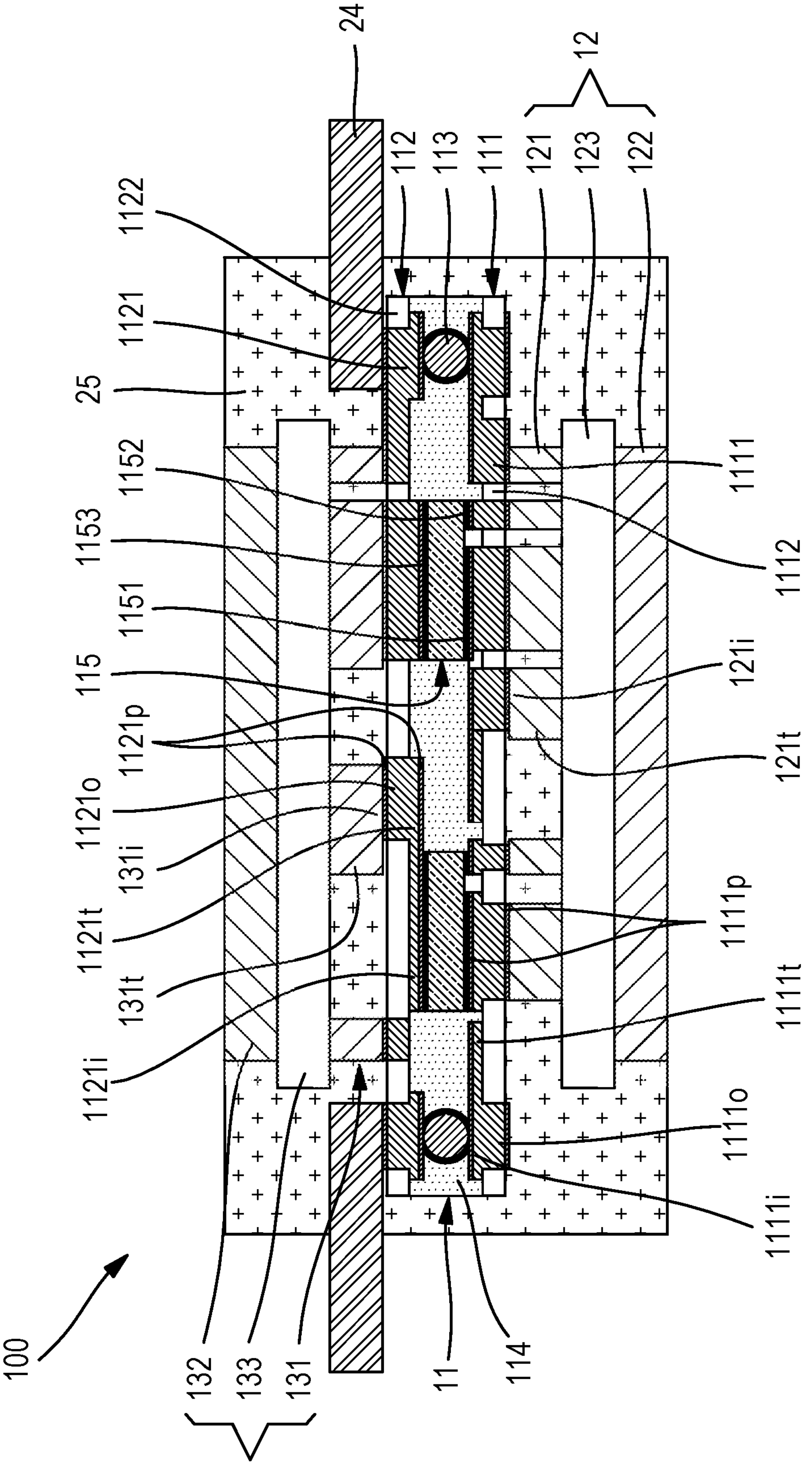
FIG. 13 shows a cross-sectional view of an example electronic device.

FIG. 13 shows a cross-sectional view of an example electronic device 100. In the example shown in FIG. 13, electronic device 100 can comprise embedded module 11, device substrates 12 and 13, device terminals 24, and device encapsulant 15. In some examples, elements, features, materials, or formation processes of electronic device 100 can be similar to, or the same as, those of electronic device 10 or electronic device 60, as previously described.

FIGS. 14A to 14D show cross-sectional views of an example method for manufacturing an example electronic device 100.

Figure 14A:
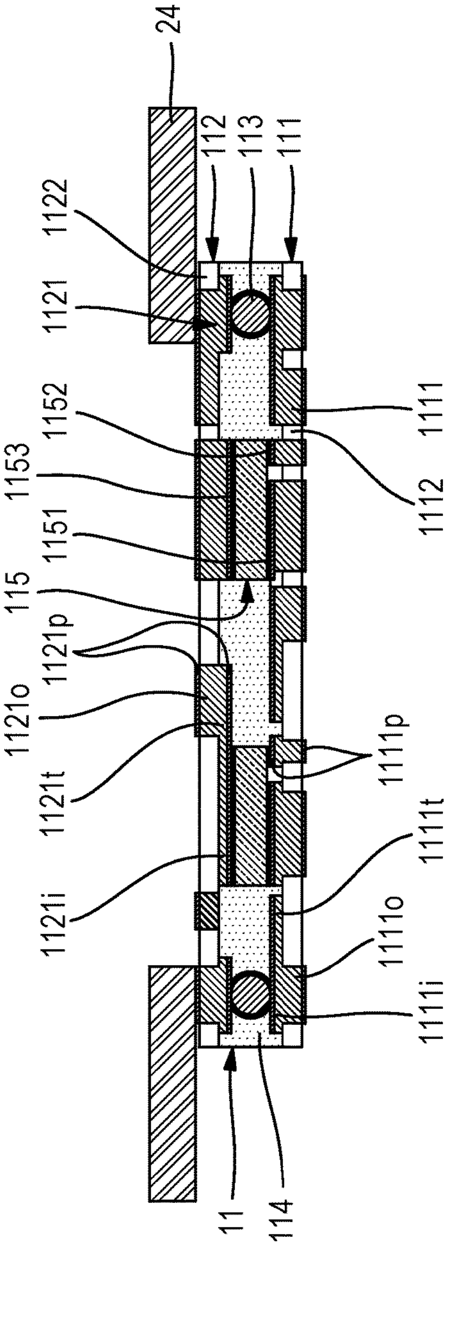
FIGS. 14A, 14B, 14C, and 14D show cross-sectional views of an example method for manufacturing an example electronic device.

FIG. 14A shows a cross-sectional view of electronic device 100 at an early stage of manufacture. In the example shown in FIG. 14A, the steps described with respect to FIGS. 2A to 2N can be followed, and then device terminals 24 can be coupled to embedded module 11.

In some examples, device terminals 24 can be spaced apart from each other and can be provided on the edge of embedded module 11. Device terminals 24 can be coupled to second module substrate 112 of embedded module 11. In some examples, device terminals 24 can be coupled to conductive structure 1121 (e.g., outward terminals 1121*o*) of second module substrate 112. Device terminals 24 can protrude outward of embedded module 11.

Figure 14B:
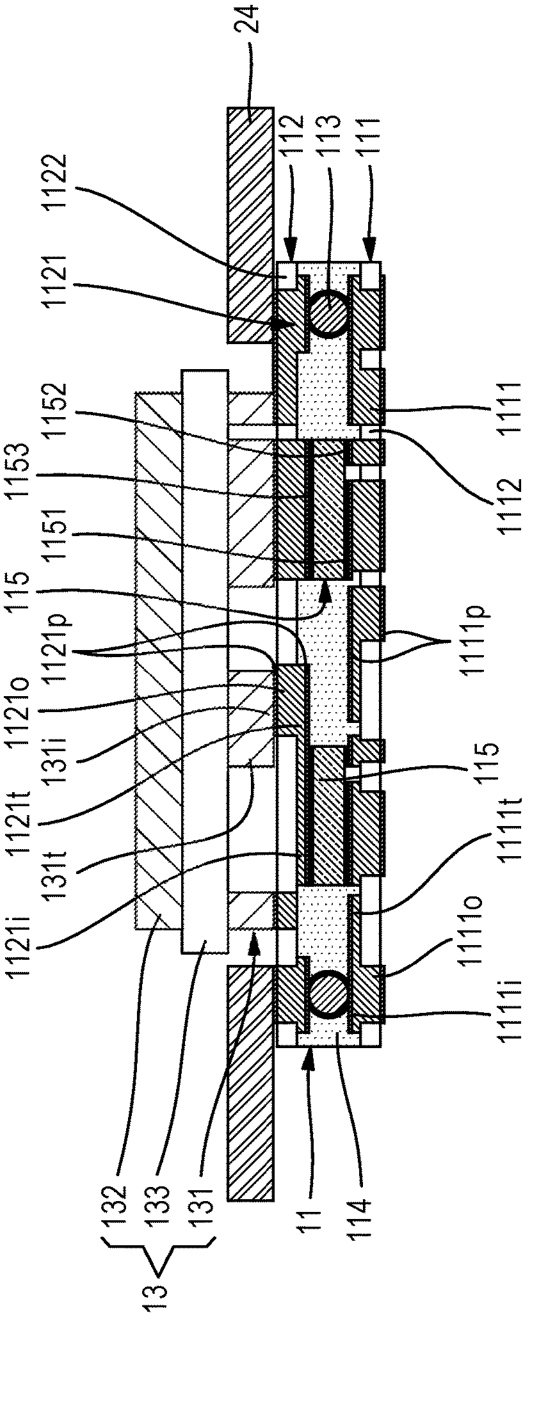

FIG. 14B shows a cross-sectional view of electronic device 100 at a later stage of manufacture. In the example shown in FIG. 14B, device substrate 13 can be provided over embedded module 11. The area (or footprint) of device substrate 13 can be smaller than the area (or footprint) of embedded module 11. Device substrate 13 can be located inside device terminals 24. Device substrate 13 can be spaced apart from device terminals 24. Device substrate 13 can be coupled to conductive structure 1121 (e.g., to outward terminals 1121*o*) of second module substrate 112.

Figure 14C:
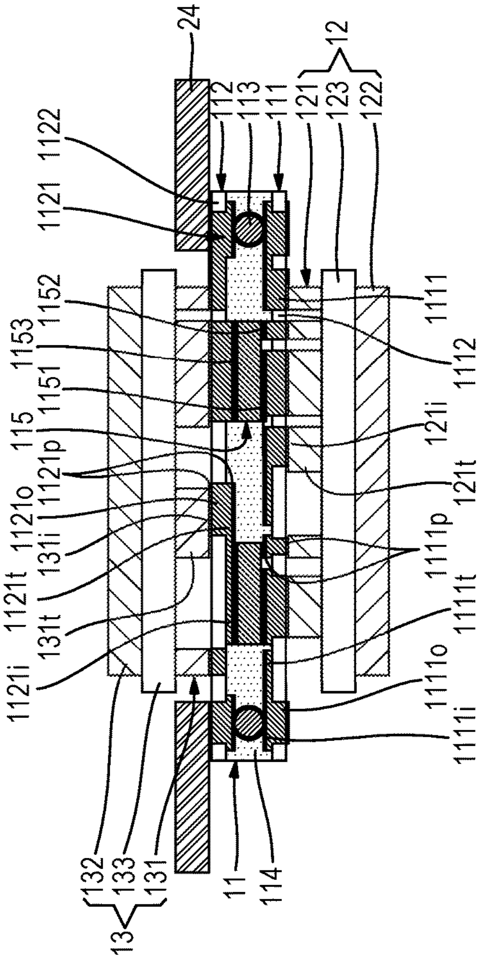

FIG. 14C shows a cross-sectional view of electronic device 100 at a later stage of manufacture. In the example shown in FIG. 14C, device substrate 12 can be provided under embedded module 11. Stated differently, embedded module 11, device substrate 13, and device terminals 24 can be disposed over device substrate 12. The area (or footprint) of device substrate 12 can be smaller than the area (or footprint) of embedded module 11. The area (or footprint) of device substrate 12 can correspond to the area (or footprint) of device substrate 13. Device substrate 12 can be coupled to conductive structure 1111 of first module substrate 111.

Figure 14D:
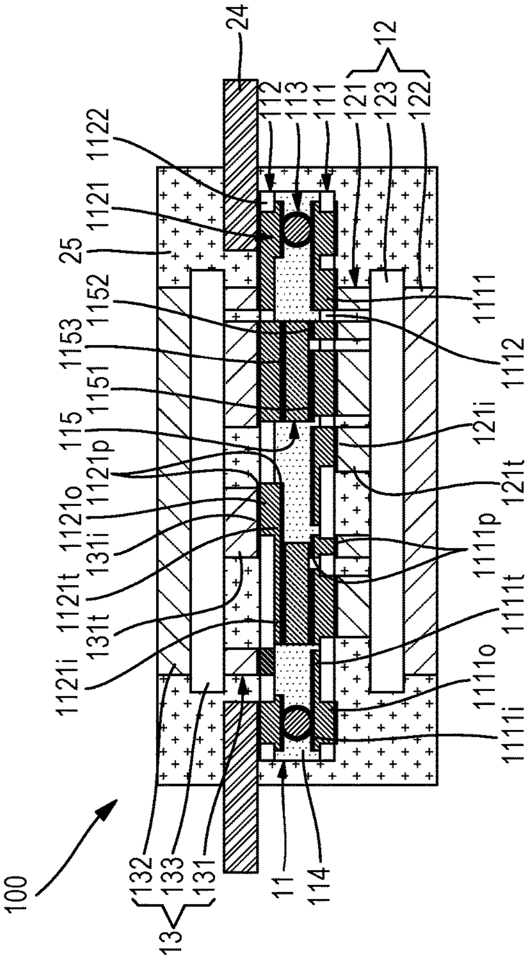

FIG. 14D shows a cross-sectional view of electronic device 100 at a later stage of manufacture. In the example shown in FIG. 14D, device encapsulant 15 can be provided. Device encapsulant 15 can encapsulate embedded module 11, device substrates 12 and 13, and device terminals 24. Device encapsulant 15 can contact module encapsulant 114 of embedded module 11.

Figure 15:
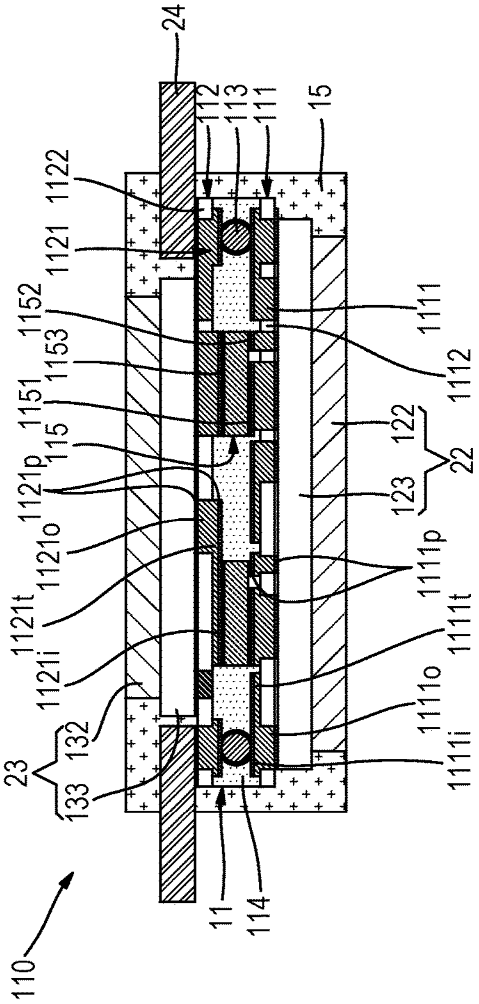
FIG. 15 shows a cross-sectional view of an example electronic device.

FIG. 15 shows a cross-sectional view of an example electronic device 110. In the example shown in FIG. 15, electronic device 110 can comprise embedded module 11, device substrates 22 and 23, device terminals 24, and device encapsulant 15. In some examples, elements, features, materials, or formation processes of electronic device 110 can be similar to, or the same as, those of electronic device 10, electronic device 20, electronic device 60, or electronic device 70, as previously described.

Core layer 123 of device substrate 22 can contact first module substrate 111 of embedded module 11. Core layer 123 can transfer heat generated by embedded module 11 to outward metallic layer 122.

Core layer 133 of device substrate 23 can contact second module substrate 112 of embedded module 11. Core layer 133 can transfer heat generated from embedded module 11 to outward metallic layer 132.

Figure 16:
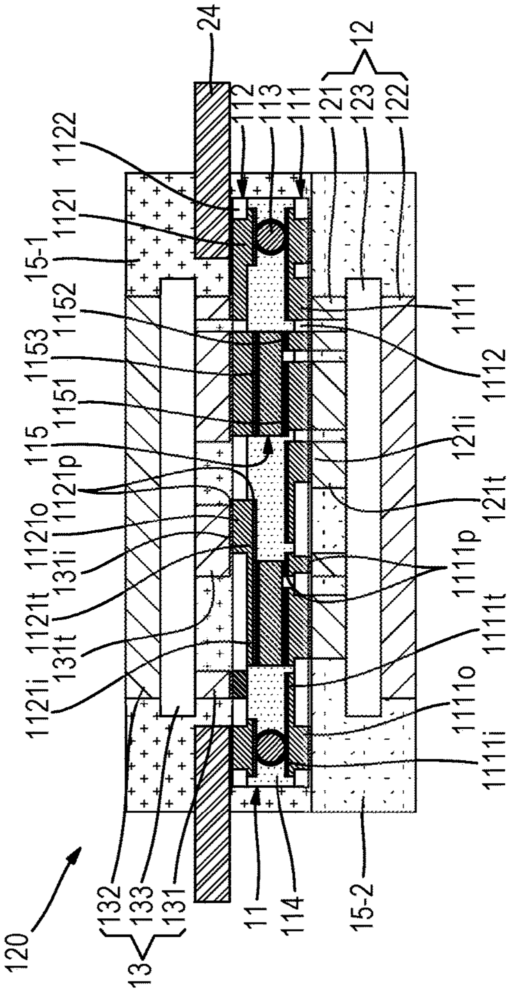
FIG. 16 shows a cross-sectional view of an example electronic device.

FIG. 16 shows a cross-sectional view of an example electronic device 120. In the example shown in FIG. 16, electronic device 120 can comprise embedded module 11, device substrates 12 and 13, device terminals 24, device encapsulant 15-1, and device encapsulant 15-2. In some examples, elements, features, materials, or formation processes of electronic device 120 can be similar to, or the same as, those of electronic device 10 or electronic device 60, as previously described.

FIGS. 17A to 17E show cross-sectional views of an example method for manufacturing an example electronic device 120.

Figure 17A:
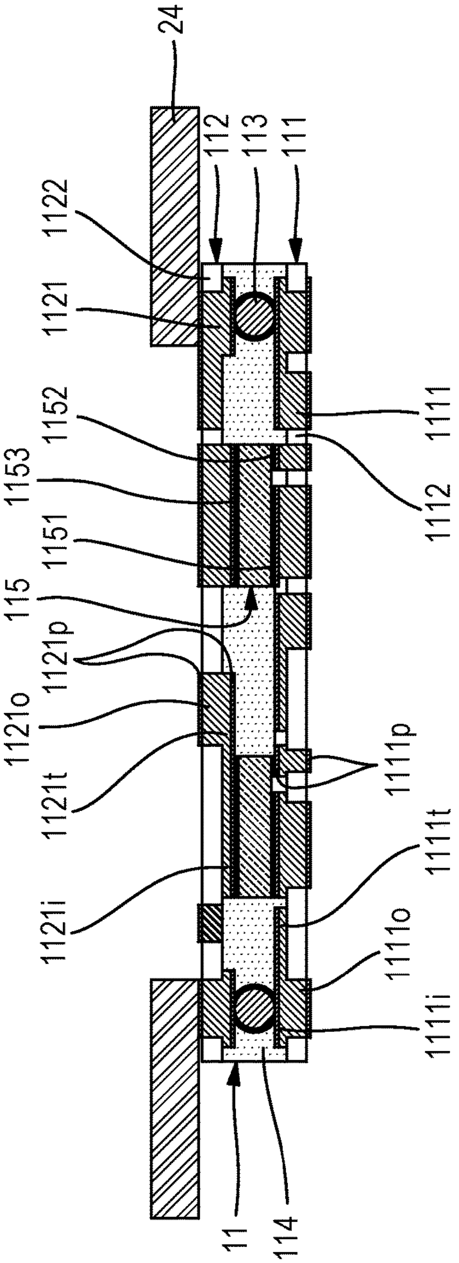
FIGS. 17A, 17B, 17C, 17D, and 17E show cross-sectional views of an example method for manufacturing an example electronic device.

FIG. 17A shows a cross-sectional view of electronic device 120 at an early stage of manufacture. In the example shown in FIG. 17A, the steps described with respect to FIGS. 2A to 2N can be followed, and then device terminals 24 can be provided on embedded module 11, as described above with reference to FIG. 14A.

Figure 17B:
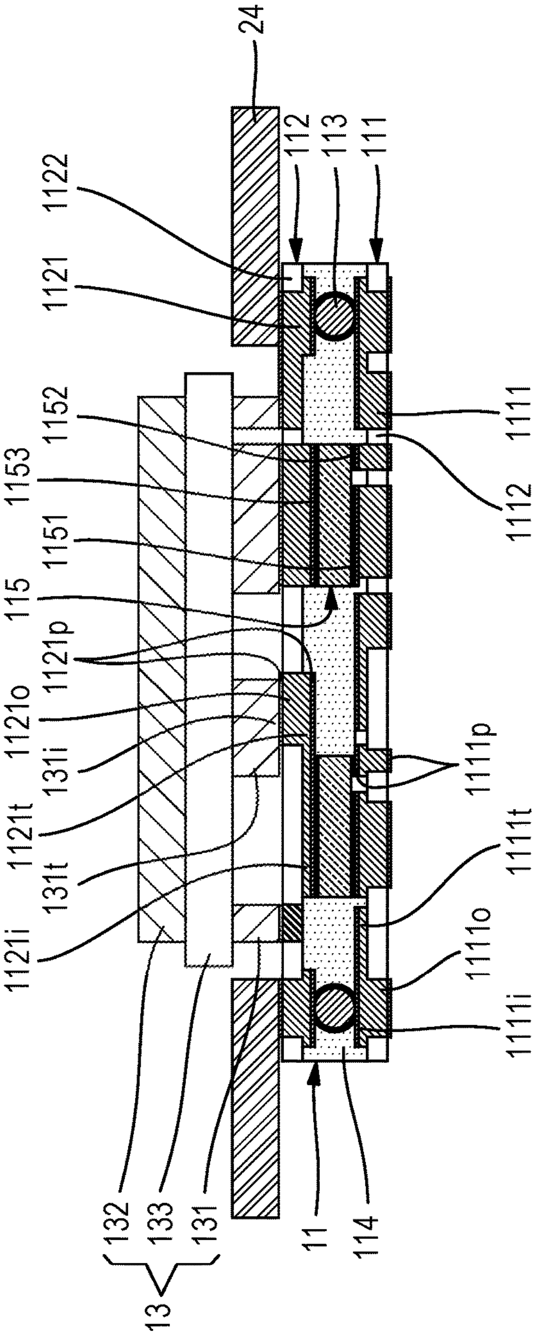

FIG. 17B shows a cross-sectional view of electronic device 120 at a later stage of manufacture. In the example shown in FIG. 17B, device substrate 13 can be provided over embedded module 11, as described above with reference to FIG. 14B.

Figure 17C:
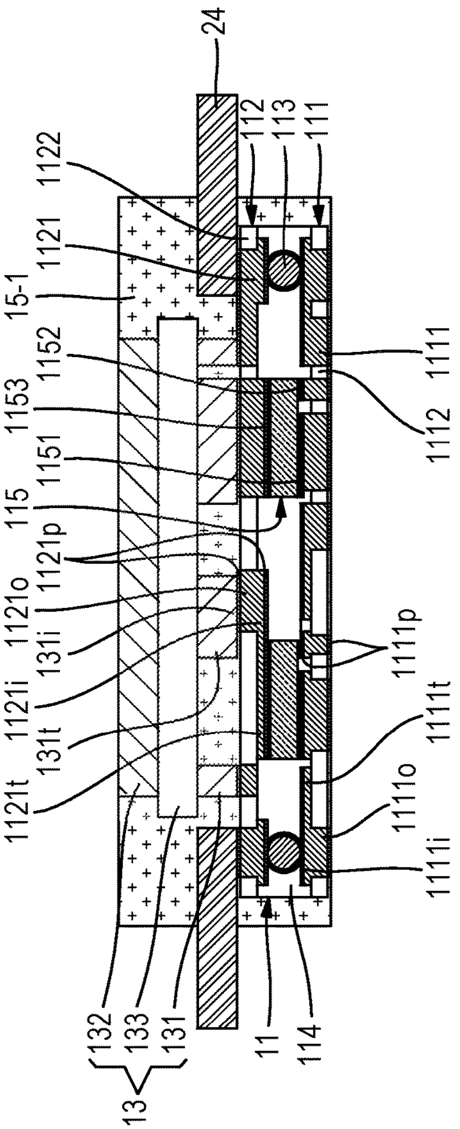

FIG. 17C shows a cross-sectional view of electronic device 120 at a later stage of manufacture. In the example shown in FIG. 17C, device encapsulant 15-1 can be provided. Device encapsulant 15-1 can encapsulate embedded module 11, device substrate 13, and device terminals 24. Device terminals 24 can protrude outward of the device encapsulant 15-1. The top side of device encapsulant 15-1 can be coplanar with the top side of device substrate 13. The bottom side of device encapsulant 15-1 can be coplanar with the bottom side of embedded module 11.

Figure 17D:
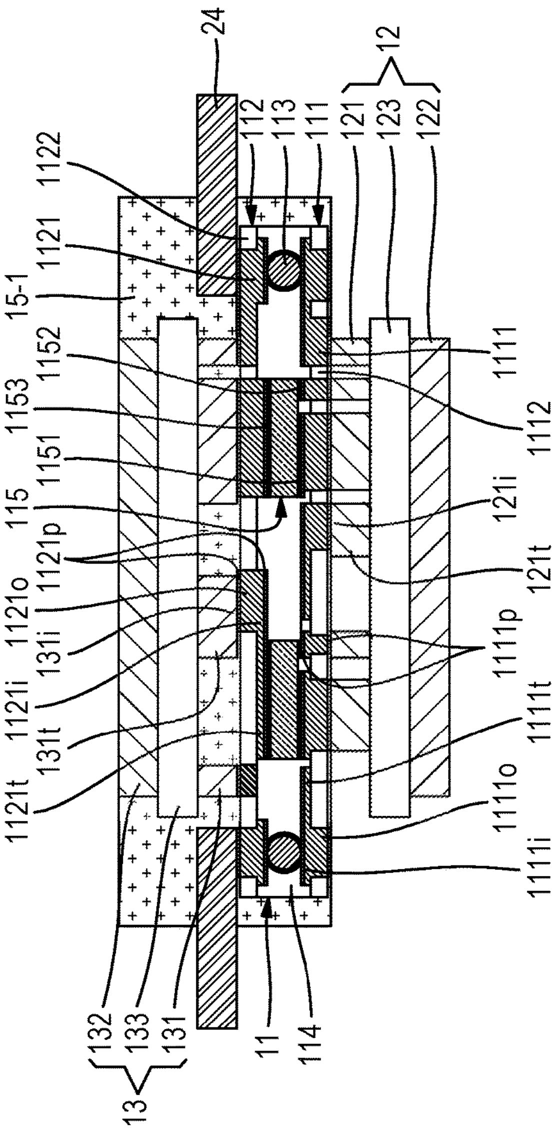

FIG. 17D shows a cross-sectional view of electronic device 120 at a later stage of manufacture. In the example shown in FIG. 17D, device substrate 12 can be provided under embedded module 11. Stated differently, encapsulated embedded module 11, device substrate 13, and device terminals 24 can be disposed over device substrate 12.

Figure 17E:
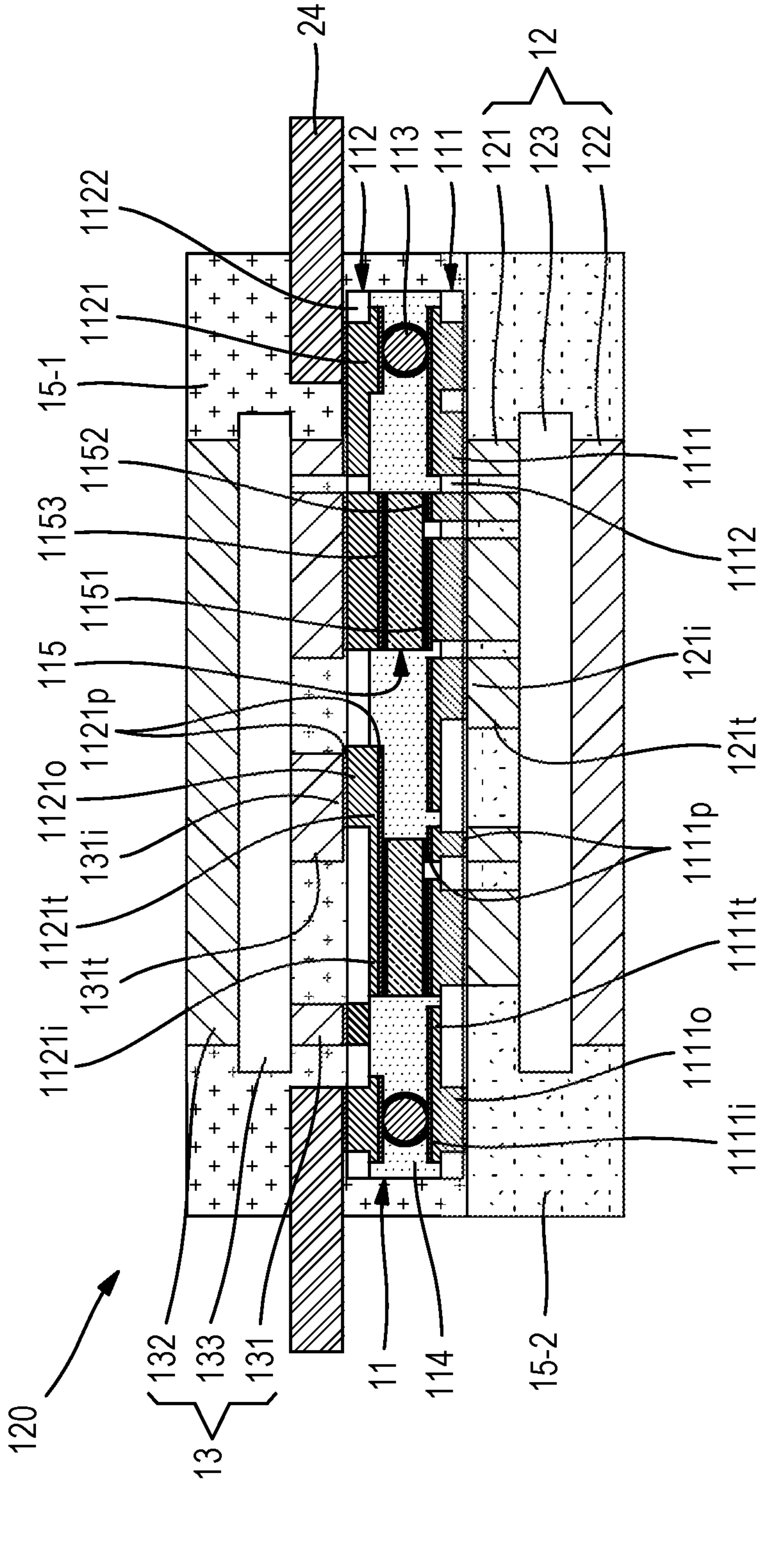

FIG. 17E shows a cross-sectional view of electronic device 120 at a later stage of manufacture. In the example shown in FIG. 17E, device encapsulant 15-2 can be provided. Device encapsulant 15-2 can encapsulate device substrate 12. The bottom side of device encapsulant 15-2 can be coplanar with bottom side of device substrate 12. The top side of device encapsulant 15-2 can be in contact with the bottom side of device encapsulant 15-1 or the bottom side of embedded module 11.

Figure 18:
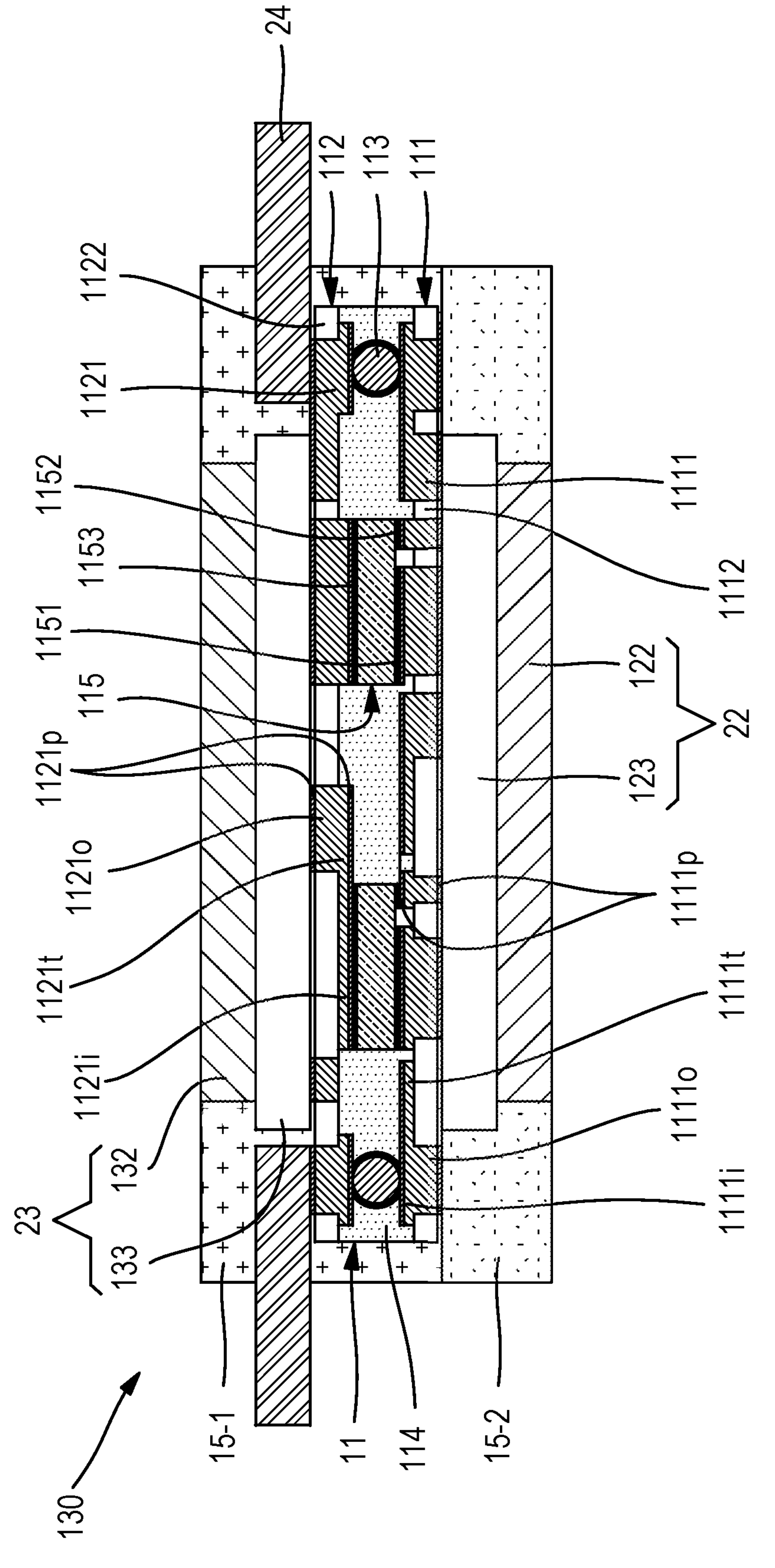
FIG. 18 shows a cross-sectional view of an example electronic device.

FIG. 18 shows a cross-sectional view of an example electronic device 130. In the example shown in FIG. 18, electronic device 130 can comprise embedded module 11, device substrates 22 and 23, device terminals 24, and device encapsulants 15-1 and 15-2. In some examples, elements, features, materials, or formation processes of electronic device 130 can be similar to, or the same as, those of electronic device 10, electronic device 20, electronic device 60, electronic device 70, or electronic device 120, as previously described.

Figure 19:
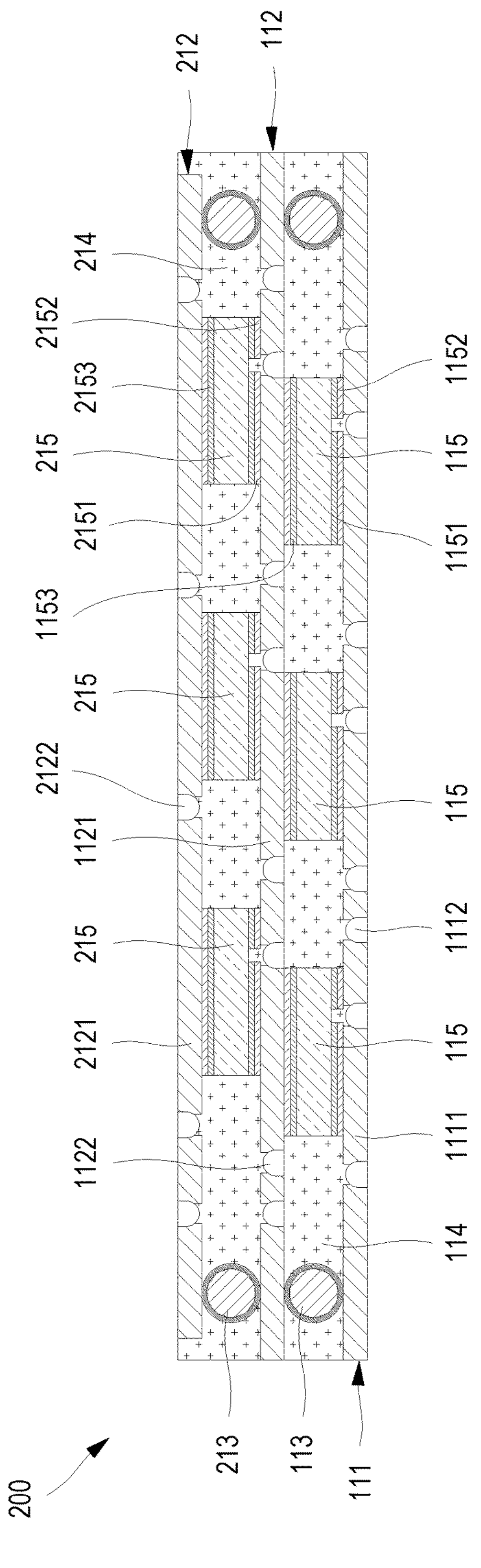
FIG. 19 shows a cross-sectional view of an example stacked embedded module.

FIG. 19 shows a cross-sectional view of an example stacked embedded module or power module 200. In the example shown in FIG. 19, stacked embedded module 200 can comprise first module substrate 111, second module substrate 112, third module substrate 212, first module interconnects 113, second module interconnects 213, first module encapsulant 114, second module encapsulant 214, one or more first module component(s) 115, and one or more second module component(s) 215.

First module substrate 111 can comprise conductive structure 1111 and dielectric structure 1112. Similar to the embedded module 11 shown in FIG. 1, conductive structure 1111 can comprise inward terminals, outward terminals, traces, or plating. Second module substrate 112 can comprise conductive structure 1121 and dielectric structure 1122. Similar to the embedded module 11 shown in FIG. 1, conductive structure 1121 can comprise inward terminals, outward terminals, traces, or plating. Third module substrate 212 can comprise conductive structure 2121 and dielectric structure 2122. Similar to the embedded module 11 shown in FIG. 1, conductive structure 2121 can comprise inward terminals, outward terminals, traces, or plating. Similar to the embedded module 11 shown in FIG. 1, first module components 115 can each comprise component terminals 1151, 1152, and 1153. Similar to the embedded module 11 shown in FIG. 1, second module components 215 can each comprise component terminals 2151, 2152, and 2153.

Figure 20A:
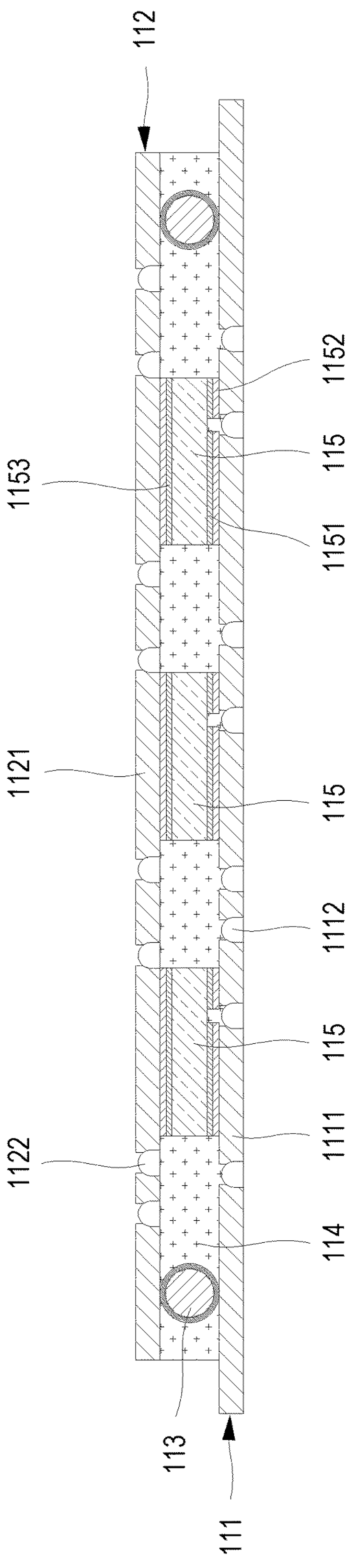
FIGS. 20A, 20B, 20C, 20D, and 20E show cross-sectional views of an example method for manufacturing an example stacked embedded module.

FIGS. 20A, 20B, 20C, and 20D show cross-sectional views of an example method for manufacturing an example stacked embedded module or power module 200. FIG. 20A shows a cross-sectional view of stacked embedded module 200 at an early stage of manufacture. In some examples, the starting structure of FIG. 20A can be similar to FIG. 2N.

In the example shown in FIG. 20A, one or more first module interconnects 113 and one or more first module components 115 can be electrically coupled on first module substrate 111, second module substrate 112 can be electrically coupled on one or more first module interconnects 113 or one or more first module components 115, and first module encapsulant 114 can be filled between first module substrate 111 and second module substrate 112 to cover first module interconnects 113 and first module components 115. In some examples, first module encapsulant 114 can contact first module substrate 111 and second module substrate 112. In some examples, first module encapsulant 114 can be a part of device encapsulant 15 (FIG. 21). While FIGS. 20A to 20D show the width or length of first module substrate 111 as greater than the width or length of the second module substrate 112, it is contemplated and understood that in other examples, the width or length of first module substrate 111 can be equal, or approximately, equal, to the width or length of the second module substrate 112. In some examples, lateral sides of first module encapsulant 114 can be coplanar with lateral sides of second module substrate 112. In some examples, the lateral sides of first module substrate 111 can extend more outward than the lateral sides of first module encapsulant 114. This process can be similar to the process shown in FIGS. 2A to 2N.

Figure 20B:
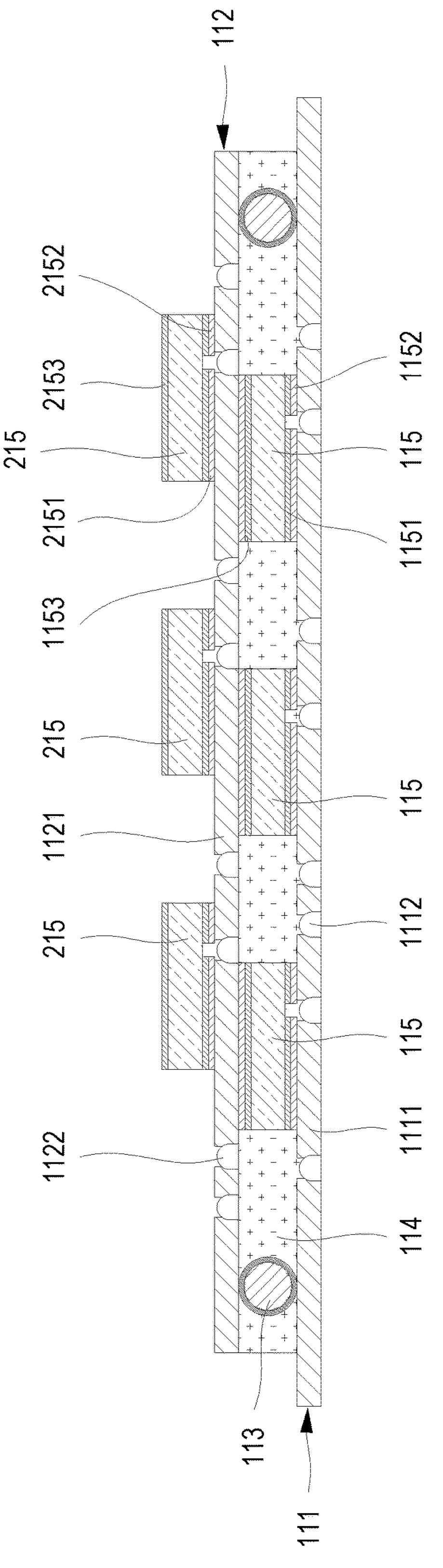
Figure 21:
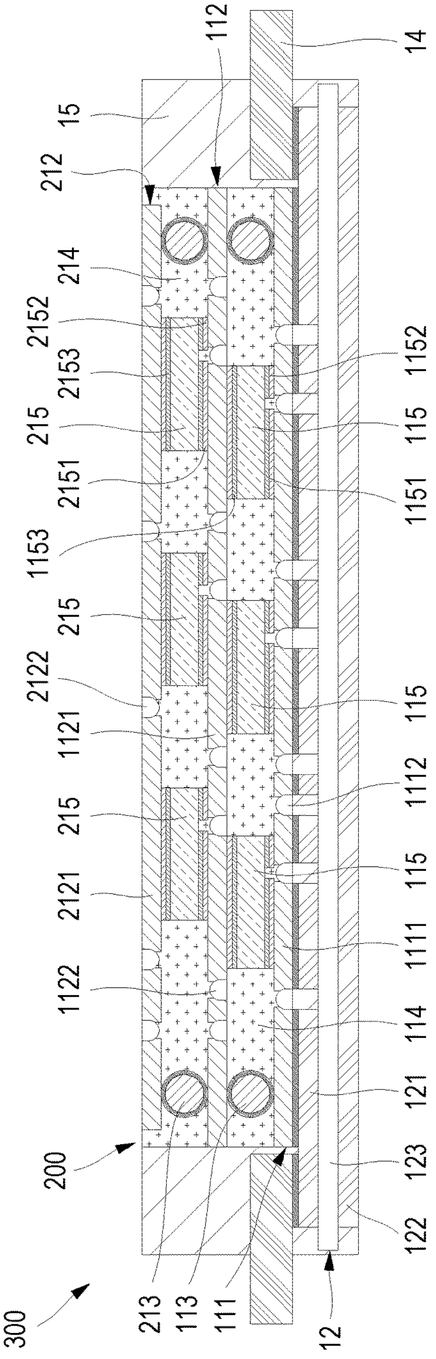
FIG. 21 shows a cross-sectional view of an example electronic device.

FIG. 20B shows a cross-sectional view of stacked embedded module 200 at a later stage of manufacture. In the example shown in FIG. 20B, one or more second module components 215 can be provided on second module substrate 112. Second module components 215 can be coupled to outward terminals of second module substrate 112. The outward terminals can provide connection paths between second module components 215 and second module substrate 112. In some examples, second module components 215 can be coupled to plating on the outward terminals through an interface material. In some examples, the interface material can be provided on the plating, and second module components 215 can be positioned on the interface material to allow second module components 215 to be coupled to the plating by a reflow process.

In some examples, second module component 215 can comprise component terminals 2151, 2152, and 2153. In some examples, component terminals 2151 and 2152 can be provided on a first side of second module component 215 and component terminal 2153 can be provided on a second side of second module component 215 opposite to the first side of second module component 215. In some examples, component terminal 2151 can be a source, component terminal 2152 can be a gate, and component terminal 2153 can be a drain. Component terminals 2151 and 2152 can be coupled to second module substrate 112 and can contact plating or outward terminals of conductive structure 1121. In some examples, component terminals 2151 and 2152 can be coupled to inward terminals of conductive structure 1121 through the outward terminals or through the outward terminals and traces of conductive structure 1121.

Figure 20C:
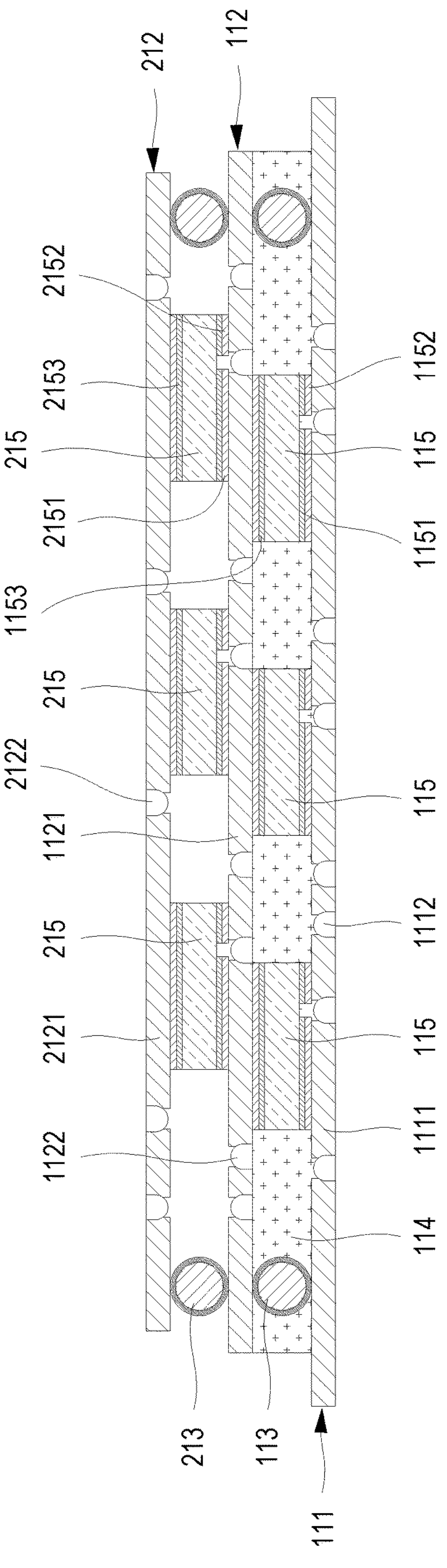

FIG. 20C shows a cross-sectional view of stacked embedded module 200 at a later stage of manufacture. In the example shown in FIG. 20C, third module substrate 212 having second module interconnects 213 can be provided on second module substrate 112 and second module components 215.

In some examples, second module interconnects 213 can be provided on third module substrate 212. Second module interconnects 213 can be coupled to the inward terminals of conductive structure 2121 of third module substrate 212. In some examples, second module interconnects 213 can comprise or be referred to as a solder ball, a solder-coated metal core (e.g., Cu core) ball, a pillar, a pillar with a solder cap, or a bump. In some examples, second module interconnects 213 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. In some examples, after a conductive material containing a solder is provided on the plating of the inward terminals of third module substrate 212, second module interconnects 213 can be provided by a reflow process. In some examples, the thickness of second module interconnect 213 can range from about 150 μm to about 365 μm.

In some examples, third module substrate 212 can be located over second module components 215 such that the inward terminals of third module substrate 212 are oriented toward second module components 215 and second module substrate 112, and the outward terminals of third module substrate 212 are on the top side of third module substrate 212. In some examples, after locating third module substrate 212 on second module substrate 112 and second module component 215, third module substrate 212 can be coupled to second module substrate 112 and second module component 215 by, for example, thermal compression bonding. Second module interconnects 213 can couple third module substrate 212 to second module substrate 112. In some examples, second module interconnects 213 can be coupled to the outward terminals or traces of second module substrate 112. Second module components 215 can be coupled to the inward terminals or the traces of third module substrate 212. In some examples, component terminal 2153 of second module component 215 can be coupled to the inward terminals or traces of third module substrate 212.

The side of second module substrate 112 where second module components 215 are attached can be an example of a second outward side. The side of second module substrate 112 opposite to the second outward side can be an example of a second inward side. The side of third module substrate 212 where second module component 215 are attached is an example of a third inward side. The side of third module substrate 212 opposite to the third inward side is an example of a third outward side.

In some examples, second module interconnects 213 can be first provided on and coupled to the outward terminals of second module substrate 112 and then third module substrate 212 can be provided over second module interconnects 213 and second module components 215. In some examples, third module substrate 212 can be electrically coupled on one or more second module interconnects 213 and one or more second module components 215.

Figure 20D:
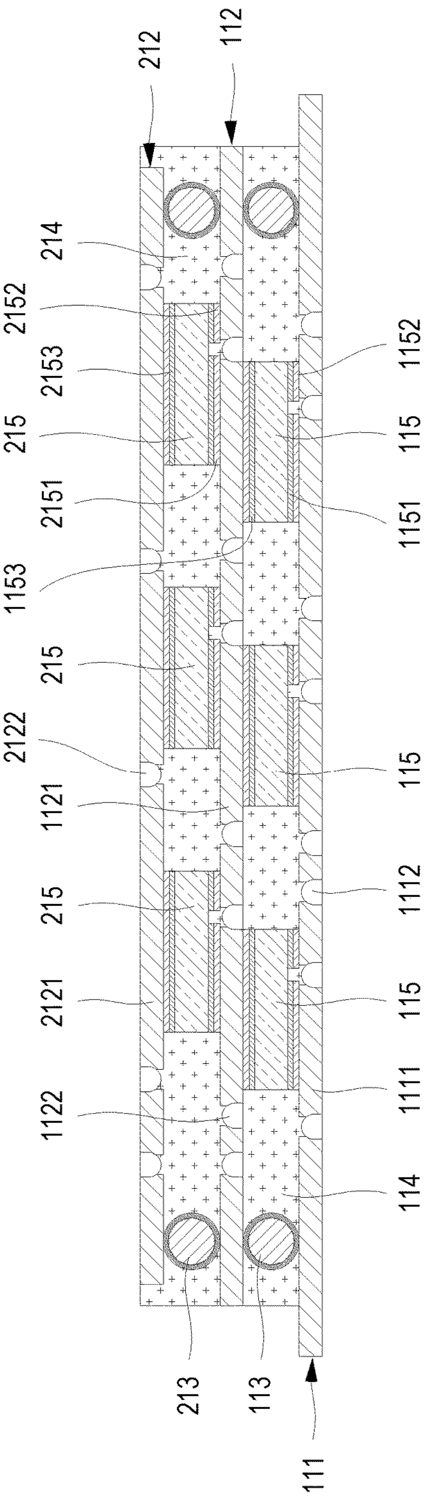

FIG. 20D shows a cross-sectional view of stacked embedded module 200 at a later stage of manufacture. In the example shown in FIG. 20D, second module encapsulant 214 can be provided. Second module encapsulant 214 can be provided between second module substrate 112 and third module substrate 212. Second module encapsulant 214 can encapsulate, surround, or cover second module interconnects 213 and second module components 215. Second module encapsulant 214 can contact the lateral sides of second module interconnects 213 and the lateral sides of second module components 215. In some examples, second module encapsulant 214 can contact conductive structure 1121 and dielectric structure 1122 of second module substrate 112, and conductive structure 2121 and dielectric structure 2122 of third module substrate 212. In some examples, second module encapsulant 214 can comprise or be referred to as a resin, a polymer with fillers, a mold compound, a protective material, or a mold material. In some examples, second module encapsulant 214 can be provided by a film assisted molding process, a compression molding process, or a transfer molding process. In some examples, the thickness of second module encapsulant 214 can range from about 150 μm to about 300 μm. In some examples, second module encapsulant 214 can cover the lateral sides of third module substrate 212. In other examples, the lateral sides of second module encapsulant 214 and the lateral side of third module substrate 212 can be coplanar. Second module encapsulant 214 can protect second module interconnects 213 and second module components 215 from exposure to external factors or environments. In some examples, second module encapsulant 214 can be a part of device encapsulant 15 (FIG. 21).

Figure 20E:
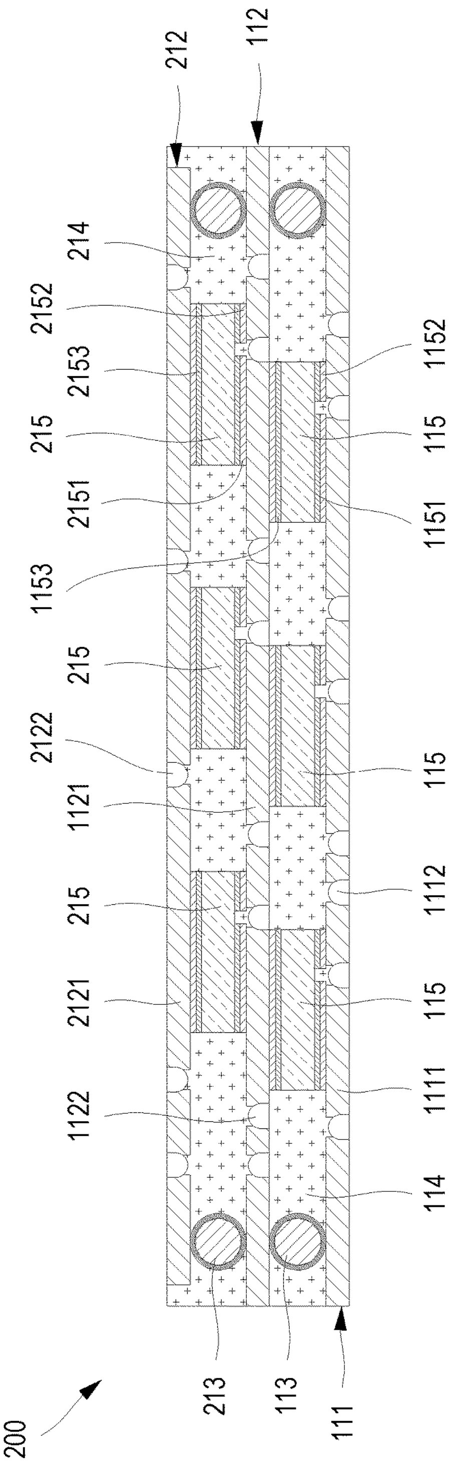

FIG. 20E shows a cross-sectional view of stacked embedded module 200 at a later stage of manufacture. In the example shown in FIG. 20E, stacked embedded module 200 can be singulated or sawed. In some examples, the singulation process or sawing process can be performed by a diamond blade wheel or a laser beam.

In some examples, second module encapsulant 214, second module substrate 112, first module encapsulant 114 and first module substrate 111 can be sequentially singulated or sawed. In some examples, lateral sides of each of second module encapsulant 214, second module substrate 112, first module encapsulant 114, and first module substrate 111 can be coplanar.

In some examples, third module substrate 212, second module encapsulant 214, second module substrate 112, first module encapsulant 114, and first module substrate 111 can be sequentially singulated or sawed, and the lateral sides of each of third module substrate 212, second module encapsulant 214, second module substrate 112, first module encapsulant 114, and first module substrate 111 can be coplanar.

In some examples, second module components 215 can be electrically coupled to first module substrate 111, such that, in the final stacked embedded module, first module substrate 111 is located between second module substrate 112 and third module substrate 212, and second module interconnects 213 electrically couple third module substrate 212 to first module substrate 111, and second module encapsulant 214 is disposed between first module substrate 111 and third module substrate 212 (e.g., first module substrate 111 is located between first module encapsulant 114 and second module encapsulant 214). In some examples, component terminal 2153 of second module components 215 can be coupled to outward terminals, traces, or plating of second module substrate 112, and component terminals 2151 and 2152 can be coupled to inward terminals, traces, or plating of third module substrate 212 (e.g., second module component 215 can be flipped 180° relative to the orientation of second module component 215 shown in FIGS. 20B to 20E).

FIG. 21 shows a cross-sectional view of an example electronic device 300. In the example shown in FIG. 21, electronic device 300 can comprise stacked embedded module 200, device substrate 12, device terminals 14, and device encapsulant 15. In accordance with various examples, elements, features, materials, or formation processes of electronic device 300 can be similar to, or the same as, those of electronic devices 10, 20, 30, 40, 50, 60, 70, 80, 90, 100, 110, 120, or 130 as previously described.

A portion of device substrate 12 can be exposed from device encapsulant 15. In some examples, a bottom side of device substrate 12 can be exposed from device encapsulant 15. In some examples, outward metallic layer 122 of device substrate 12 can be exposed from device encapsulant 15. In some examples, a bottom side of outward metallic layer 122 can be coplanar with a bottom side of device encapsulant 15.

A portion of stacked embedded module 200 can be exposed from device encapsulant 15. In some examples, a top side of third module substrate 212 can be exposed from device encapsulant 15. In some examples, the top side of third module substrate 212 and a top side of device encapsulant 15 can be coplanar. In some examples, the outward terminals, traces, or plating of third module substrate 212 can be exposed.

Figure 22:
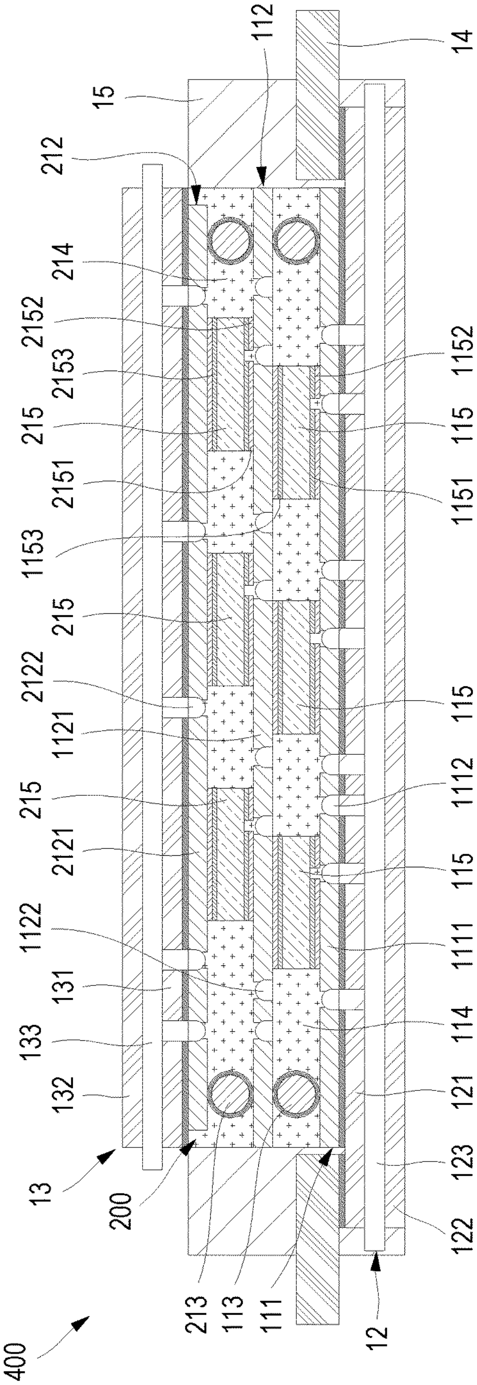
FIG. 22 shows a cross-sectional view of an example electronic device.

FIG. 22 shows a cross-sectional view of an example electronic device 400. In the example shown in FIG. 22, electronic device 400 can comprise stacked embedded module 200, device substrate 12, device substrate 13, device terminals 14, and device encapsulant 15. In accordance with various examples, elements, features, materials, or formation processes of electronic device 400 can be the similar to, or the same as, those of electronic devices 10, 20, 30, 40, 50, 60, 70, 80, 90, 100, 110, 120, 130, or 300, as previously described.

Device substrate 13 can be located above or protrude from device encapsulant 15. In some examples, device substrate 13 can be positioned higher than device encapsulant 15. For example, the bottom side of inward metallic layer 131 can be coplanar with top side of device encapsulant 15. In some examples, lateral sides of each of inward metallic layer 131, core layer 133, and outward metallic layer 132 can be exposed. In some examples, a top side of outward metallic layer 132 can be exposed.

Figure 23:
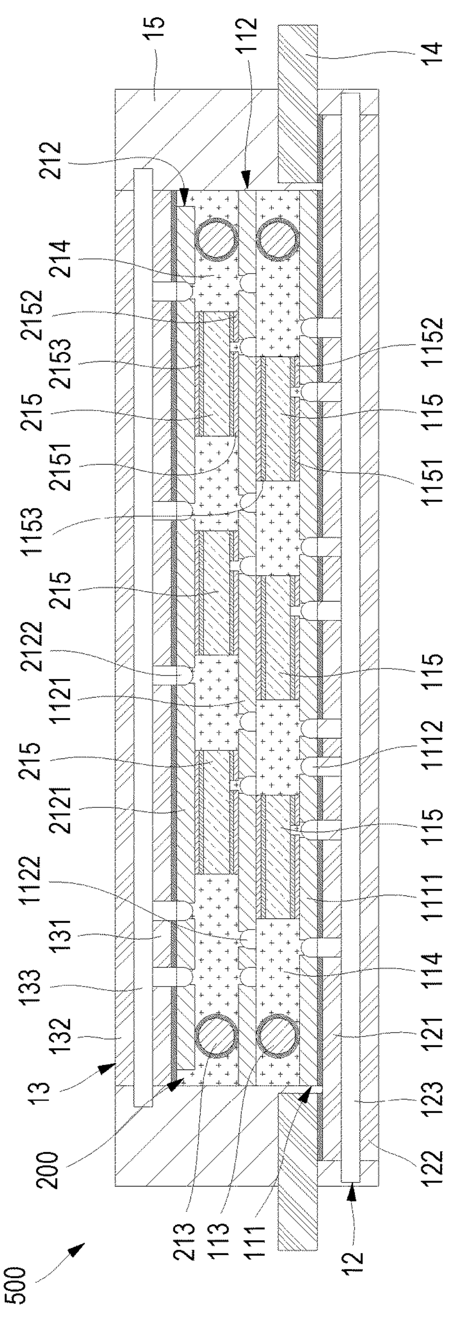
FIG. 23 shows a cross-sectional view of an example electronic device.

FIG. 23 shows a cross-sectional view of an example electronic device 500. In the example shown in FIG. 23, electronic device 500 can comprise stacked embedded module 200, device substrate 12, device substrate 13, device terminals 14, and device encapsulant 15. In accordance with various examples, elements, features, materials, or formation processes of electronic device 500 can be similar to, or the same as, those of electronic devices 10, 20, 30, 40, 50, 60, 70, 80, 90, 100, 110, 120, 130, 300, or 400 as previously described.

In some examples, device substrate 13 can be located in device encapsulant 15. For example, device encapsulant 15 can cover or contact lateral sides of inward metallic layer 131, outward metallic layer 132, or core layer 133. In some examples, a portion of device substrate 13 can be exposed from device encapsulant 15. For example, the top side of device substrate 13 can be exposed from device encapsulant 15. In some examples, outward metallic layer 132 of device substrate 13 can be exposed from device encapsulant 15. In some examples, the top side of outward metallic layer 132 can be coplanar with the top side of device encapsulant 15.

Figure 24:
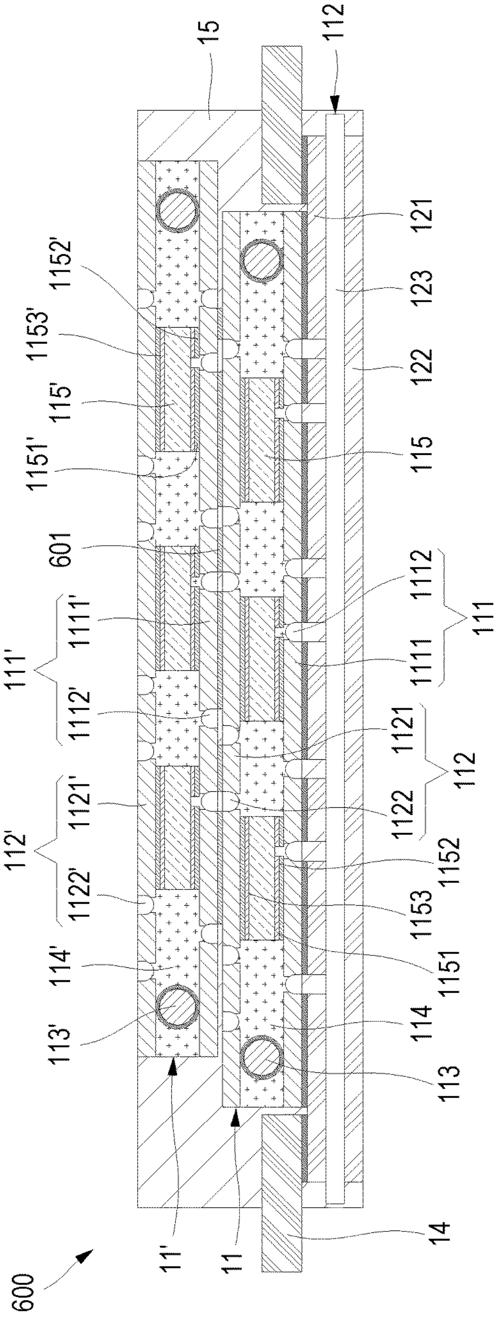
FIG. 24 shows a cross-sectional view of an example electronic device.

FIG. 24 shows a cross-sectional view of an example electronic device 600. In the example shown in FIG. 24, electronic device 600 can comprise first embedded module 11, second embedded module 11', device substrate 12, device terminals 14, and device encapsulant 15. In accordance with various examples, elements, features, materials, or formation processes of electronic device 600 can be similar to, or the same as, those of electronic devices 10, 20, 30, 40, 50, 60, 70, 80, 90, 100, 110, 120, 130, 300, 400, or 500 as previously described.

Elements, features, materials, or formation processes of first embedded module 11 can be similar to, or the same as, embedded module 11 shown in FIG. 2N. Elements, features, materials, or formation processes of second embedded module 11' can be similar to, or the same as, embedded module 11 shown in FIG. 2N. In some examples, second embedded module 11' can comprise first module substrate 111', second module substrate 112', one or more module interconnect(s) 113', module encapsulant 114', and one or more module component(s) 115'. Similar to the embedded module 11 shown in FIG. 1, one or more module components 115' can each comprise component terminals 1151', 1152', and 1153'. In some examples, first module substrate 111' can be referred to as a third module substrate and second module substrate 112' can be referred to as a fourth module substrate.

First module substrate 111' can comprise conductive structure 1111' and dielectric structure 1112'. Similar to conductive structure 1111 of first module substrate 111, conductive structure 1111' can comprise inward terminals, outward terminals, traces, and plating. Second module substrate 112' can comprise conductive structure 1121' and dielectric structure 1122'. Similar to conductive structure 1121 of second module substrate 112, conductive structure 1121' can comprise inward terminals, outward terminals, traces, and plating.

In some examples, second module substrate 112 of first embedded module 11 can be electrically coupled to first module substrate 111' of second embedded module 11'. In some examples, the outward terminals, traces, or plating of conductive structure 1121 can be electrically coupled to the outward terminals, traces, or plating of conductive structure 1111'.

In some examples, first embedded module 11 can be coupled to second embedded module 11' by an interface material 601. In some examples, interface material 601 can comprise or be referred to as conductive adhesive, conductive epoxy, solder paste, Ag sintered paste, or anisotropic conductive film (ACF). In some examples, a gap can exist between first embedded module 11 and second embedded module 11' by the thickness of interface material 601. In some examples, device encapsulant 15 can be in the gap.

In the example of FIG. 24, at least a first pair of opposing lateral sides of first embedded module 11 and at least a first pair of opposing lateral sides of second embedded module 11' can have different horizontal positions (e.g., second embedded module 11' can be laterally offset from first embedded module 11). For example, a first (e.g., left) lateral side of second embedded module 11' can be located farther from a first (e.g., left) lateral side of device encapsulant 15 as compared to a first (e.g., left) lateral side of first embedded module 11, or a second (e.g., right) lateral side of second embedded module 11' can be located closer to a second (e.g., right) lateral side of device encapsulant 15 as compared to a second (e.g., right) lateral side of first embedded module 11. The second pair of opposing lateral sides of first embedded module 11 (e.g., the lateral sides connecting the first pair of opposing lateral sides) can be laterally offset or coplanar with the second pair of opposing lateral sides of second embedded module 11'.

A portion of second embedded module 11' can be exposed from device encapsulant 15. In some examples, a top side of second module substrate 112' can be exposed from device encapsulant 15. In some examples, the top side of second module substrate 112' and the top side of device encapsulant 15 can be coplanar. In some examples, the outward terminals, traces, or plating of conductive structure 1121' of second module substrate 112' can be exposed.

Figure 25:
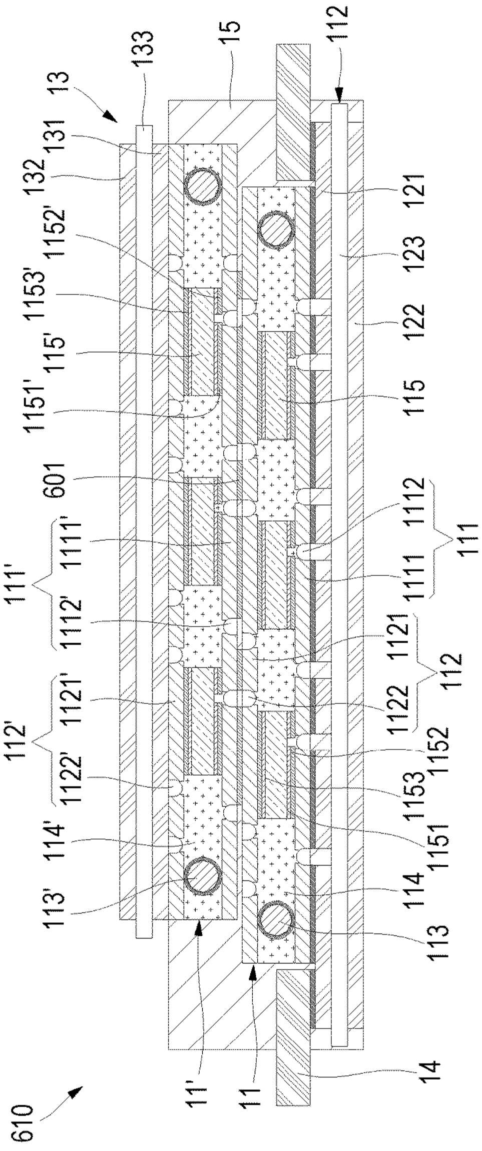
FIG. 25 shows a cross-sectional view of an example electronic device.

FIG. 25 shows a cross-sectional view of an example electronic device 610. In the example shown in FIG. 25, electronic device 610 can comprise first embedded module 11, second embedded module 11', device substrate 12, device substrate 13, device terminals 14, and device encapsulant 15. In accordance with various examples, elements, features, materials, or formation processes of electronic device 610 can be similar to, or the same as, those of electronic device 400 or electronic device 600, as previously described.

Device substrate 13 can be located above or protrude from device encapsulant 15. In some examples, device substrate 13 can be positioned higher than device encapsulant 15. For example, the bottom side of inward metallic layer 131 can be coplanar with top side of device encapsulant 15. In some examples, lateral sides of each of inward metallic layer 131, core layer 133, and outward metallic layer 132 can be exposed. In some examples, the top side of outward metallic layer 132 can be exposed.

Figure 26:
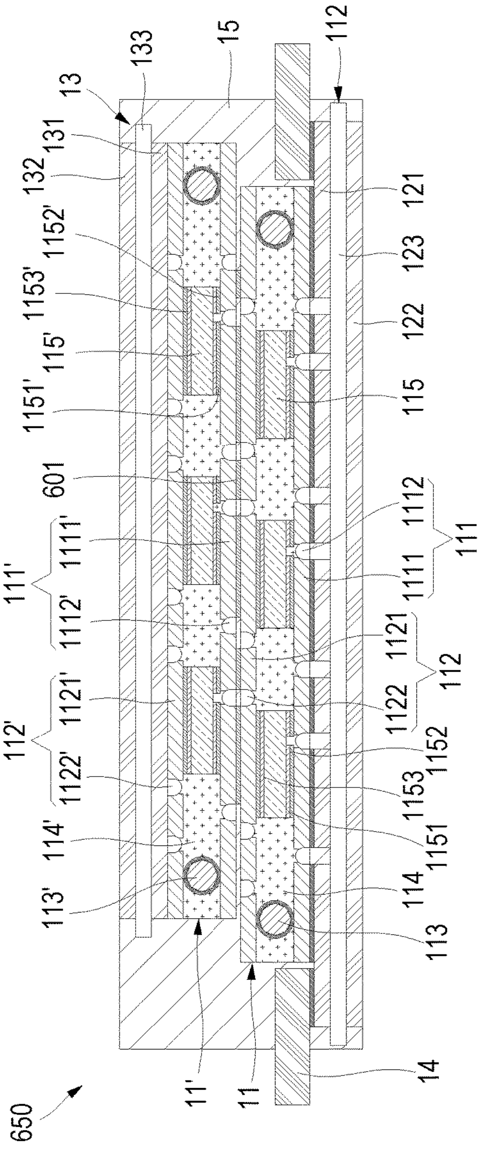
FIG. 26 shows a cross-sectional view of an example electronic device.

FIG. 26 shows a cross-sectional view of an example electronic device 650. In the example shown in FIG. 26, electronic device 650 can comprise first embedded module 11, second embedded module 11', device substrate 12, device substrate 13, device terminals 14, and device encapsulant 15. In accordance with various examples, elements, features, materials, or formation processes of electronic device 650 can be similar to, or the same as, those of electronic device 10, electronic device 500, or electronic device 600, as previously described.

In some examples, device substrate 13 can be in device encapsulant 15. For example, device encapsulant 15 can cover or contact lateral sides of inward metallic layer 131, outward metallic layer 132, or core layer 133. In some examples, a portion of device substrate 13 can be exposed from device encapsulant 15. In some examples, the top side of device substrate 13 can be exposed from device encapsulant 15. In some examples, outward metallic layer 132 of device substrate 13 can be exposed from device encapsulant 15. In some examples, the top side of outward metallic layer 132 can be coplanar with the top side of device encapsulant 15.

Figure 27:
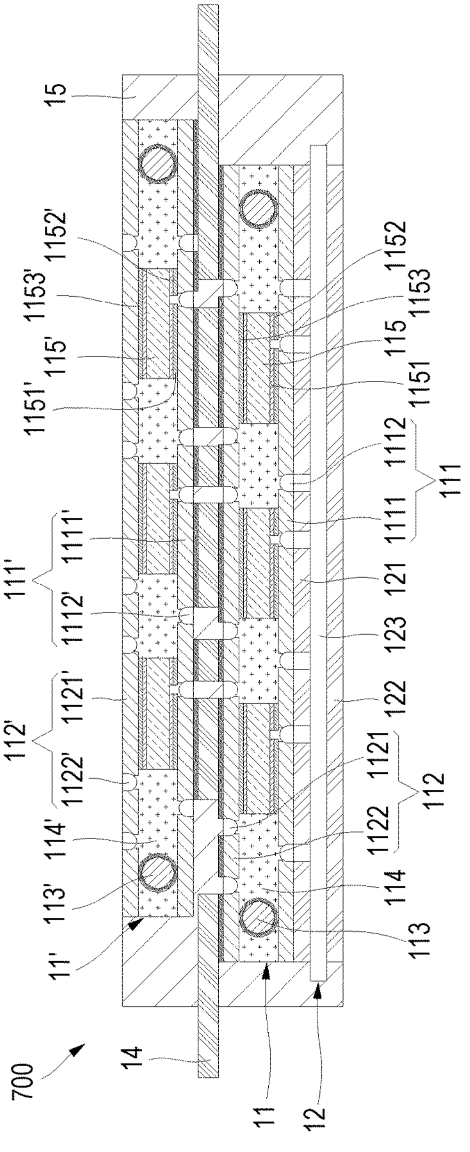
FIG. 27 shows a cross-sectional view of an example electronic device.

FIG. 27 shows a cross-sectional view of an example electronic device 700. In the example shown in FIG. 27, electronic device 700 can comprise first embedded module 11, second embedded module 11', device substrate 12, device substrate 13, device terminals 24, and device encapsulant 15. In accordance with various examples, elements, features, materials, or formation processes of electronic device 650 can be similar to, or the same as, those of electronic devices 50, 60, 70, 80, 90, 100, 110, 120, 130, 300, or 600, as previously described.

In some examples, device terminal 24 can be interposed between first embedded module 11 and second embedded module 11'. In some examples, a bottom side of device terminal 24 can be coupled to a top side of first embedded module 11. For example, device terminal 24 can be coupled to second module substrate 112 (e.g., to outward terminals or plating of conductive structure 1121). In some examples, a top side of device terminal 24 can be coupled to a bottom side of second embedded module 11'. For example, device terminal 24 can be coupled to first module substrate 111' of second embedded module 11' (e.g., to outward terminals or plating of conductive structure 1111').

Figure 28:
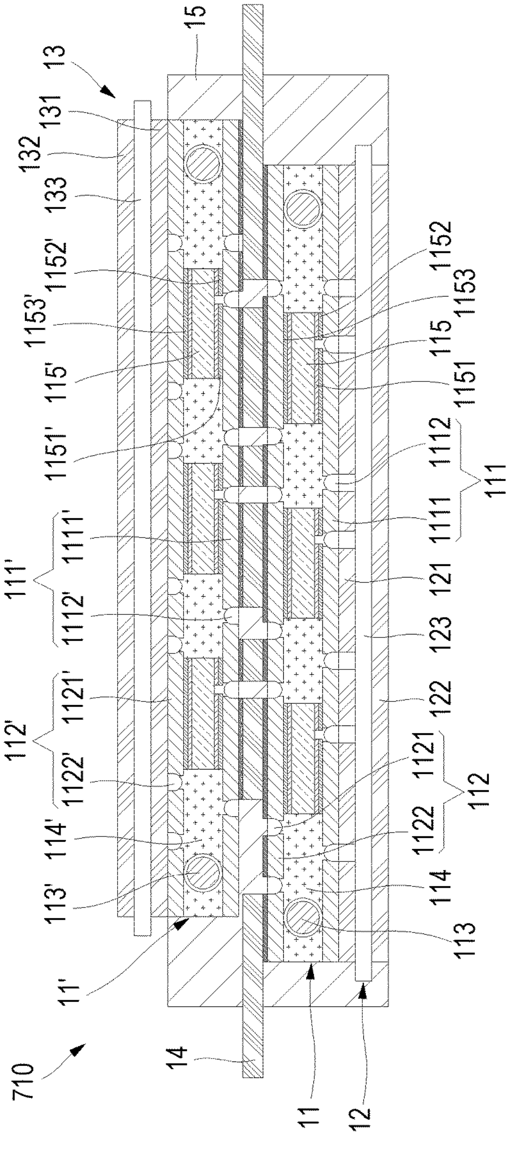
FIG. 28 shows a cross-sectional view of an example electronic device.

FIG. 28 shows a cross-sectional view of an example electronic device 710. In the example shown in FIG. 28, electronic device 710 can comprise first embedded module 11, second embedded module 11', device substrate 12, device substrate 13, device terminals 24, and device encapsulant 15. In accordance with various examples, elements, features, materials, or formation processes of electronic device 710 can be similar to, or the same as, those of electronic devices electronic device 400, 610, or 700, as previously described.

Device substrate 13 can be located above or protrude from device encapsulant 15. In some examples, device substrate 13 can be positioned higher than device encapsulant 15. For example, the bottom side of inward metallic layer 131 can be coplanar with top side of device encapsulant 15. In some examples, lateral sides of each of inward metallic layer 131, core layer 133, and outward metallic layer 132 can be exposed. In some examples, the top side of outward metallic layer 132 can be exposed.

Figure 29:
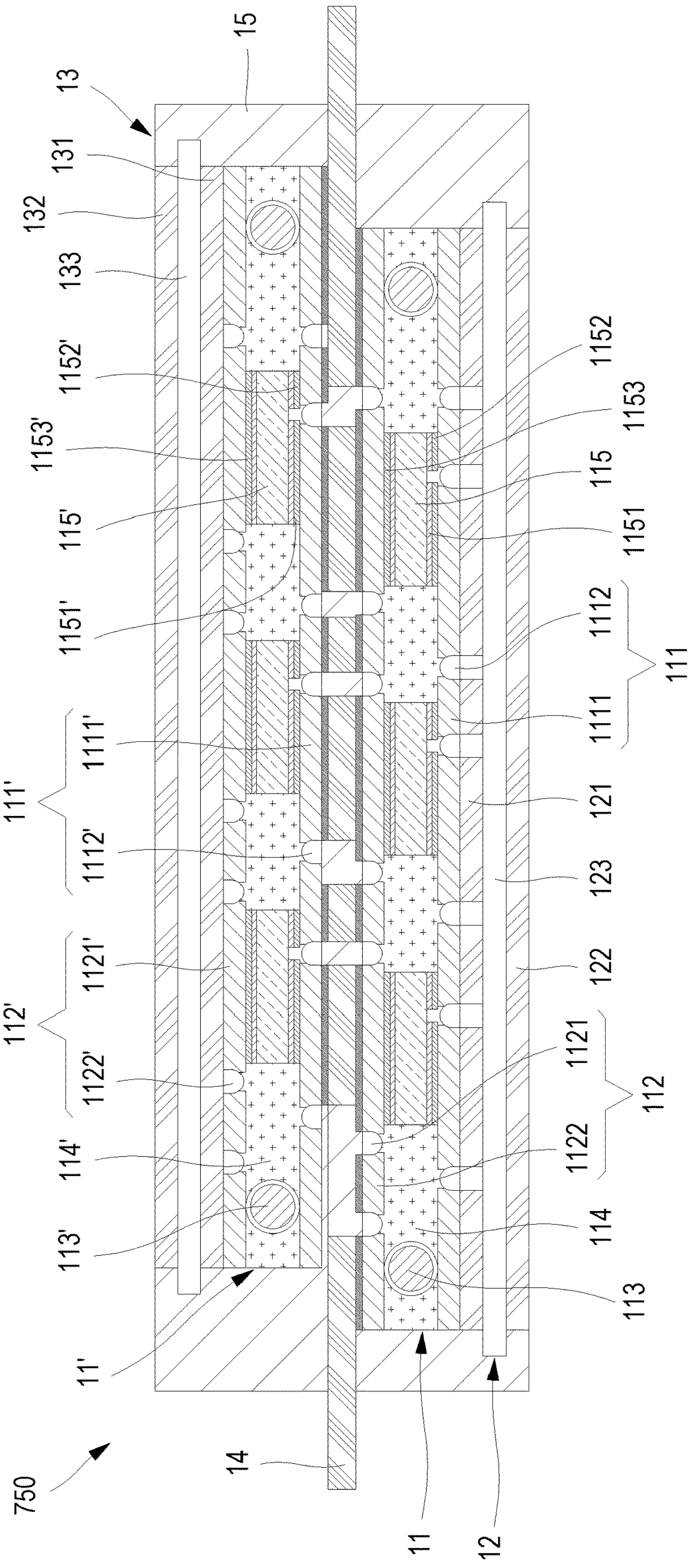
FIG. 29 shows a cross-sectional view of an example electronic device.

FIG. 29 shows a cross-sectional view of an example electronic device 750. In the example shown in FIG. 29, electronic device 750 can comprise first embedded module 11, second embedded module 11', device substrate 12, device substrate 13, device terminals 24, and device encapsulant 15. In accordance with various examples, elements, features, materials, or formation processes of electronic device 750 can be similar to, or the same as, those of electronic devices 500, 650, or 700, as previously described.

In some examples, device substrate 13 can be located in device encapsulant 15. For example, device encapsulant 15 can cover or contact lateral sides of inward metallic layer 131, outward metallic layer 132, or core layer 133. In some examples, a portion of device substrate 13 can be exposed from device encapsulant 15. In some examples, the top side of device substrate 13 can be exposed from device encapsulant 15. In some examples, outward metallic layer 132 of device substrate 13 can be exposed from device encapsulant 15. In some examples, the top side of outward metallic layer 132 can be coplanar with the top side of device encapsulant 15.

Figure 30A:
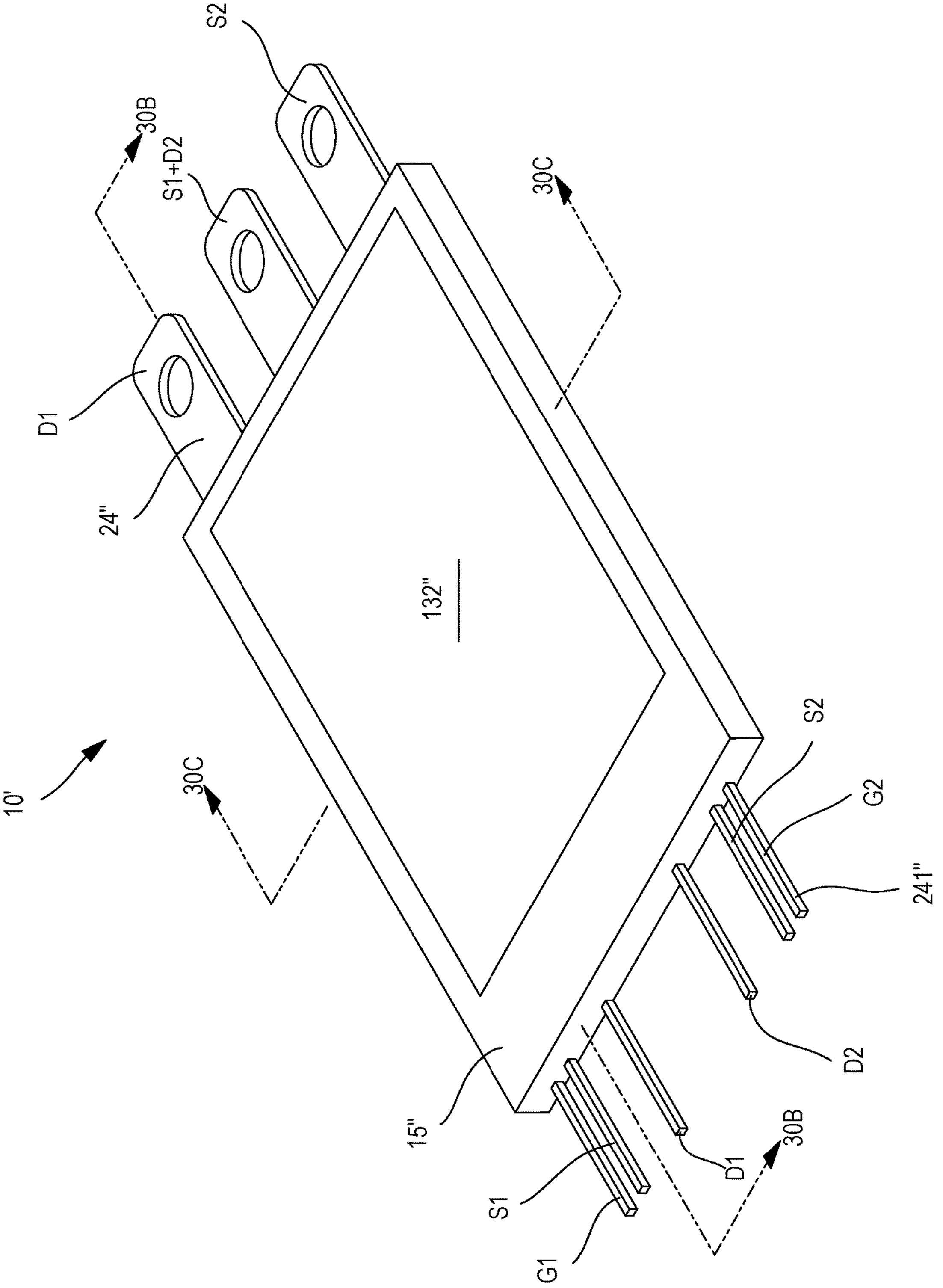
FIG. 30A shows a perspective view of an example electronic device.
Figure 30B:
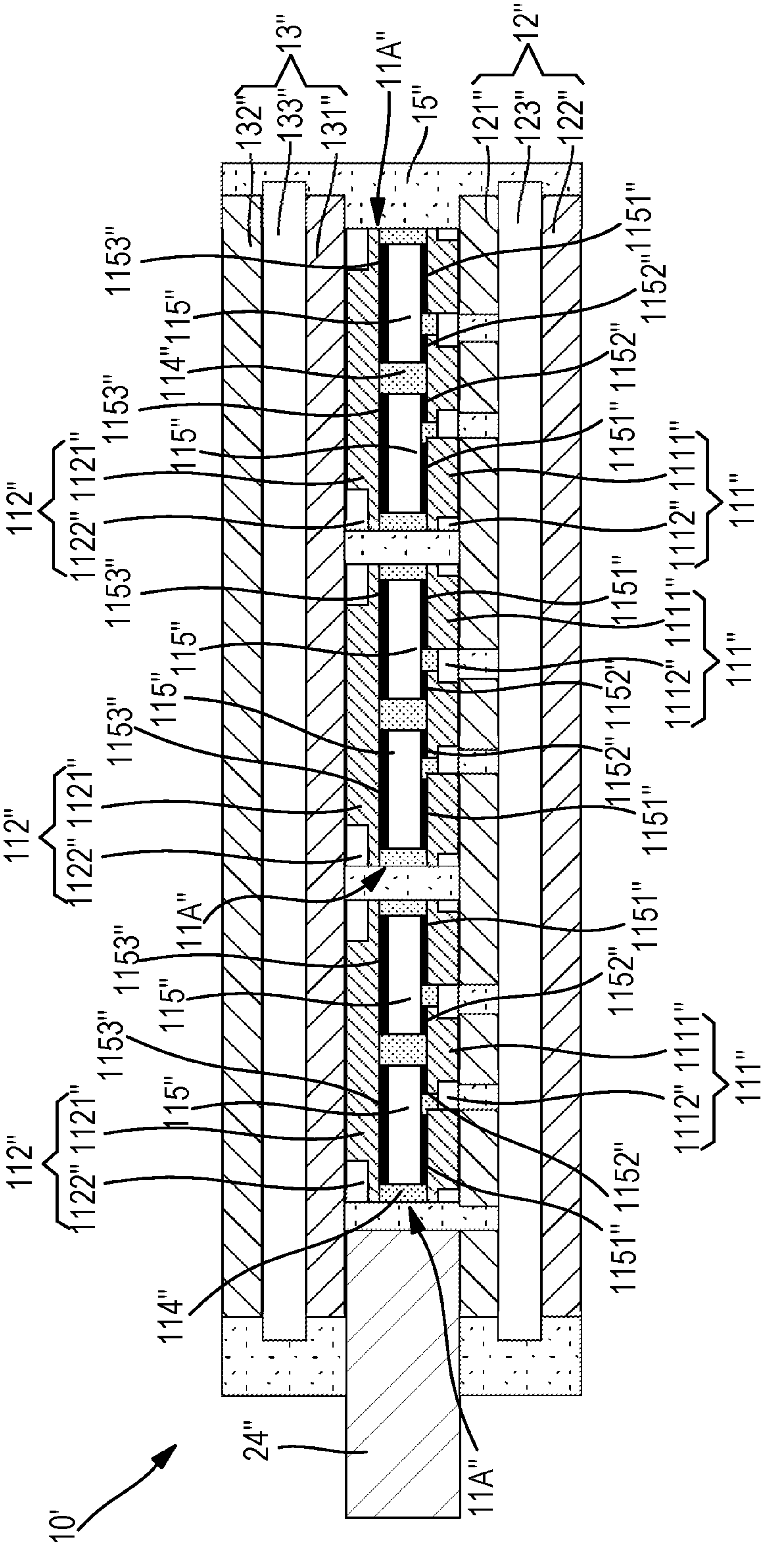
FIG. 30B shows a cross-sectional view of an example electronic device taken along line 30B-30B in FIG. 30A.
Figure 30C:
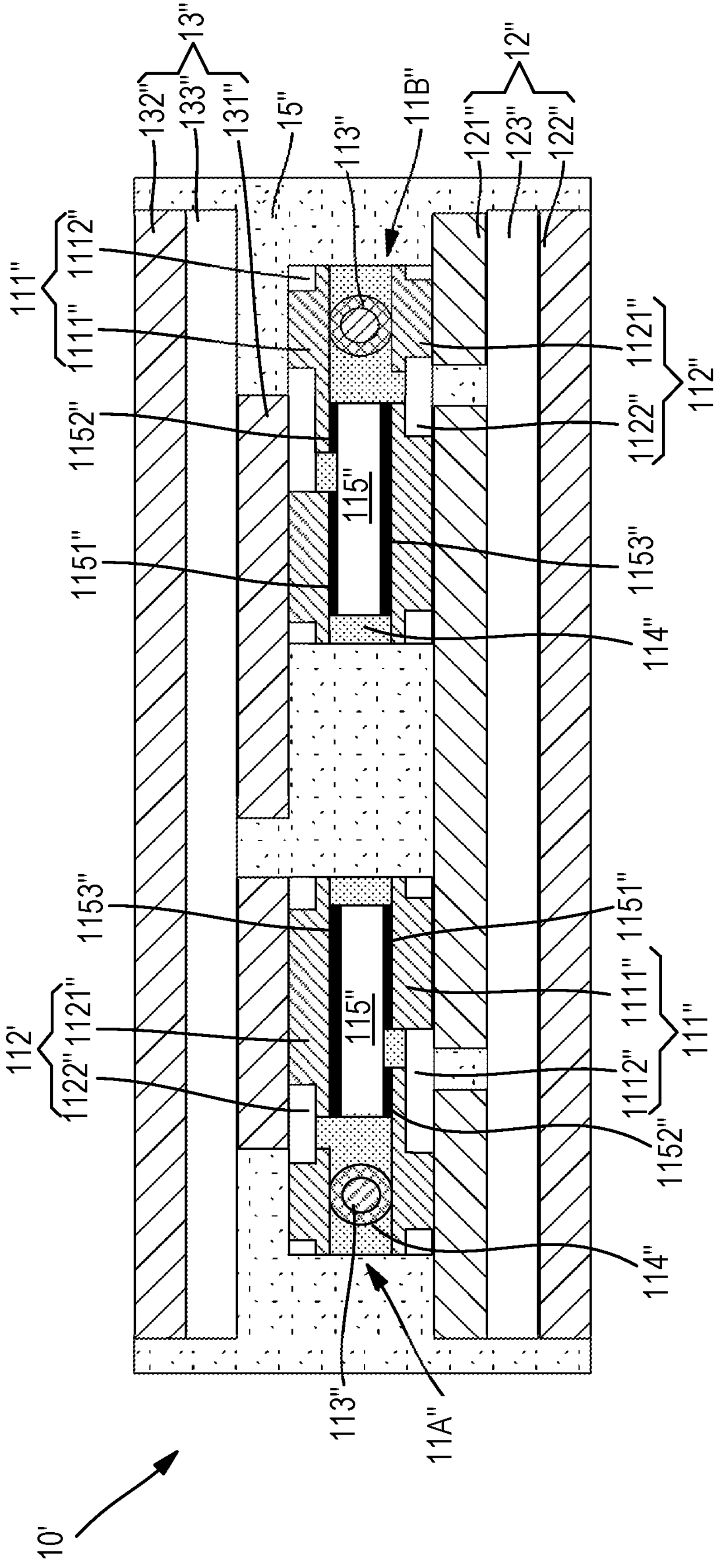
FIG. 30C shows a cross-sectional view of an example electronic device, taken along line 30C-30C in FIG. 30A.

FIGS. 30A, 30B, and 30C show an example electronic device 10'. In the example shown in FIGS. 30A, 30B and 30C, electronic device 10' can comprise one or more embedded modules 11A", one or more embedded modules 11B", first device substrate 12", second device substrate 13", one or more device terminals 24", one or more device terminals 241", and device encapsulant 15". First device substrate 12" can comprise inward metallic layer 121", outward metallic layer 122", and core layer 123". Second device substrate 13" can comprise inward metallic layer 131", outward metallic layer 132", and core layer 133".

In some examples, embedded modules 11A", 11B" can be horizontally spaced apart from each other (e.g., arranged in rows and columns). In some examples, a portion of device encapsulant 15" can be interposed between embedded modules 11"A, 11B". In some examples, embedded modules 11A", 11B" can be located between device substrate 12" and device substrate 13". Embedded modules 11A", 11B" can be coupled to device substrate 12" and second device substrate 13". In some examples, device terminals 24" and device terminals 241" can be located between device substrate 12" and second device substrate 13'. Device terminals 24" can be laterally or vertically spaced apart from one another. Device terminals 241" can be laterally or vertically spaced apart from one another. Device terminals 24" and 241" can be coupled to device substrate 12" or device substrate 13".

In the example shown in FIGS. 30A, 30B, 30C, 35A, and 35B embedded modules 11A" and embedded modules 11B" can each be disposed generally in a line between a first pair of opposing lateral sides of device encapsulant 15". Embedded modules 11A" can be located proximate a first lateral side of device encapsulant 15", device substrate 12", or device substrate 13", and embedded modules 11B" can be located proximate a second, opposing lateral side of device encapsulant 15", device substrate 12", or device substrate 13".

Embedded modules 11A" can be oriented such that component terminals 1151" and 1152" and first module substrate 111" face first device substrate 12", and component terminal 1153" and second module substrate 112" face second device substrate 13". Embedded modules 11B" can be oriented such that component terminals 1151" and 1152" and first module substrate 111" face device substrate 13", and component terminal 1153" and second module substrate 112" face device substrate 12".

As shown in FIGS. 30B, 30C, 35A, and 35B, embedded modules 11A" can be oriented such that first module substrates 111" are coupled to or contact inward metallic layer 121" of device substrate 12", and second module substrates 112" are coupled to or contact inward metallic layer 131" of device substrate 13". Embedded modules 11B" can be oriented such that first module substrates 111" are coupled to or contact inward metallic layer 131" of device substrate 13", and second module substrates 112" are coupled to or contact inward metallic layer 121" of device substrate 12".

Figure 31A:
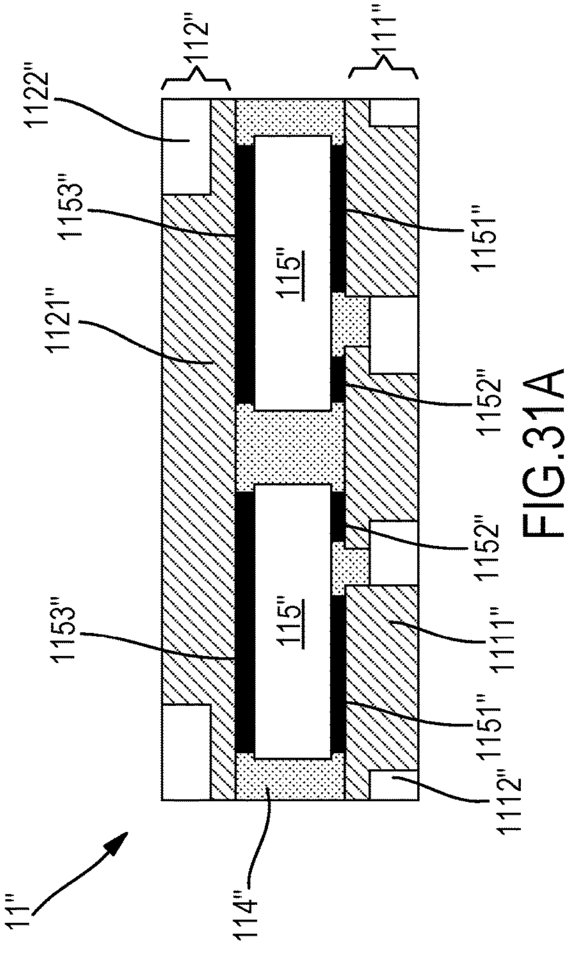
FIG. 31A shows a cross-sectional view of an example embedded module, taken along line 31A-31A in FIGS. 33A and 33B.
Figure 31B:
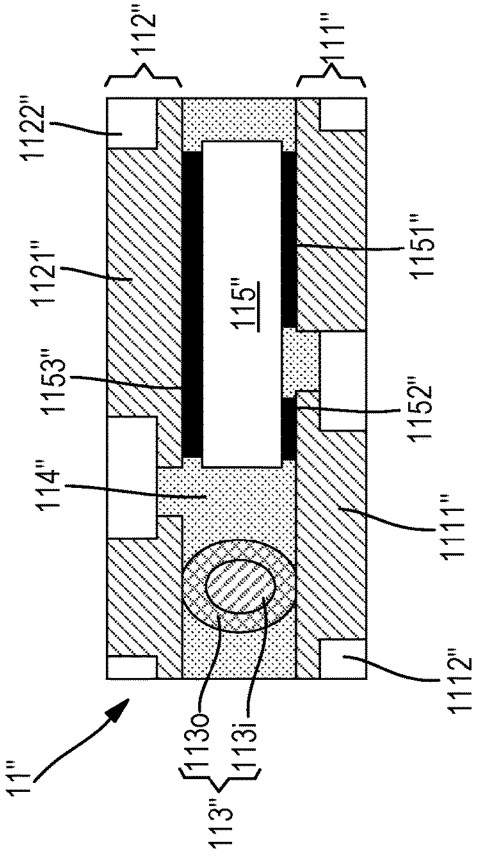
FIG. 31B shows a cross-sectional view of an example embedded module, taken along line 31B-31B in FIGS. 33A and 33B.

FIGS. 31A and 31B show cross-section views of an example embedded module 11". Embedded module 11" can be identical to embedded module 11A" and embedded modules 11B". Embedded module 11" can comprise first module substrate 111", second module substrate 112", one or more module interconnects 113", module encapsulant 114", and one or more module components 115". First module substrate 111" can comprise conductive structure 1111" and dielectric structure 1112". Second module substrate 112" can comprise conductive structure 1121" and dielectric structure 1122". Module interconnects 113" can comprise metal core ball 113*i* and solder coating 113*o*. In some examples, module encapsulant 114" can be a part of device encapsulant 15". In accordance with various embodiments, module components 115" can each comprise component terminals 1151", 1152", 1153". In some examples, component terminals 1151" can comprise or be referred as to a source, source electrode, or source terminal. In some examples, component terminals 1152" can comprise or be referred as to a gate, gate electrode, or gate terminal. In some examples, component terminals 1153" can comprise or be referred as to a drain, drain electrode, or drain terminal. In accordance with various examples, elements, features, materials, or formation processes of embedded module 11" can be similar to, or the same as, those of embedded module 11, as previously described.

Figure 32A:
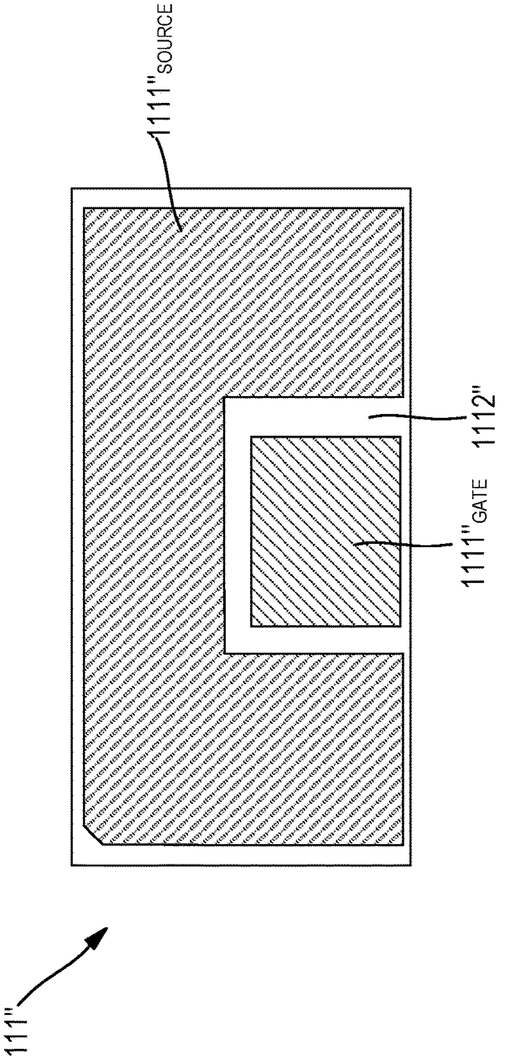
FIG. 32A shows a top-down plan view of a first module substrate of the embedded module of FIGS. 31A and 31B.

In some examples, embedded module 11" can comprise a first module component 115" and a second module component 115". In some examples, gate terminal 1152" of each of the first module component 115" and second module component 115" can be coupled to the same inward terminal of conductive structure 1111" (e.g., to gate portion 1111"$_{GATE}$, as shown in FIGS. 32A and 33A). In some examples, source terminal 1151" of each of the first module component 115" and second module component 115" can be coupled to the same inward terminal of conductive structure 1111" (e.g., to source portion 1111"$_{SOURCE}$, as shown in FIGS. 32A and 33A). In some examples, drain terminal 1153" of each of the first module component 115" and second module component 115" can be coupled to the same inward terminal of conductive structure 1121" (e.g., to drain portion 1121"$_{DRAIN}$, as shown in FIGS. 32B and 33B).

FIG. 32A shows a plan view of an example pattern of conductive structure 1111" and dielectric structure 1112" of first module substrate 111". FIG. 33A shows a plan view of module components 115" coupled to first module substrate 111". In some examples, source terminal 1151" of module component 115" can be coupled to source portion 1111"$_{SOURCE}$ of conductive structure 1111". In some examples, gate terminal 1152" of module component 115" can be coupled to gate portion 1111"$_{GATE}$ of conductive structure 1111". Source portion 1111"$_{SOURCE}$ and gate portion 1111"$_{GATE}$ can each comprise inward terminals of conductive structure 1111".

Figure 32B:
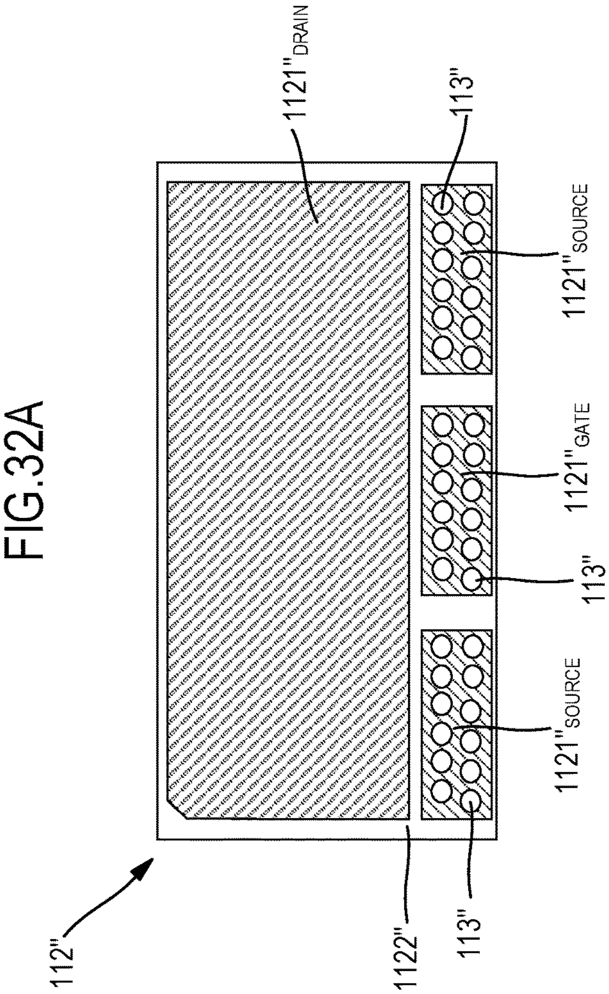
FIG. 32B shows a bottom-up plan view of a second module substrate of the embedded module of FIGS. 31A and 31B.
Figure 33A:
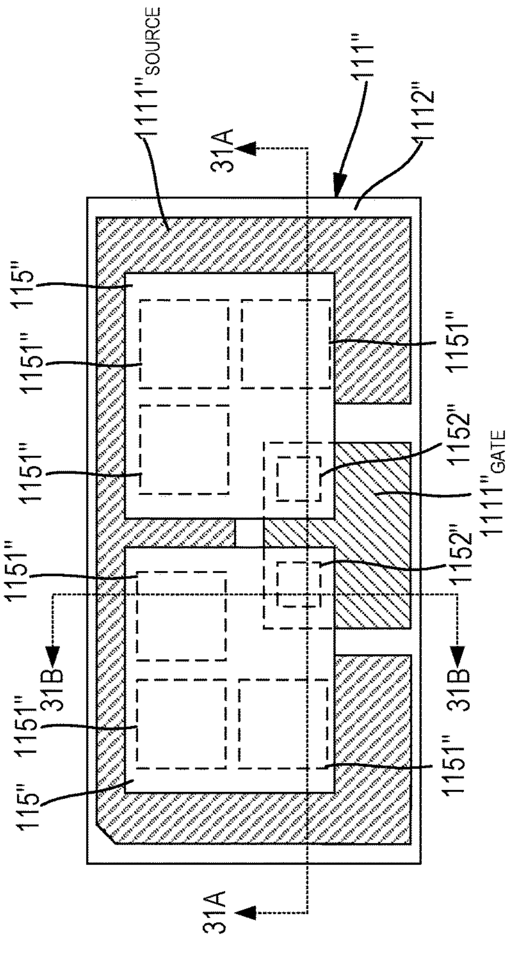
FIG. 33A shows a top-down plan view of module components coupled to the first module substrate of FIGS. 31A and 31B.
Figure 33B:
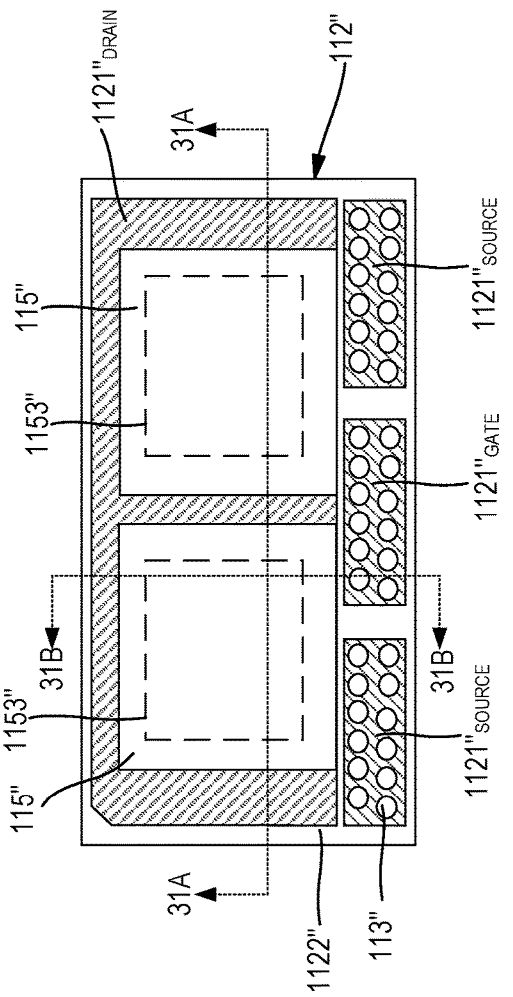
FIG. 33B shows a bottom-up plan view of the module components coupled to the second module substrate of FIGS. 31A and 31B.

FIG. 32B shows a plan view of an example pattern of conductive structure 1121" and dielectric structure 1122" of second module substrate 112", with module interconnects 113" coupled to conductive structure 1121". FIG. 33B shows a plan view of module components 115" coupled to second module substrate 112". In some examples, drain terminal 1153" of module component 115" can be coupled to drain portion 1121"$_{DRAIN}$ of conductive structure 1121". Module interconnects 113" can be coupled between source portions 1121"$_{SOURCE}$ of conductive structure 1121" of second module substrate 112" and source portion 1111"$_{SOURCE}$ of conductive structure 1111" of first module substrate 111". Module interconnects 113" can be coupled between gate portion 1121"$_{GATE}$ of conductive structure 1121" of second module substrate 112" and gate portion 1111"$_{GATE}$ of conductive structure 1111" of first module substrate 111".

In some examples, source terminal 1151" of module component 115" can be electrically coupled to source portion 1121"$_{SOURCE}$ of second module substrate 112" via module interconnect 113" coupled to source portion 1111"$_{SOURCE}$ of first module substrate 111" and source portion 1121"$_{SOURCE}$ of second module substrate 112". In some examples, gate terminal 1152" of module component 115" can be coupled to gate portion 1121"$_{GATE}$ of second module substrate 112" via module interconnect 113" coupled to gate portion 1111"$_{GATE}$ of first module substrate 111" and gate portion 1121"$_{GATE}$ of second module substrate 112".

Figure 34B:
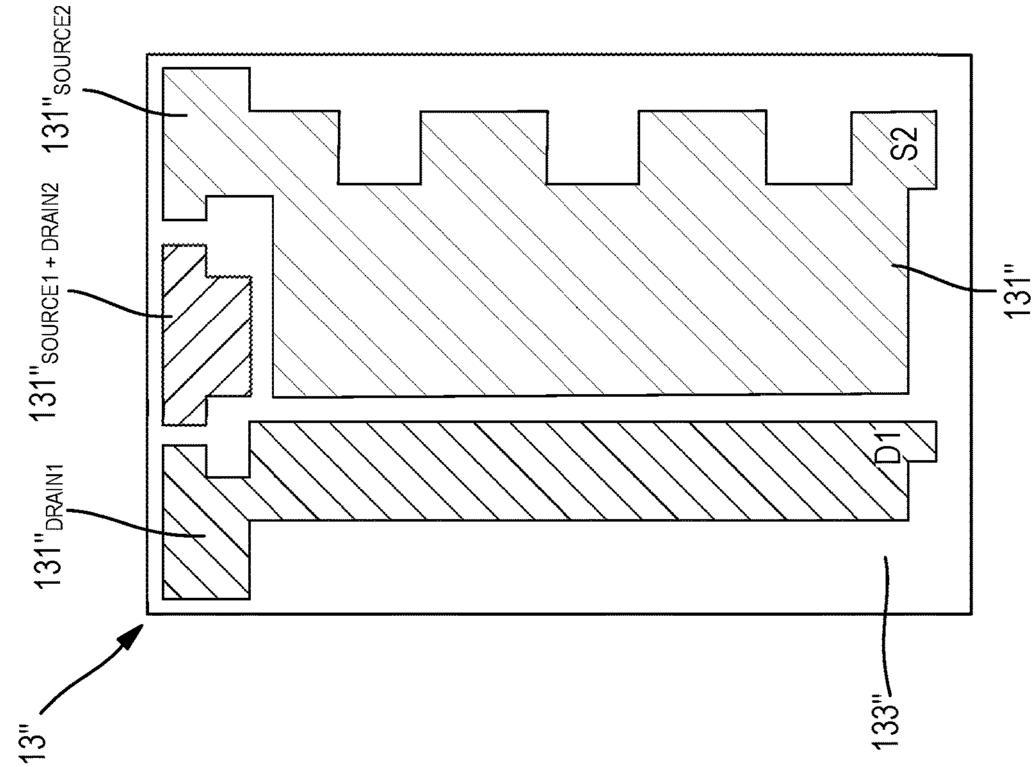
FIG. 34B shows a bottom-up plan view of an inward metallic layer pattern of a second device substrate of the electronic device of FIGS. 30A, 30B, and 30C.
Figure 34A:
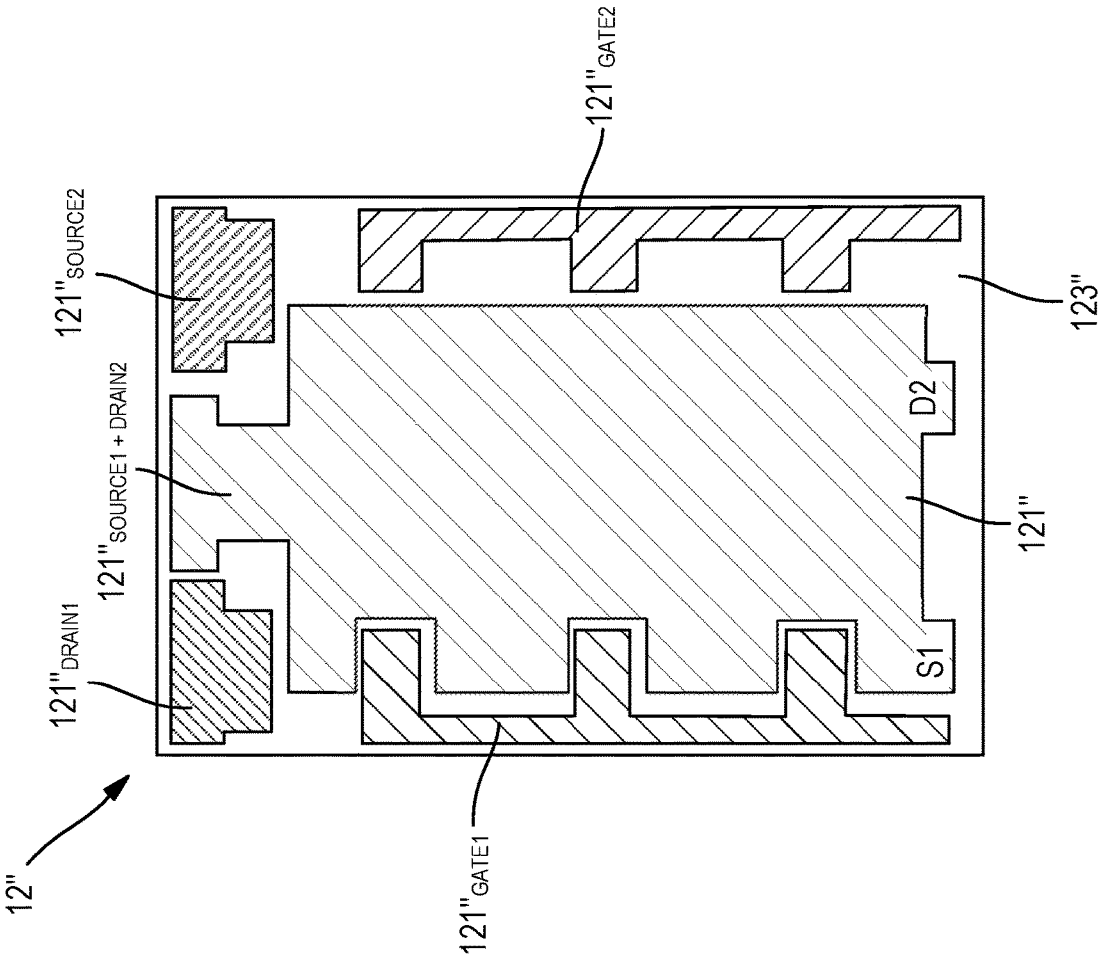
FIG. 34A shows a top-down plan view of an inward metallic layer pattern of a first device substrate of the electronic device of FIGS. 30A, 30B, and 30C.

FIG. 34A shows a plan view of an example pattern of inward metallic layer 121" of device substrate 12". FIG. 34B shows a plan view of an example pattern of inward metallic layer 131" of device substrate 13". In connection with FIG. 30A, device terminal 241"(G1) can be electrically coupled to inward metallic layer 121" (Gate1), device terminal 241" (S1) can be electrically coupled to inward metallic layer 121" (Source+Drain2), device terminal 241" (D1) can be electrically coupled to inward metallic layer 131" (Drain1), device terminal 241" (D2) can be electrically coupled to inward metallic layer 131" (Source1+Drain2), device terminal 241" (S2) can be electrically coupled to inward metallic layer 131" (Source 2), device terminal 241" (G2) can be electrically coupled to inward metallic layer 121" (Gate2). In addition, in connection with FIG. 30A above, device terminal 24" (D1) can be electrically coupled to inward metallic layer 121" (Drain1) and inward metallic layer 131" (Drain1), device terminal 24" (S1+D2) can be electrically coupled to inward metallic layer 121" (Source1+Drain2) and inward metallic layer 131" (Source1+Drain2), device terminal 24" (S2) can be electrically coupled to inward metallic layer 121" (Source2) and inward metallic layer 131" (Source2).

Figure 35B:
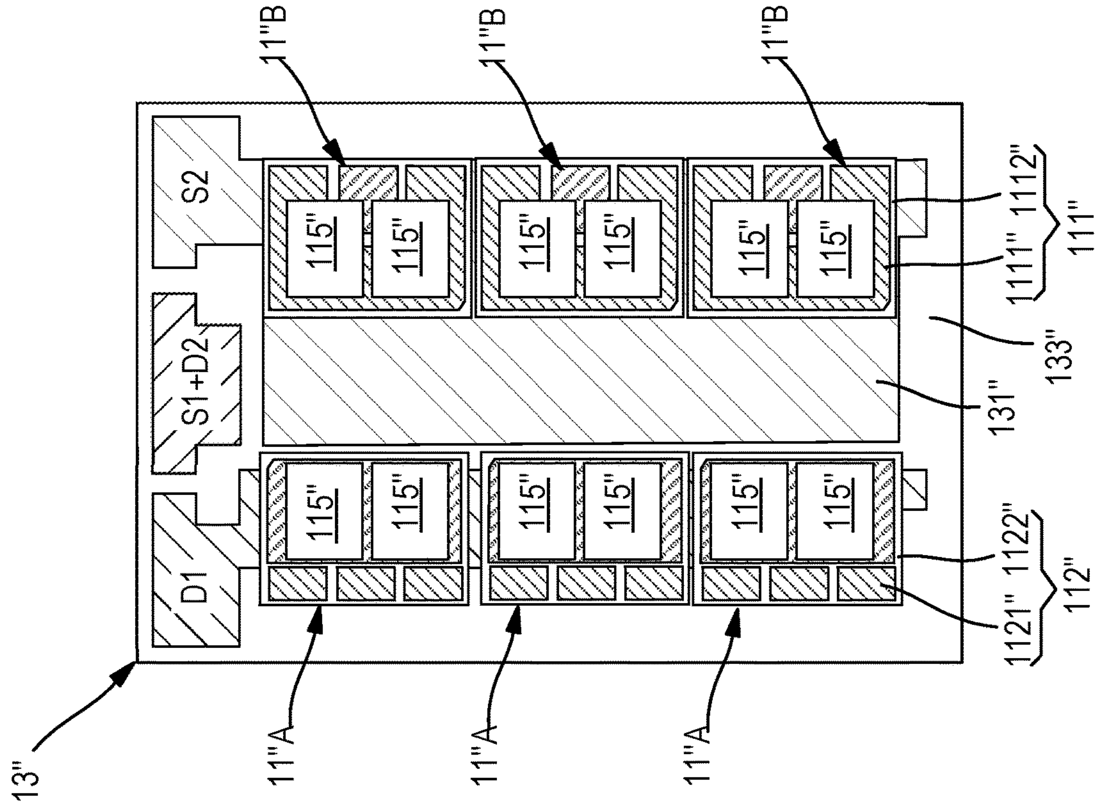
FIG. 35B shows a plan view of embedded modules coupled to the inward metallic layer of the second device substrate of FIG. 34B.
Figure 35A:
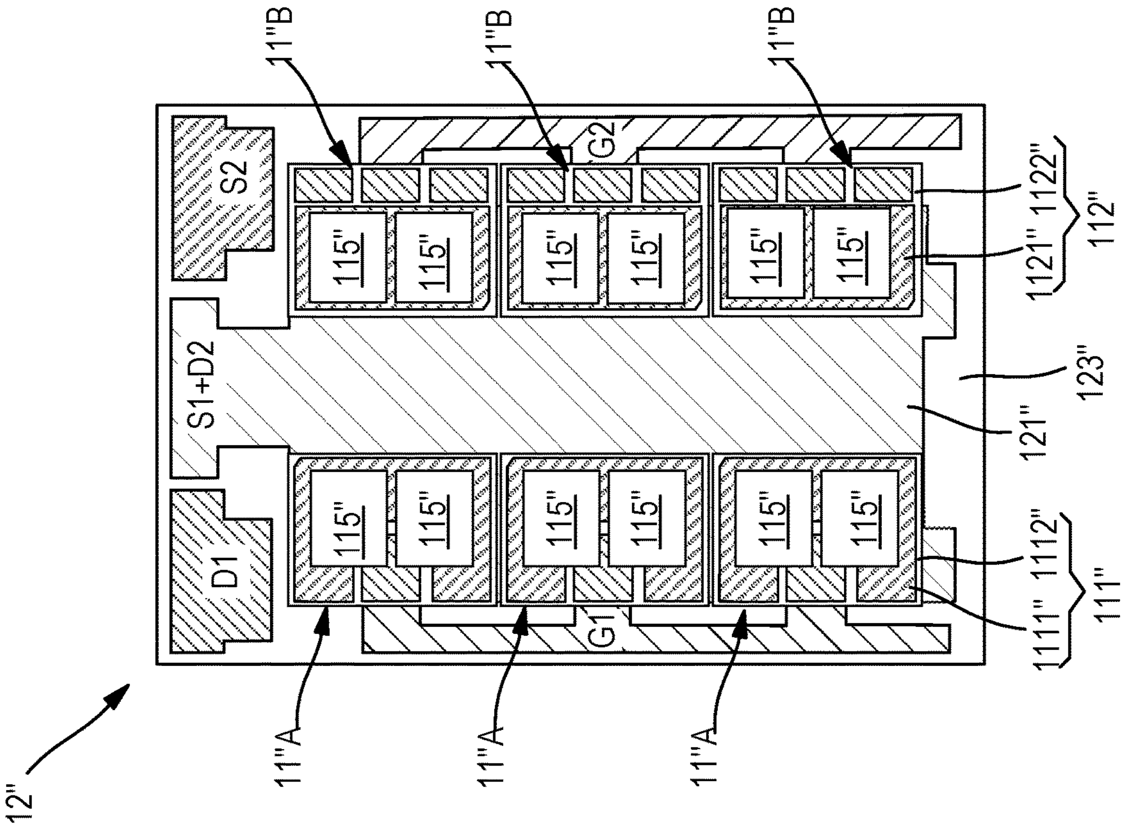
FIG. 35A shows a plan view of embedded modules coupled to the inward metallic layer of the first device substrate of FIG. 34A.

FIG. 35A shows a plan view of a group embedded modules 11A" and of a group of embedded modules 11B" coupled to inward metallic layer 121" of first device substrate 12". Embedded modules 11"A can comprise first module substrates 111" facing toward and coupled to or contacting first device substrate 12". For example, conductive structure 1111" of embedded modules 11"A can be located between module components 115" of embedded modules 11"A and inward metallic layer 121" of first device substrate 12". Embedded modules 11"B can comprise second module substrates 112" facing toward and coupled to or contacting first device substrate 12". For example, conductive structure 1121" of embedded modules 11"B can be located between module components 115" of embedded modules 11"B and inward metallic layer 121" of first device substrate 12".

FIG. 35B shows a plan view of group of embedded modules 11A" and a group of embedded modules 11B" coupled to inward metallic layer 131" of second device substrate 13". Embedded modules 11A" can comprise second module substrates 112" facing toward and coupled to or contacting second device substrate 12". For example, conductive structure 1121" of embedded modules 11A" can be located between module components 115" of embedded modules 11A" and inward metallic layer 131" of second device substrate 13". Embedded modules 11B" can comprise first module substrates 111" facing toward and coupled to or contacting second device substrate 13". For example, conductive structure 1111" of embedded modules 11B" can be located between module components 115" of embedded modules 11B" and inward metallic layer 131" of second device substrate 13".

Electronic device 10' and embedded modules 11" can allow for testing of embedded modules 11" prior to assembly of electronic device 10'. Device substrates 12" and 13" can allow for dual side heat dissipation of electronic device 10'. Electronic device 10' can allow for reduced height/thickness and can be devoid of through wires (e.g., wire-bonded semiconductor dies or other electronic components). Electronic device 10' can also be devoid of spacers. Electronic device 10' and embedded modules 11" can allow for ready customization for any number of embedded modules 11" within a package.

From all the foregoing, one skilled in the art can determine that according to an example, an electronic device can comprise a module interconnect coupled to a first module substrate and coupled to a second module substrate. In an example, the device terminals can be coupled to the first device substrate and to the second device substrate. In an example, the first device substrate can comprise a first inward metallic layer and the device terminals can be coupled to the first inward metallic layer of the first device substrate. In an example, the width of the first embedded module can be greater than the a width of the second device substrate, and the first device substrate can further include a first inward metallic layer coupled to the first module substrate and the first core layer, the first core layer being disposed between the first inward metallic layer and the first outward metallic layer. In an example, the first outward metallic layer can be exposed from the encapsulant structure. In an example, the second outward metallic layer includes the portion of the second device substrate exposed from the encapsulant structure.

From all the foregoing, one skilled in the art can determine that in an example, an electronic device can include a plurality of embedded modules. The device terminals can include a first device terminal, a second device terminal, a third device terminal, a fourth device terminal, a fifth device terminal, a sixth device terminal, a seventh device terminal, an eighth device terminal, and a ninth device terminal. The first inward metal layer can include a first inward first gate layer (121" GATE1), a first inward second gate layer (121" GATE 2), a first inward first drain layer (121" DRAIN1), a first inward first source and second drain layer (121" SOURCE1+DRAIN2), and a second source layer (121" SOURCE2). The second inward metal layer can include a second inward first drain layer (131" DRAIN1), a second inward first source and second drain layer (131" SOURCE1+DRAIN2), and a second inward second source layer (131" SOURCE2). The first device terminal can be coupled to first inward first gate layer (121" GATE1). The second device terminal can be coupled to the first inward first source and second drain layer (121" SOURCE1+DRAIN2). The third device terminal can be coupled to the second inward first drain layer (131" DRAIN1). The fourth device terminal can be coupled to the second inward first source and second drain layer (131" SOURCE1+DRAIN2). The fifth device terminal can be coupled to the second inward second source layer (131" SOURCE2). The sixth device terminal can be coupled to the first inward second gate layer (121" GATE 2). The seventh device terminal can be coupled to the first inward first drain layer (121" DRAIN1) and the second inward first drain layer (131" DRAIN1). The eighth device terminal can be coupled to first inward first source and second drain layer (121" SOURCE1+DRAIN2) and the second inward first source and second drain layer (131" SOURCE1+DRAIN2). The ninth device terminal can be coupled to the first inward second source layer (121" SOURCE2) and the second inward second source layer (131" SOURCE2). The plurality of embedded devices can be coupled to the first inward conductive layer, the second inward conductive layer; and the device terminals.

From all the foregoing, one skilled in the art can determine that in an example, the first module substrate can include a first inward side and a first outward side opposite to the first inward side. The second module substrate can include a second inward side and a second outward side opposite to the second inward side. The first embedded module can include a first module encapsulant over the first module component, the first inward side, and the second inward side. The first outward side and the second outward side can be exposed from the module encapsulant. In an example, the first embedded module is devoid of spacers.

In an example, the first device substrate can further include a first core layer including a first side and a second side opposite to the first side and a first inward conductive layer on the second side. The first outward conductive layer can be on the first side of the first core layer. The first inward conductive layer can be coupled to the first conductive structure of the first module substrate.

In an example, the encapsulant structure can include a first side, a second side opposite to the first side, and a third side extending from the first side to the second side. The first outward conductive layer of the first device substrate can be exposed from the first side of the encapsulant structure. The second outward conductive layer of the second device substrate can be exposed from the second side of the encapsulant structure. The device terminals can be exposed from the third side of the encapsulant structure.

In an example, the first module substrate can be a first routable molded leadframe. The second module substrate can be a second routable molded leadframe. The first routable molded leadframe can be coupled to the second routable molded leadframe with a module interconnect. The device terminals can be coupled to second routable molded leadframe.

From all the foregoing, one skilled in the art can determine that in an example, an electronic device can comprise a plurality of embedded modules, each embedded module of the plurality of embedded modules comprising a module first substrate, one or more electronic components coupled to the module first substrate, and a module second substrate over the one or more electronic components. A first device substrate can be coupled to the module first substrate of a first embedded module of the plurality of embedded modules and to the module second substrate of a second embedded module of the plurality of embedded modules. A second device substrate can be coupled to the module second substrate of the first embedded module and to the module first substrate of the second embedded module.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claimed is:

1. An electronic device, comprising:
a first embedded module comprising:
a first module substrate; and
a first module component coupled to the first module substrate;
a first device substrate coupled to the first module substrate;
device terminals coupled to the first module component; and
a device encapsulant structure encapsulating the first embedded module, the device terminals; and the first device substrate;
wherein:
the first module substrate comprises a first inward side, a first outward side opposite to the first inward side, a first dielectric structure, and a first conductive structure embedded within the first dielectric structure;
a portion of the first device substrate is exposed from the device encapsulant structure; and
portions of the device terminals are exposed from the device encapsulant structure.

2. The electronic device of claim 1, wherein:
the first embedded module comprises a second module substrate coupled to the first module substrate and to the first module component;
the first module component is interposed between the first module substrate and the second module substrate;
the second module substrate comprises a second inward side, a second outward side opposite to the second inward side, a second conductive structure, and a second dielectric structure;
the first module component is coupled to the first conductive structure at the first inward side of the first module substrate; and
the first module component is coupled to the second conductive structure at the second inward side of the second module substrate.

3. The electronic device of claim 2, wherein:
the first embedded module comprises:
a third module substrate comprising a third inward side, a third outward side opposite to the third inward side, a third conductive structure, and a third dielectric structure;
a second module component coupled to the second conductive structure at the second outward side of the second module substrate and coupled to the third conductive structure at the third inward side of the third module substrate;
a first module encapsulant interposed between the first module substrate and the second module substrate and encapsulating the first module component; and
a second module encapsulant interposed between the second module substrate and the third module substrate and encapsulating the second module component.

4. The electronic device of claim 3, wherein:
the third outward side of the third module substrate is exposed from the device encapsulant structure.

5. The electronic device of claim 2, wherein:
the first embedded module comprises a first module encapsulant over the first module component, over the first inward side of the first module substrate, and over the second inward side of the second module substrate; and
the first outward side of the first module substrate and the second outward side of the second module substrate are exposed from the first module encapsulant.

6. The electronic device of claim 5, further comprising:
a second embedded module comprising:
a third module substrate comprising a third inward side, a third outward side opposite to the third inward side, a third conductive structure, and a third dielectric structure;
a fourth module substrate comprising a fourth inward side, a fourth outward side opposite to the fourth inward side, a fourth conductive structure, and a fourth dielectric structure;
a second module component coupled to the third conductive structure at the third inward side of the third module substrate and coupled to the fourth conductive structure adjacent to the fourth inward side of the fourth module substrate; and
a second module encapsulant over the second module component, over the third inward side of the third module substrate, and over the fourth inward side of the fourth module substrate;
wherein:
the third outward side of the third module substrate and the fourth outward side of the fourth module substrate are exposed from the second module encapsulant; and
the device encapsulant structure encapsulates the second embedded module.

7. The electronic device of claim 6, wherein:
the second embedded module overlies the first embedded module.

8. The electronic device of claim 7, wherein:
the device terminals are interposed between the first embedded module and the second embedded module.

9. The electronic device of claim 6, wherein:
the second embedded module is laterally spaced apart from the first embedded module.

10. The electronic device of claim 2, wherein:
the device terminals are attached to the second conductive structure of the second module substrate.

11. The electronic device of claim 1, further comprising:
a second device substrate coupled to the first module component;
wherein:
the second device substrate is exposed from the device encapsulant structure.

12. The electronic device of claim 11, wherein:
the first device substrate comprises:
a first core layer;
a first outward metallic layer coupled to the first core layer; and
a first inward metallic layer coupled to the first module substrate and the first core layer, the first core layer being disposed between the first inward metallic layer and the first outward metallic layer; and
the second device substrate comprises:
a second core layer;
a second outward metallic layer coupled to the second core layer; and
a second inward metallic layer coupled to the first module component and the second core layer, the second core layer being disposed between the second inward metallic layer and the second outward metallic layer.

13. The electronic device of claim 12, further comprising:

a plurality of embedded modules including the first embedded module;

wherein:

the plurality of embedded modules are coupled to one or more of the first inward metallic layer, the second inward metallic layer, or the device terminals.

14. The electronic device of claim 1, wherein:

the device encapsulant structure comprises:

a first device encapsulant encapsulating the first embedded module; and a second device encapsulant encapsulating the first device substrate;

the first module substrate is exposed from the first device encapsulant; and the second device encapsulant covers portions of the first module substrate that are exposed from the first device encapsulant.

15. The electronic device of claim 1, further comprising:

a second module component coupled to the first module substrate;

wherein:

the first module substrate comprises a routable molded leadframe; and the first module component and the second module component reside on a same plane.

16. An electronic device, comprising:

a first embedded module comprising:

a first module substrate comprising a first conductive structure;

a second module substrate comprising a second conductive structure; and a first module component interposed between the first module substrate and the second module substrate, the first module component comprising:

a first component terminal coupled to the first conductive structure; and a second component terminal coupled to the second conductive structure;

a first module encapsulant encapsulating the first module component;

a first device substrate coupled to the first module substrate and comprising a first outward conductive layer;

a second device substrate coupled to the first module component and comprising a second outward conductive layer;

device terminals coupled to the first module component; and a device encapsulant structure encapsulating the first embedded module, the first device substrate, the second device substrate, and the device terminals;

wherein:

the device terminals, the first outward conductive layer, and the second outward conductive layer are exposed from the device encapsulant structure.

17. The electronic device of claim 16, wherein:

the first embedded module comprises:

a third module substrate comprising a third conductive structure;

a second module component interposed between the second module substrate and the third module substrate and comprising a third component terminal coupled to the second conductive structure and a fourth component terminal coupled to the third conductive structure;

the first module encapsulant is interposed between the first module substrate and the second module substrate; and a second module encapsulant interposed between the second module substrate and the third module substrate and encapsulating the second module component.

18. The electronic device of claim 16, further comprising:

a second embedded module comprising:

a third module substrate comprising a third conductive structure;

a fourth module substrate comprising a fourth conductive structure;

a second module component comprising a third component terminal coupled to the third conductive structure and a fourth component terminal coupled to the fourth conductive structure; and a second module encapsulant encapsulating the second module component;

wherein:

the device encapsulant structure encapsulates the second embedded module.

19. A method of manufacturing an electronic device, comprising:

providing a first embedded module comprising:

a first module substrate comprising a first conductive structure;

a second module substrate comprising a second conductive structure;

a first module component interposed between the first module substrate and the second module substrate, the first module component comprising:

a first component terminal coupled to the first conductive structure; and a second component terminal coupled to the second conductive structure; and a first module encapsulant encapsulating the first module component;

providing a first device substrate coupled to the first module substrate and comprising a first outward conductive layer;

providing a second device substrate coupled to the first module component and comprising a second outward conductive layer;

providing device terminals coupled to the first module component; and providing a device encapsulant structure encapsulating the first embedded module, the first device substrate, the second device substrate, and the device terminals;

wherein:

the device terminals, the first outward conductive layer, and the second outward conductive layer are exposed from the device encapsulant structure.

20. The method of claim 19, wherein:

providing the first embedded module comprises:

providing a third module substrate comprising a third conductive structure;

providing a second module component interposed between the second module substrate and the third module substrate and comprising a third component terminal coupled to the second conductive structure and a fourth component terminal coupled to the third conductive structure;

providing the first module encapsulant interposed between the first module substrate and the second module substrate and encapsulating the first module component; and providing a second module encapsulant interposed between the second module substrate and the third module substrate and encapsulating the second module component.

21. The method of claim 19, further comprising:

providing a second embedded module comprising:

a third module substrate comprising a third conductive structure;

a fourth module substrate comprising a fourth conductive structure;

a second module component comprising a third component terminal coupled to the third conductive structure and a fourth component terminal coupled to the fourth conductive structure; and a second module encapsulant encapsulating the second module component;

wherein:

providing the device encapsulant structure comprises encapsulating the second embedded module.

* * * * *